US008808975B2

(12) United States Patent
Inabe et al.

(10) Patent No.: US 8,808,975 B2
(45) Date of Patent: *Aug. 19, 2014

(54) POSITIVE RESIST COMPOSITION FOR IMMERSION EXPOSURE AND PATTERN-FORMING METHOD USING THE SAME

(75) Inventors: Haruki Inabe, Shizuoka (JP); Hiromi Kanda, Shizuoka (JP); Kunihiko Kodama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/858,128

(22) Filed: Aug. 17, 2010

(65) Prior Publication Data

US 2010/0310991 A1    Dec. 9, 2010

Related U.S. Application Data

(63) Continuation of application No. 11/503,958, filed on Aug. 15, 2006, now Pat. No. 7,803,511.

(30) Foreign Application Priority Data

Aug. 19, 2005    (JP) ................................ 2005-238734

(51) Int. Cl.
*G03F 7/004* (2006.01)
*G03F 7/029* (2006.01)
*G03F 7/039* (2006.01)
*G03F 7/26* (2006.01)

(52) U.S. Cl.
USPC ......... 430/326; 430/270.1; 430/921; 430/925

(58) Field of Classification Search
USPC ................ 430/270.1, 326, 921, 925, 910.921
See application file for complete search history.

(56) References Cited

U.S. PATENT DOCUMENTS

| 5,776,660 | A | 7/1998 | Hakey et al. | |
|---|---|---|---|---|
| 7,273,690 | B2 * | 9/2007 | Kodama et al. | 430/270.1 |
| 7,803,511 | B2 * | 9/2010 | Inabe et al. | 430/270.1 |
| 2001/0014428 | A1 | 8/2001 | Uetani et al. | |
| 2002/0102491 | A1 | 8/2002 | Kodama et al. | |
| 2002/0197558 | A1 | 12/2002 | Ferreira et al. | |
| 2003/0148211 | A1 | 8/2003 | Kamabuchi et al. | |
| 2003/0207201 | A1 | 11/2003 | Hatakeyama et al. | |
| 2004/0087690 | A1 | 5/2004 | Lamanna et al. | |
| 2004/0185373 | A1 | 9/2004 | Kodama | |
| 2004/0229162 | A1 | 11/2004 | Ohsawa et al. | |
| 2005/0014090 | A1 | 1/2005 | Hirayama et al. | |
| 2005/0123859 | A1 | 6/2005 | Wada et al. | |
| 2005/0147915 | A1 | 7/2005 | Dammel | |
| 2005/0186505 | A1 | 8/2005 | Kodama et al. | |
| 2005/0202340 | A1 | 9/2005 | Houlihan et al. | |
| 2005/0214676 | A1 | 9/2005 | Toishi et al. | |
| 2005/0238992 | A1 * | 10/2005 | Kodama | 430/270.1 |
| 2005/0271974 | A1 * | 12/2005 | Rahman et al. | 430/270.1 |
| 2006/0040203 | A1 | 2/2006 | Kodama et al. | |
| 2007/0027336 | A1 | 2/2007 | Yoshida et al. | |
| 2007/0054214 | A1 | 3/2007 | Ebata et al. | |

FOREIGN PATENT DOCUMENTS

| EP | 1 621 927 A2 | 2/2006 |
|---|---|---|
| EP | 1 701 214 A2 | 9/2006 |
| EP | 1 739 483 A2 | 1/2007 |
| JP | 2002-131897 A | 5/2002 |
| JP | 2003-261529 A | 9/2003 |
| JP | 2003-330196 A | 11/2003 |
| JP | 2003-337416 A | 11/2003 |
| JP | 2004-12554 A | 1/2004 |
| JP | 2004-210670 A | 7/2004 |
| JP | 2004-519520 A | 7/2004 |
| JP | 2005-075824 A | 3/2005 |
| JP | 2005-112724 A | 4/2005 |
| JP | 2005-148291 A | 6/2005 |
| JP | 2005-173549 A | 6/2005 |
| JP | 2005-534952 A | 11/2005 |
| JP | 2006-322988 A | 11/2006 |
| JP | 2007-224008 A | 9/2007 |
| WO | 02/082185 A1 | 10/2002 |
| WO | 03/107093 A2 | 12/2003 |
| WO | 2004/068242 A1 | 8/2004 |
| WO | 2004/078703 A1 | 9/2004 |
| WO | 2004/107051 A2 | 12/2004 |

OTHER PUBLICATIONS

Machine translation of JP 2005-148291, published on Jun. 9, 2005.*
Padmanaban M et al., "Performance of Imide and Methide Onium PAGs in 193nm Resist Formulations". Proceeding of the spie, Spie, Bellingham, VA, US. vol. 5039, No. 2, Feb. 2003, pp. 743-750, XP002309546. ISSN: 0277-786X.
Notification of Reasons for Refusal issued on Apr. 27, 2010 in counterpart Japanese Application No. 2005-238734.
Notification of Reasons for Refusal issued Jul. 13, 2010, in counterpart Japanese Application No. 2005-238734.
Office Action dated Jun. 26, 2013, issued by the Taiwan Patent Office in counterpart Taiwanese Application No. 095130336.
Office Action dated Apr. 19, 2013 from the Korean Intellectual Property Office in counterpart Korean Application No. 10-2006-0078391.
Communication dated Nov. 20, 2013, issued by the Korean Intellectual Property Office in corresponding Application No. 10-2006-0078391.

* cited by examiner

*Primary Examiner* — Anca Eoff
(74) *Attorney, Agent, or Firm* — Sughrue Mion, PLLC

(57) ABSTRACT

A positive resist composition for immersion exposure comprises: (A) a resin capable of increasing its solubility in an alkali developer by an action of an acid, and (B) a compound capable of generating an acid upon irradiation with actinic ray or radiation, wherein the acid satisfies conditions of V≥230 and V/S≤0.93 taking van der Waals volume of the acid as V ($Å^3$), and van der Waals surface area of the acid as S ($Å^2$).

7 Claims, 1 Drawing Sheet

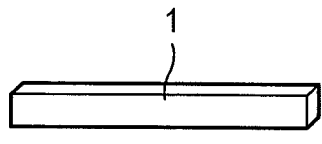
RECTANGULAR
PARALLELEPIPED
HAVING SIZE OF
1 x 1 x 1000
V = 1000
S = 4002
V/S = 0.250
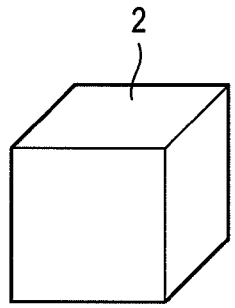
CUBE
HAVING SIZE OF
10 x 10 x 10
V = 1000
S = 600.0
V/S = 1.667
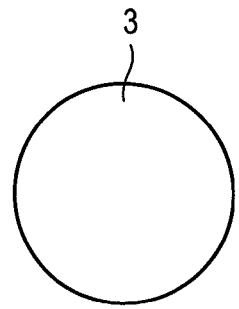
SPHERE HAVING
DIAMETER OF
6.204
V = 1000
S = 483.7
V/S = 2.067

POSITIVE RESIST COMPOSITION FOR IMMERSION EXPOSURE AND PATTERN-FORMING METHOD USING THE SAME

This is a continuation of application Ser. No. 11/503,958 filed Aug. 15, 2006. The entire disclosure of the prior application, application Ser. No. 11/503,958, is hereby incorporated by reference.

BACKGROUND OF THE INVENTION

1. Field of the Invention

The present invention relates to a positive resist composition for use in a manufacturing process of semiconductor devices, such as IC, manufacture of circuit substrates for liquid crystals, thermal heads and the like, and lithographic processes of other photo-fabrication, and also relates to a pattern-forming method using the same. In particular, the invention relates to a positive resist composition suitable for exposure by means of an immersion projection exposure apparatus with far ultraviolet rays of the wavelengths of 300 nm or less as exposure light sources, and a pattern-forming method using the same.

2. Description of the Related Art

With the progress of fining of semiconductor elements, shortening of the wavelengths of exposure light source and increment of the numerical aperture (high NA) of projection lens have advanced, and now exposure apparatus of NA 0.92 using an ArF excimer laser having the wavelength of 193 nm as the light source have been developed. As shown by the generally well known following expressions, resolution and the depth of focus can be expressed by the wavelength of exposure light source and the numerical aperture of the projection lens:

Resolution=$k_1 \cdot (\lambda/\text{NA})$

Depth of focus=$\pm k_2 \cdot \lambda/\text{NA}^2$ wherein $\lambda$ is the wavelength of the exposure light source, NA is the numerical aperture of the projection lens, and $k_1$ and $k_2$ are the coefficients concerning the process.

For further higher resolution by the shortening of wavelengths, an exposure apparatus with an $F_2$ excimer laser having the wavelength of 157 nm as the light source has been studied, but the materials of lenses for use in the exposure apparatus for the shortening of wavelengths and the materials of resists are extremely restricted, so that the realizations of the reasonable manufacturing costs of the apparatus and materials and quality stabilization are very difficult, as a result, there are possibilities of missing exposure apparatus and resists having sufficient performances and stabilities within a required period of time.

As a technique for increasing resolution in optical microscopes, a so-called immersion method of filling a liquid of high refractive index (hereinafter also referred to as "an immersion liquid") between an objective lens and a sample has been conventionally known.

As "the effect of immersion", the above resolution and depth of focus can be expressed by the following expressions in the case of immersion, with $\lambda_0$ as the wavelength of the exposure light in the air, n as the refractive index of immersion liquid to the air, and $NA_0 = \sin \theta$ with $\theta$ as convergence half angle of the ray of light:

Resolution=$k_1 \cdot (\lambda_0/n)/\text{NA}_0$

Depth of focus=$\pm k_2 \cdot (\lambda_0/n)/\text{NA}_0^2$

That is, the effect of immersion is equivalent to the case of using exposure wavelength of the wavelength of 1/n. In other words, in the case of the projection optical system of the same NA, the depth of focus can be made n magnifications by immersion. This is effective for every pattern form, further, it is possible to combine an immersion method with super resolution techniques such as a phase shift method and a transformation lighting method now under discussion.

When an ArF excimer laser is used as the light source, it is thought that pure water (having a refractive index of 1.44 at 193 nm) is most promising as the immersion liquid in view of the safety in handling, the transmittance and the refractive index at 193 nm. When an $F_2$ excimer laser is used as the light source, a solution containing fluorine is discussed from the balance of the transmittance and the refractive index at 157 nm, but a sufficiently satisfactory solution has not been found yet from the viewpoint of the environmental safety and at the point of refractive index. From the extent of the effect of immersion and the degree of completion of resist, it is thought that immersion exposure technique will be mounted on an ArF exposure apparatus earliest.

As described above, it is expected that the application of an immersion exposure method will bring considerable advantages to the semiconductor industry in view of economy and lithographic characteristics, such as resolution and the like. On the other hand, since a resist film is directly brought into contact with an immersion liquid at the time of exposure in immersion exposure, it is feared that, in the case of ArF immersion, the components of the resist film are eluted into pure water of the immersion liquid to soil the lens of exposure apparatus, or pure water osmoses into the resist film and exerts a bad influence on resist performance.

There is disclosed in WO 2004/068242A1 a resist composition that does not impair the improving effect of resolution and the depth of focus that is the advantage of immersion lithography, and influenced by water used in an immersion lithography process with difficulty.

However, further improvement of conventional resist compositions is required in the points of elution of the components of resist films into pure water of the immersion liquid and development defect.

SUMMARY OF THE INVENTION

In consideration of the problems in immersion exposure of prior art, an object of the present invention is to provide a positive resist composition suitable for immersion exposure that is restrained in the eluted amount of the components of a resist film into pure water of the immersion liquid, and reduced in the number of generation of development defects, and another object is to provide a pattern-forming method using the same.

The inventions are a positive resist composition suitable for immersion exposure comprising the following constitution, and a pattern-forming method using the same, thus the above objects can be achieved.

(1) A positive resist composition for immersion exposure comprising:

(A) a resin capable of increasing its solubility in an alkali developer by an action of an acid, and (B) a compound capable of generating an acid upon irradiation with actinic ray or radiation, wherein the acid satisfies conditions of $V \geq 230$ and $V/S \leq 0.93$ taking van der Waals volume of the acid as V ($\text{Å}^3$), and van der Waals surface area of the acid as S ($\text{Å}^2$).

(2) The positive resist composition for immersion exposure as described in the above item (1), wherein the acid further satisfies the conditions of $0.80 \leq V/S \leq 0.90$.

(3) The positive resist composition for immersion exposure as described in the above item (1) or (2), wherein the compound (B) is a sulfonium salt compound having an anion represented by formula (X) or (Y):

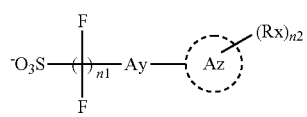
(X)

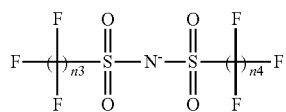
(Y)

in formula (X), Rx represents an alkyl group, —OR'$_1$, —C(=O)R'$_1$, —C(=O)OR'$_1$, —SO$_2$R'$_1$, or —SO$_3$R'$_1$; Ay represents a single bond, —SO$_2$—, —SO$_3$—, —SO$_2$N(R'$_1$)—, —CO$_2$—, an oxygen atom, —C(=O)—, —C(=O)N(R'$_1$)—, or an alkylene group; R'$_1$ represents a hydrogen atom or an alkyl group; Az represents a monocyclic or polycyclic hydrocarbon group or an aryl group; n$_1$ represents an integer of from 1 to 4; and n$_2$ represents an integer of from 1 to 4; in formula (Y), n$_3$ represents an integer of from 3 to 6; and n$_4$ represents an integer of from 3 to 6.

(4) The positive resist composition for immersion exposure as described in the above item (1), (2) or (3), wherein the resin (A) comprises a repeating unit having a group capable of decomposing by the action of an acid and represented by formula (I):

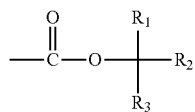
(I)

wherein R$_1$, R$_2$ and R$_3$ each represents an alkyl group, a cycloalkyl group, or an alkenyl group, and at least two of R$_1$ to R$_3$ may be bonded to each other to form a ring.

(5) A pattern-forming method comprising: forming a resist film with the positive resist composition for immersion exposure as described in any of the above items (1) to (4); exposing the resist film through an immersion liquid so as to form an exposed resist film and developing the exposed resist film.

BRIEF DESCRIPTION OF THE DRAWINGS

FIG. 1 is a drawing typically showing the relationship between the shapes and the numerical values of V/S. 1 denotes a rectangular parallelepiped, 2 denotes a cube, and 3 denotes a sphere.

DETAILED DESCRIPTION OF THE INVENTION

The invention is described in detail below.

Incidentally, in the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

(A) Resins Capable of Increasing the Solubility in an Alkali Developer by the Action of an Acid:

A positive resist composition for immersion exposure in the invention contains a resin capable of increasing the solubility in an alkali developer by the action of an acid (hereinafter also referred to as "acid-decomposable resin (A)").

Acid-decomposable resin (A) is preferably a resin having a repeating unit having a group capable of decomposing by the action of an acid and represented by the following formula (I):

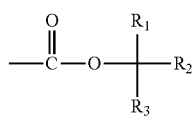
(I)

In formula (I), R$_1$, R$_2$ and R$_3$ each represents an alkyl group, a cycloalkyl group, or an alkenyl group, and at least two of R$_1$ to R$_3$ may be bonded to each other to form a ring.

As the alkyl group represented by R$_1$ to R$_3$, an alkyl group having from 1 to 8 carbon atoms is preferred, e.g., a methyl group, an ethyl group, a propyl group, an n-butyl group, a sec-butyl group, a 2-hexyl group, an octyl group, etc., can be exemplified.

The cycloalkyl group represented by R$_1$ to R$_3$ may be a monocyclic or polycyclic group, and specifically a group having a monocyclic, bicyclic, tricyclic or tetracyclic structure and having 5 or more carbon atoms can be exemplified. The number of carbon atoms is preferably from 6 to 30, and especially preferably from 7 to 25.

The examples of preferred cycloalkyl groups represented by R$_1$ to R$_3$ include an adamantyl group, a noradamantyl group, a decalin residue, a tricyclodecanyl group, a tetracyclo-dodecanyl group, a norbornyl group, a cedrol group, a cyclohexyl group, a cycloheptyl group, a cyclooctyl group, a cyclodecanyl group, and a cyclododecanyl group, and more preferred groups are an adamantyl group, a decalin residue, a norbornyl group, a cedrol group, a cyclohexyl group, a cycloheptyl group, a cyclooctyl group, a cyclodecanyl group, and a cyclododecanyl group. A part of the carbon atoms in the cycloalkyl group may be substituted with a hetero atom, e.g., an oxygen atom.

As the alkenyl group represented by R$_1$ to R$_3$, an alkenyl group having from 2 to 8 carbon atoms is preferred, e.g., a vinyl group, an allyl group, a butenyl group, a cyclohexenyl group, etc., can be exemplified.

The alkyl group, cycloalkyl group and alkenyl group represented by R$_1$ to R$_3$ may each have a substituent. As the examples of the substituents, an alkyl group, a halogen atom, a hydroxyl group, an alkoxyl group, a carboxyl group, an alkoxycarbonyl group, a cyano group, and an ester group are exemplified. As the alkyl group, a lower alkyl group, e.g., a methyl group, an ethyl group, a propyl group, an isopropyl group, a butyl group, etc., are preferred, and a methyl group, an ethyl group, a propyl group, and an isopropyl group are more preferred. As the alkoxyl group, an alkoxyl group having from 1 to 4 carbon atoms, e.g., a methoxy group, an ethoxy group, a propoxy group, a butoxy group, etc., can be exemplified. The alkyl and alkoxyl groups may further have a substituent, e.g., a hydroxyl group, a halogen atom, an alkoxyl group, etc., can be exemplified as the substituents of the alkyl and alkoxyl groups.

At least two of $R_1$ to $R_3$ may be bonded to each other to form a ring, and the ring may be formed through a hetero atom, such as an oxygen atom.

A repeating unit having a group represented by formula (I) may be any repeating unit, but a repeating unit represented by the following formula (pA) is preferred.

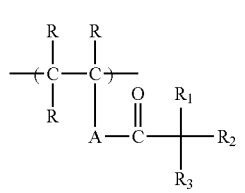

(pA)

In formula (pA), R represents a hydrogen atom, a halogen atom, or a substituted or unsubstituted, straight chain or branched alkyl group having from 1 to 4 carbon atoms, and a plurality of R's may be the same with or different from each other.

A represents a single group or the combination of two or more groups selected from the group consisting of a single bond, an alkylene group, an ether group, a thioether group, a carbonyl group, an ester group, an amido group, a sulfonamido group, a urethane group, and a urea group. The alkylene group may have a substituent.

$R_1$ to $R_3$ have the same meaning with $R_1$ to $R_3$ in formula (I).

The most preferred repeating units represented by formula (pA) are repeating units derived from 2-alkyl-2-adamantyl (meth)acrylate and dialkyl(1-adamantyl)methyl (meth)acrylate.

The specific examples of the repeating units represented by formula (pA) are shown below.

(In the formulae, Rx represents H, $CH_3$ or $CF_3$.)

1

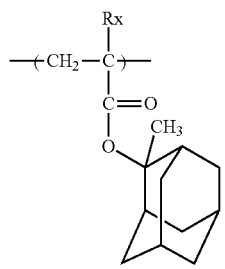

2

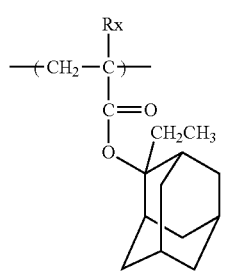

3

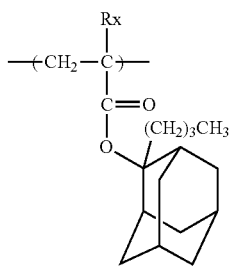

4

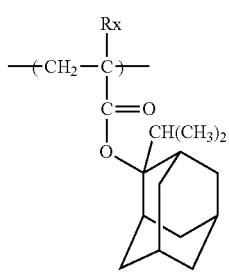

5

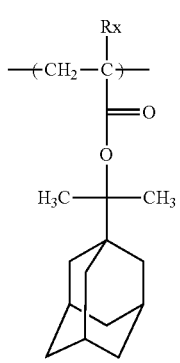

6

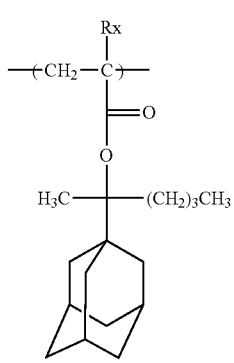

7

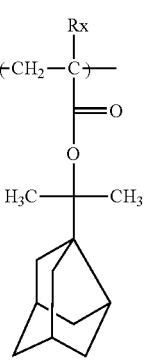

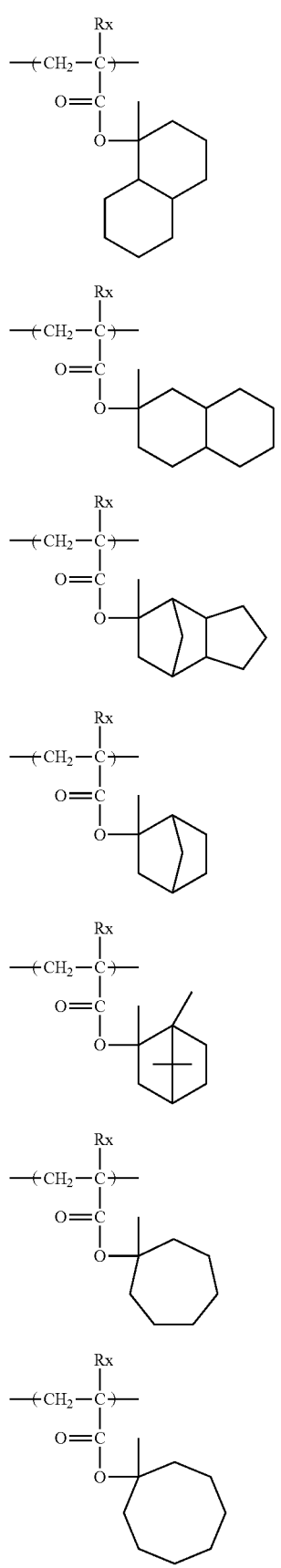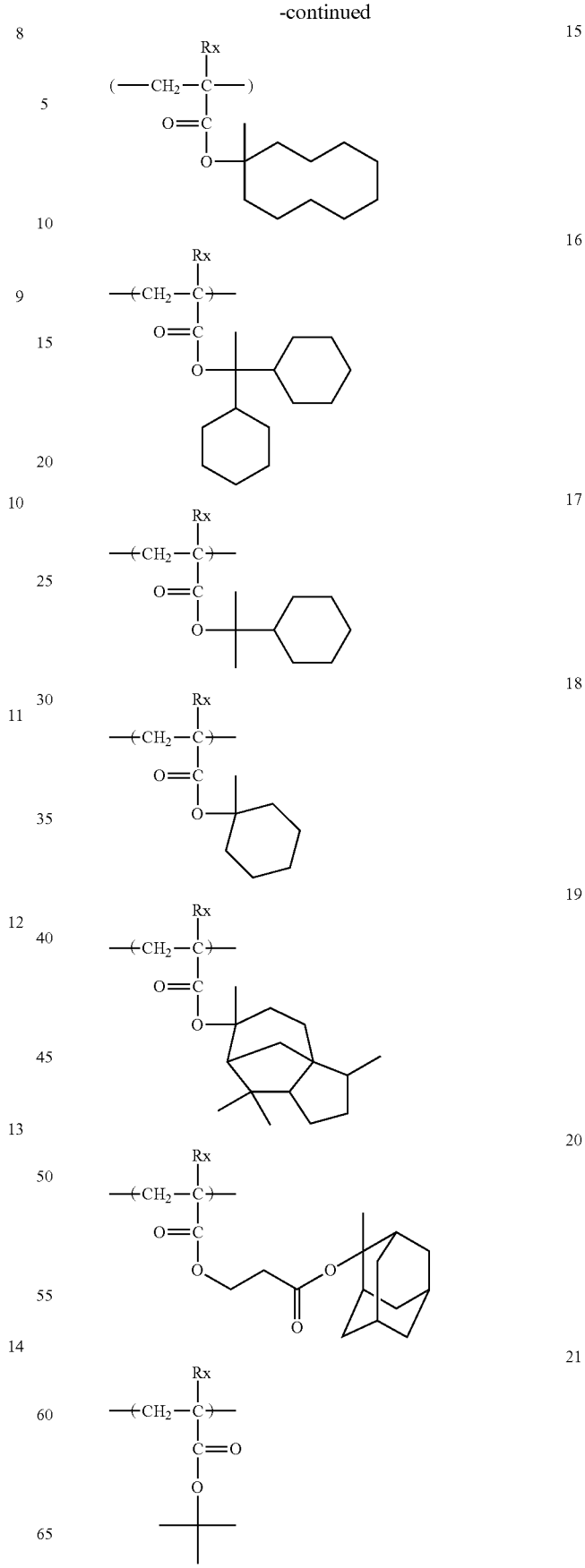

-continued

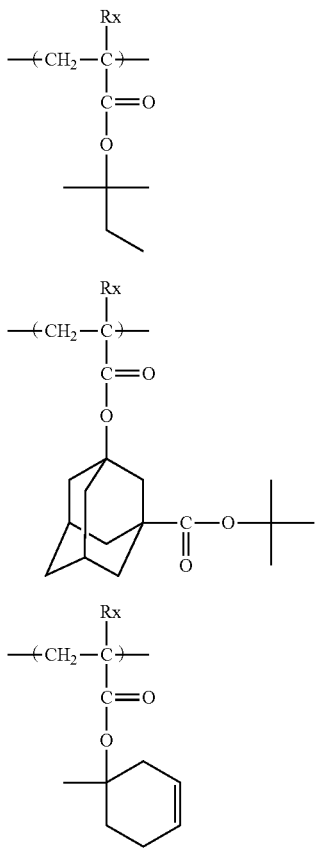

The content of the repeating unit having a group represented by formula (I) in acid-decomposable resin (A) is preferably from 10 to 60 mol % in the total repeating structural units, and more preferably from 10 to 50 mol %.

Acid-decomposable resin (A) may have a group represented by formula (I) alone as the acid-decomposable, or may have any other acid-decomposable group in combination.

As other acid-decomposable groups that may be contained in acid-decomposable resin (A), e.g., —O—C($R_{36}$)($R_{37}$)($R_{38}$), —O—C($R_{36}$)($R_{37}$)(O$R_{39}$), —O—C(=O)—O—C($R_{36}$)($R_{37}$)($R_{38}$), —O—C($R_{01}$)($R_{02}$)(O$R_{39}$), —O—C($R_{01}$)($R_{02}$)—C(=O)—O—C($R_{36}$)($R_{37}$)($R_{38}$), etc., can be exemplified.

In the formulae, $R_{36}$, $R_{37}$, $R_{38}$ and $R_{39}$ each represents an alkyl group, a cycloalkyl group, an aryl group, an aralkyl group, or an alkenyl group. $R_{36}$ and $R_{37}$, and $R_{36}$ and $R_{39}$ may be bonded to each other to form a ring.

$R_{01}$ and $R_{02}$ each represents a hydrogen atom, an alkyl group, a cycloalkyl group, an aryl group, an aralkyl group, or an alkenyl group.

Incidentally, —C($R_{36}$)($R_{37}$)($R_{38}$) means a group in which each group represented by $R_{36}$, $R_{37}$ or $R_{39}$ is bonded to a carbon atom through a single bond, and hereinafter the same.

In acid-decomposable resin (A), the total amount of repeating units having an acid-decomposable group, including a repeating unit having an acid-decomposable group represented by formula (I) and other repeating unit having an acid-decomposable group, is preferably from 10 to 70 mol % in the total repeating units, more preferably from 20 to 65 mol %, and still more preferably from 25 to 50 mol %.

It is preferred for acid-decomposable resin (A) to have a monocyclic or polycyclic alicyclic hydrocarbon structure, and it is preferred to contain at least one repeating unit selected from the group consisting of a repeating unit having a partial structure containing an alicyclic hydrocarbon represented by any of the following formulae (pI) to (pVI), and a repeating unit represented by the following formula (II-AB).

In the first place, partial structures containing an alicyclic hydrocarbon represented by any of the following formulae (pI) to (pVI) are described.

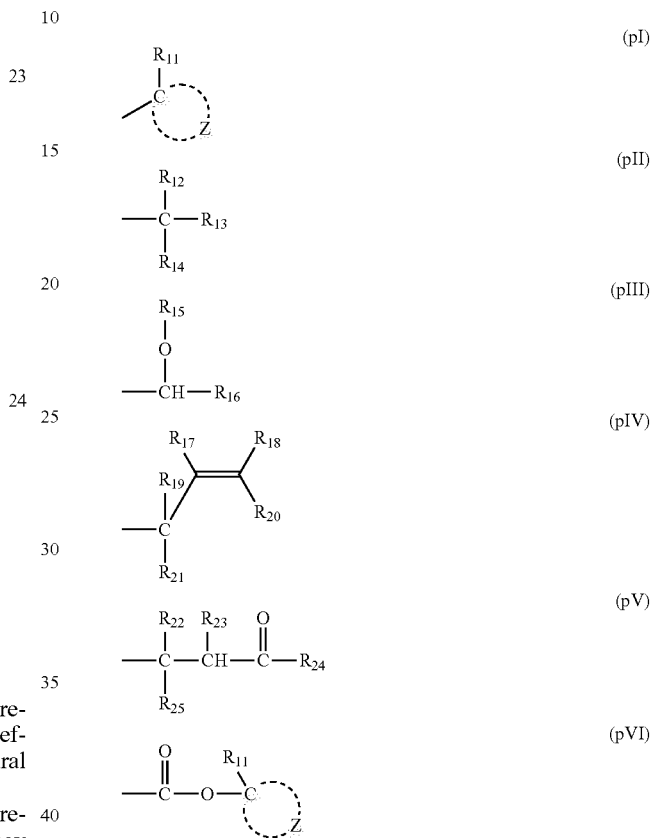

In formulae (pI) to (pVI), $R_{11}$ represents a methyl group, an ethyl group, an n-propyl group, an isopropyl group, an n-butyl group, an isobutyl group, or a sec-butyl group; and Z represents an atomic group necessary to form an alicyclic hydrocarbon group together with a carbon atom.

$R_{12}$, $R_{13}$, $R_{14}$, $R_{15}$ and $R_{16}$ each represents a straight chain or branched alkyl group having from 1 to 4 carbon atoms, or an alicyclic hydrocarbon group, provided that at least one of $R_{12}$ to $R_{14}$, or either $R_{15}$ or $R_{16}$ represents an alicyclic hydrocarbon group.

$R_{17}$, $R_{18}$, $R_{19}$, $R_{20}$ and $R_{21}$ each represents a hydrogen atom, a straight chain or branched alkyl group having from 1 to 4 carbon atoms, or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms, or an alicyclic hydrocarbon group.

$R_{22}$, $R_{23}$, $R_{24}$ and $R_{25}$ each represents a hydrogen atom, a straight chain or branched alkyl group having from 1 to 4 carbon atoms, or an alicyclic hydrocarbon group, provided that at least one of $R_{22}$ to $R_{25}$ represents an alicyclic hydrocarbon group, and $R_{23}$ and $R_{24}$ may be bonded to each other to form a ring.

In formulae (pI) to (pVI), the alkyl group represented by $R_{12}$ to $R_{25}$ is a straight chain or branched alkyl group having from 1 to 4 carbon atoms, e.g., a methyl group, an ethyl group, an n-propyl group, an isopropyl group, an n-butyl group, an isobutyl group, a sec-butyl group, a t-butyl group, etc., are exemplified.

As the examples of the substituents that the alkyl group may have, an alkoxyl group having from 1 to 4 carbon atoms, a halogen atom (a fluorine atom, a chlorine ion, a bromine ion, an iodine ion), an acyl group, an acyloxy group, a cyano group, a hydroxyl group, a carboxyl group, an alkoxycarbonyl group, a nitro group, etc., can be exemplified.

The alicyclic hydrocarbon groups represented by $R_{11}$ to $R_{25}$ or the alicyclic hydrocarbon group formed by Z together with carbon atoms may be monocyclic or polycyclic. Specifically, groups having a monocyclic, bicyclic, tricyclic or tetracyclic structure having 5 or more carbon atoms can be exemplified. The number of carbon atoms of these alicyclic hydrocarbon groups is preferably from 6 to 30, and especially preferably from 7 to 25. These alicyclic hydrocarbon groups may have a substituent.

As preferred alicyclic hydrocarbon groups, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, a cyclododecanyl group, etc., can be exemplified. More preferably, an adamantyl group, a decalin residue, a norbornyl group, a cedrol group, a cyclohexyl group, a cycloheptyl group, a cyclooctyl group, a cyclodecanyl group and a cyclododecanyl group are exemplified.

As the substituents of these alicyclic hydrocarbon groups, an alkyl group, a halogen atom, a hydroxyl group, an alkoxyl group, a carboxyl group, and an alkoxycarbonyl group are exemplified. As the alkyl group, lower alkyl groups, e.g., a methyl group, an ethyl group, a propyl group, an isopropyl group, a butyl group, etc., are preferred, and more preferably the alkyl group is selected from the group consisting of a methyl group, an ethyl group, a propyl group, and an isopropyl group. As the alkoxyl group, alkoxyl groups having from 1 to 4 carbon atoms, e.g., a methoxy group, an ethoxy group, a propoxy group, a butoxy group, etc., can be exemplified. As the substituents that may be contained in the alkyl, alkoxyl and alkoxycarbonyl groups, a hydroxyl group, a halogen atom and an alkoxyl group can be exemplified.

The structures represented by any of formulae (pI) to (pVI) in the resin can be used for the protection of alkali-soluble groups. As the alkali-soluble groups, various groups well known in the technical field can be exemplified.

Specifically, as the alkali-soluble groups, a carboxylic acid group, a sulfonic acid group, a phenol group, a thiol group, etc., are exemplified, preferably a carboxylic acid group and a sulfonic acid group.

As the alkali-soluble groups protected with the structures represented by formulae (pI) to (pVI) in the above resins, structures in which the hydrogen atom of the carboxyl group is substituted with the structure represented by any of formulae (pI) to (pVI) are preferably exemplified.

As the specific examples of the repeating units having a structure in which the hydrogen atom of the carboxyl group is substituted with the structure represented by any of formulae (pI) to (pVI), e.g., the same groups as exemplified above as the specific examples of the repeating units represented by formula (pA) can be exemplified.

As repeating units having an alicyclic hydrocarbon structure on the side chain, the following repeating units can further be exemplified.

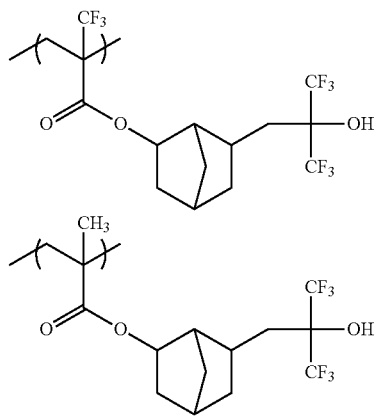

In the next place, repeating units having an alicyclic structure represented by formula (II-AB) are described.

A repeating unit having an alicyclic structure represented by formula (II-AB) is shown below.

(II-AB)

In formula (II-AB), $R_{11}'$ and $R_{12}'$ each represents a hydrogen atom, a cyano group, a halogen atom, or an alkyl group.

Z' contains two bonded carbon atoms (C—C) and represents an atomic group to form an alicyclic structure.

The repeating unit represented by formula (II-AB) is preferably a repeating unit represented by the following formula (II-A) or (II-B).

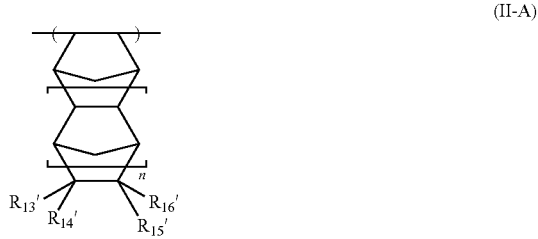

(II-A)

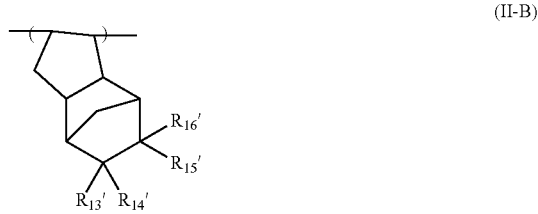

(II-B)

In formulae (II-A) and (II-B), $R_{13}'$, $R_{14}'$, $R_{15}'$ and $R_{16}'$ each represents a hydrogen atom, a halogen atom, a hydroxyl group, a cyano group, —COOH, —COOR$_5$, a group decomposing by the action of an acid, —C(=O)—X-A'—$R_{17}'$, an alkyl group, or an alicyclic hydrocarbon group, and at least two of $R_{13}'$ to $R_{16}'$ may be bonded to form a ring.

$R_5$ represents an alkyl group, an alicyclic hydrocarbon group, or —Y group shown below.

X represents an oxygen atom, a sulfur atom, —NH—, —NHSO$_2$—, or —NHSO$_2$NH—.

A' represents a single bond or a divalent linking group.

$R_{17}'$ represents —COOH, —COOR$_5$, —CN, a hydroxyl group, an alkoxyl group, —CO—NH—R$_6$, —CO—NH—SO$_2$—R$_6$, or —Y group shown below.

$R_6$ represents an alkyl group or an alicyclic hydrocarbon group.

n represents 0 or 1.

—Y group

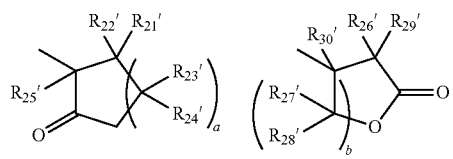

In —Y group, $R_{21}'$ to $R_{30}'$ each represents a hydrogen atom or an alkyl group.

a and b each represents 1 or 2.

As the examples of the halogen atoms represented by $R_{11}'$ and $R_{12}'$ in formula (II-AB), a chlorine atom, a bromine atom, a fluorine atom and an iodine atom can be exemplified.

As the alkyl groups represented by $R_{11}'$, $R_{12}'$, $R_{21}'$ to $R_{30}'$, straight chain or branched alkyl groups having from 1 to 10 carbon atoms are preferred, straight chain or branched alkyl groups having from 1 to 6 carbon atoms are more preferred, and a methyl group, an ethyl group, a propyl group, an isopropyl group, an n-butyl group, an isobutyl group, a sec-butyl group and a t-butyl group are still more preferred.

As the further substituents of the alkyl group, a hydroxyl group, a halogen atom, a carboxyl group, an alkoxyl group, an acyl group, a cyano group, and an acyloxy group can be exemplified. As the halogen atom, a chlorine atom, a bromine atom, a fluorine atom, an iodine atom can be exemplified, as the alkoxyl group, an alkoxyl group having from 1 to 4 carbon atoms, e.g., a methoxy group, an ethoxy group, a propoxy group and a butoxy group can be exemplified, as the acyl group, e.g., a formyl group and an acetyl group can be exemplified, and as the acyloxy group, an acetoxy group can be exemplified.

The atomic group to form an alicyclic structure represented by Z' is an atomic group to form an alicyclic hydrocarbon repeating unit, which may have a substituent, in a resin, and an atomic group to form a bridged alicyclic structure to form a repeating unit having bridged alicyclic hydrocarbon is preferred above all.

As the skeletons of the alicyclic hydrocarbon formed, the same alicyclic hydrocarbon groups as represented by $R_{11}$ to $R_{25}$ in formulae (pI) to (pVI) are exemplified.

The skeletons of the alicyclic hydrocarbon may have a substituent. As the substituents, those represented by $R_{13}'$ to $R_{16}'$ in formula (II-A) or (II-B) can be exemplified.

Of the repeating units having bridged alicyclic hydrocarbon, the repeating unit represented by formula (II-A) or (II-B) is more preferred.

In the repeating unit represented by formula (II-AB), the acid-decomposable group may be contained in the above —C(=O)—X-A'-R$_{17}$', or may be contained as the substituent of the alicyclic structure formed by Z'.

The structure of the acid-decomposable group is represented by formula —C(=O)—X$_1$—R$_0$.

In the formula, $R_0$ represents a tertiary alkyl group, e.g., a t-butyl group, a t-amyl group, etc., an isoboronyl group, a 1-alkoxyethyl group, e.g., a 1-ethoxyethyl group, a 1-butoxyethyl group, a 1-isobutoxyethyl group, a 1-cyclo-hexyloxyethyl group, etc., an alkoxymethyl group, e.g., a methoxymethyl group, an ethoxymethyl group, etc., a 3-oxoalkyl group, a tetrahydropyranyl group, a tetrahydrofuranyl group, a trialkylsilyl ester group, a 3-oxocyclohexyl ester group, a 2-methyl-2-adamantyl group, a mevalonic lactone residue, etc. $X_1$ has the same meaning as X described above.

As the halogen atoms represented by $R_{13}'$ to $R_{16}'$, a chlorine atom, a bromine atom, a fluorine atom, an iodine atom, etc., can be exemplified.

As the alkyl groups represented by $R_5$, $R_6$, $R_{13}'$ to $R_{16}'$, straight chain or branched alkyl groups having from 1 to 10 carbon atoms are preferred, straight chain or branched alkyl groups having from 1 to 6 carbon atoms are more preferred, and a methyl group, an ethyl group, a propyl group, an isopropyl group, an n-butyl group, an isobutyl group, a sec-butyl group and a t-butyl group are still more preferred.

The cyclic hydrocarbon groups represented by $R_5$, $R_6$, $R_{13}'$ to $R_{16}'$ are cyclic alkyl groups and bridged hydrocarbons, and, e.g., a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a norbornanepoxy group, a menthyl group, an isomenthyl group, a neomenthyl group, a tetracyclododecanyl group, etc., can be exemplified.

As the rings formed by bonding at least two of $R_{13}'$ to $R_{16}'$, rings having from 5 to 12 carbon atoms, e.g., cyclopentene, cyclohexene, cycloheptane, cyclooctane, etc., can be exemplified.

As the alkoxyl group represented by $R_{17}'$, an alkoxyl group having from 1 to 4 carbon atoms, e.g., a methoxy group, an ethoxy group, a propoxy group or a butoxy group can be exemplified.

As further substituents of the alkyl, cyclic hydrocarbon and alkoxyl groups, a hydroxyl group, a halogen atom, a carboxyl group, an alkoxyl group, an acyl group, a cyano group, an acyloxy group, an alkyl group, a cyclic hydrocarbon group, etc., can be exemplified. As the halogen atom, a chlorine atom, a bromine atom, a fluorine atom, an iodine atom, etc., can be exemplified, as the alkoxyl group, an alkoxyl group having from 1 to 4 carbon atoms, e.g., a methoxy group, an ethoxy group, a propoxy group, a butoxy group, etc., can be exemplified, as the acyl group, e.g., a formyl group, an acetyl group, etc., can be exemplified, and as the acyloxy group, an acetoxy group, etc., can be exemplified.

The alkyl groups and cyclic hydrocarbon groups are the same as those described above.

As the examples of the divalent linking group represented by A', a single group or combinations of two or more groups selected from the group consisting of an alkylene group, an ether group, a thioether group, a carbonyl group, an ester group, an amido group, a sulfonamido group, a urethane group and a urea group are exemplified.

Various substituents of $R_{13}'$ to $R_{16}'$ in formula (II-A) or (II-B) can also be the substituents of the atomic group to form an alicyclic structure or atomic group Z to form a bridged alicyclic structure in formula (II-AB).

The specific examples of the repeating units represented by formula (II-A) or (II-B) are shown below, but the invention is not limited thereto.

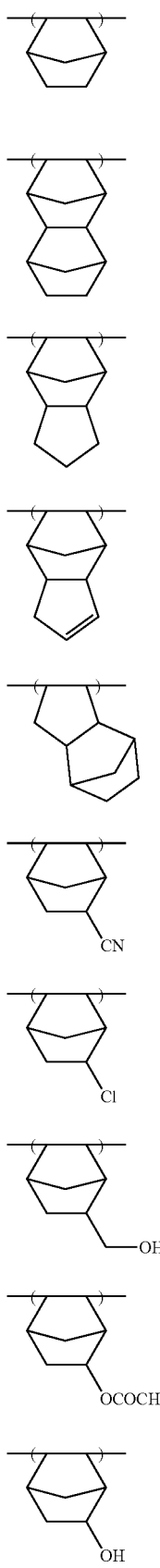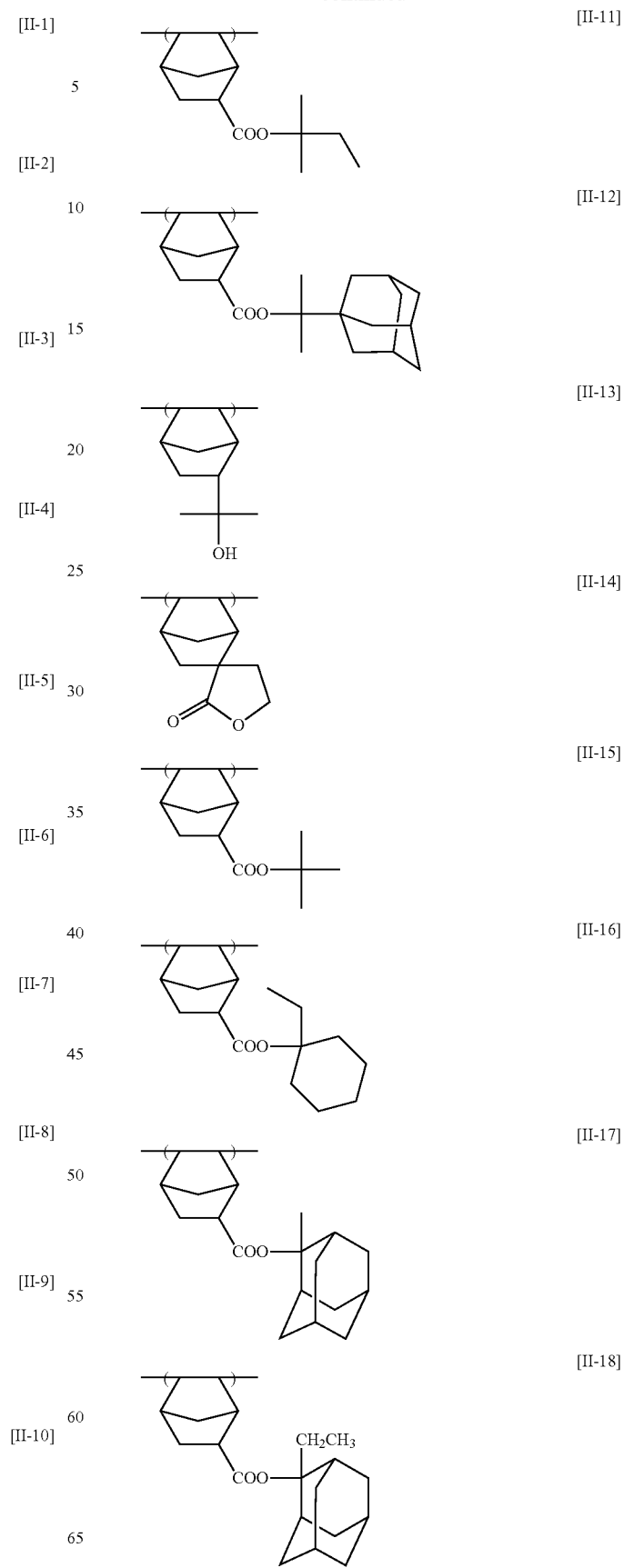

[II-19] 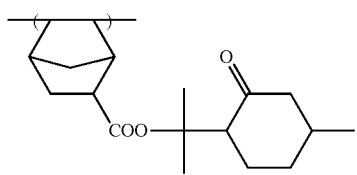
[II-20] 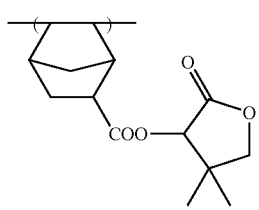
[II-21] 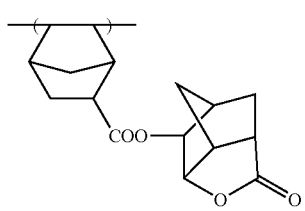
[II-22] 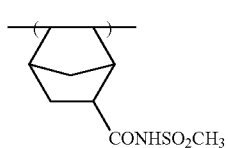
[II-23] 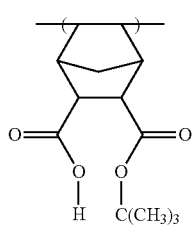
[II-24] 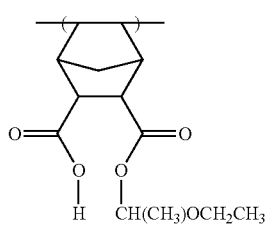
[II-25] 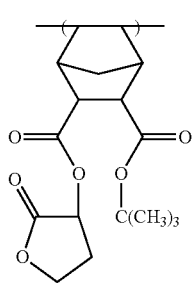
[II-26] 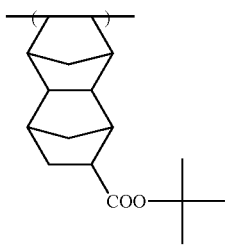
[II-27] 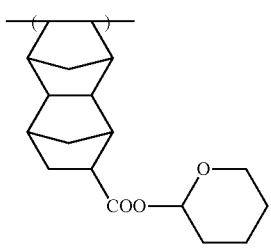
[II-28] 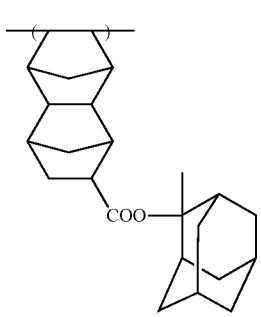
[II-29] 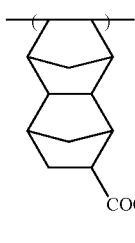
[II-30] 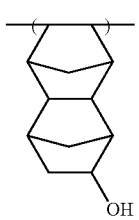
[II-31] 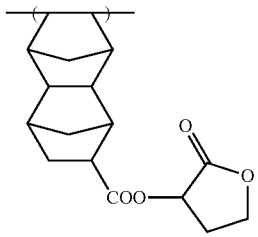

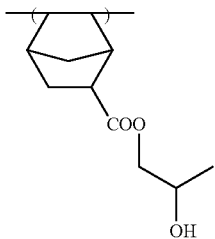

[II-32]

In acid-decomposable resin (A), the content of the repeating unit having a partial structure containing alicyclic hydrocarbon represented by any of formulae (pI) to (pVI) is preferably from 20 to 70 mol % in the total repeating structural units, more preferably from 24 to 65 mol %, and still more preferably from 28 to 60 mol %.

In acid-decomposable resin (A), the content of the repeating unit represented by formula (II-AB) is preferably from 10 to 60 mol % in the total repeating units, more preferably from 15 to 55 mol %, and still more preferably from 20 to 50 mol %.

In acid-decomposable resin (A) having a monocyclic or polycyclic alicyclic hydrocarbon structure, the acid-decomposable group represented by formula (I) and other acid-decomposable group may be contained in any of the repeating unit having a partial structure containing alicyclic hydrocarbon represented by any of formulae (pI) to (pVI), the repeating unit represented by formula (II-AB), and other copolymerization components described later.

Further, it is preferred for acid-decomposable resin (A) to have a lactone group, it is more preferred to contain a repeating unit having a group having a lactone structure represented by the following formula (Lc) or any of formulae (III-1) to (III-5), and the group having a lactone structure may be directly bonded to the main chain.

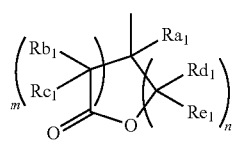

(Lc)

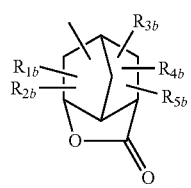

(III-1)

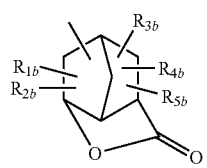

(III-2)

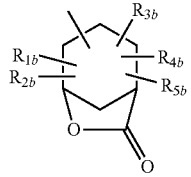

(III-3)

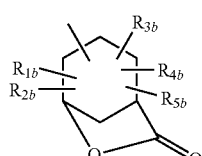

(III-4)

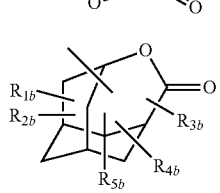

(III-5)

In formula (Lc), $Ra_1$, $Rb_1$, $Rc_1$, $Rd_1$ and $Re_1$ each represents a hydrogen atom or an alkyl group; m and n each represents an integer of from 0 to 3, and m+n is from 2 to 6.

In formulae (III-1) to (III-5), $R_{1b}$, $R_{2b}$, $R_{3b}$, $R_{4b}$ and $R_{5b}$ each represents a hydrogen atom, an alkyl group, a cycloalkyl group, an alkoxyl group, an alkoxycarbonyl group, an alkylsulfonylimino group, or an alkenyl group. Two of $R_{1b}$ to $R_{5b}$ may be bonded to each other to form a ring.

As the alkyl group represented by $Ra_1$ to $Re_1$ in formula (Lc), and the alkyl group in the alkyl group, alkoxyl group, alkoxycarbonyl group and alkylsulfonylimino group represented by $R_{1b}$ to $R_{5b}$ in formulae (III-1) to (III-5), straight chain or branched alkyl groups are exemplified, and these alkyl groups may each have a substituent.

As the preferred substituents, an alkoxyl group having from 1 to 4 carbon atoms, a halogen atom (e.g., a fluorine atom, a chlorine atom, a bromine atom, an iodine atom), an acyl group having from 2 to 5 carbon atoms, an acyloxy group having from 2 to 5 carbon atoms, a cyano group, a hydroxyl group, a carboxyl group, an alkoxycarbonyl group having from 2 to 5 carbon atoms, a nitro group, etc., can be exemplified.

As the repeating units having a group having a lactone structure represented by formula (Lc) or any of formulae (III-1) to (III-5), a repeating unit in which at least one of $R_{13}'$ to $R_{16}'$ in formula (II-A) or (II-B) has a group represented by formula (Lc) or any of formulae (III-1) to (III-5) (e.g., $R_5$ in —$COOR_5$ has a group represented by formula (Lc) or any of formulae (III-1) to (III-5)), and a repeating unit represented by the following formula (AI) can be exemplified.

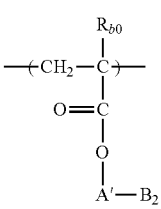

(AI)

In formula (AI), $R_{b0}$ represents a hydrogen atom, a halogen atom, or an alkyl group having from 1 to 4 carbon atoms. As the preferred substituents of the alkyl group represented by $R_{b0}$, those described above as the preferred substituents of the alkyl group represented by $R_{1b}$ in formulae (III-1) to (III-5) can be exemplified.

As the halogen atom represented by $R_{b0}$, a fluorine atom, a chlorine atom, a bromine atom and an iodine atom can be exemplified. $R_{b0}$ preferably represents a hydrogen atom.

A' represents a single bond, an ether group, an ester group, a carbonyl group, an alkylene group, or a divalent linking group obtained by combining these groups.

$B_2$ represents a group represented by formula (Lc) or any of formulae (III-1) to (III-5).

The specific examples of the repeating units having a group having a lactone structure are shown below, but the invention is not restricted to these examples.

(In the formulae, Rx represents H, $CH_3$ or $CF_3$.)

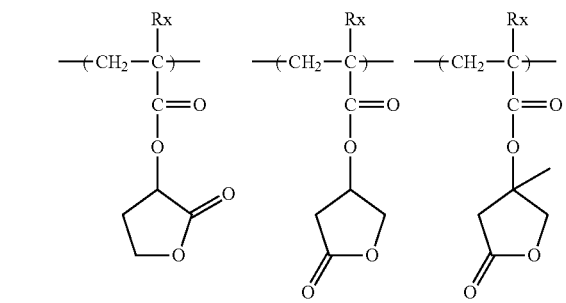

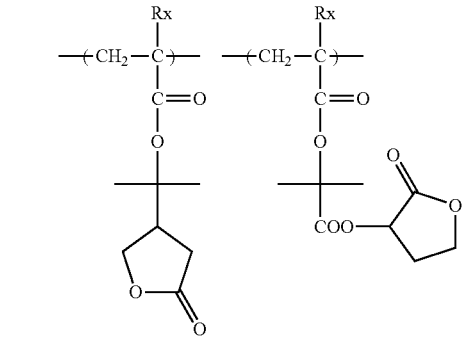

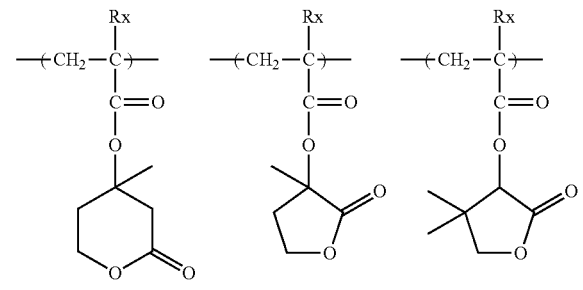

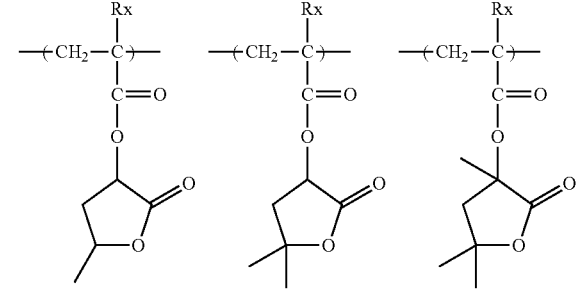

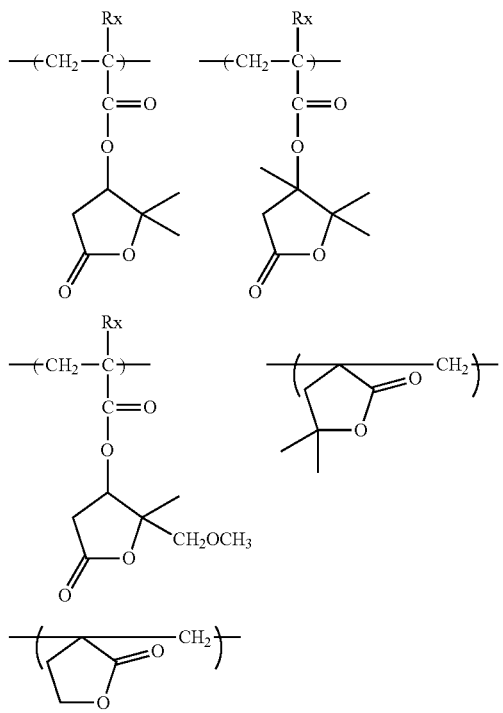

(In the formulae, Rx represents H, $CH_3$ or $CF_3$.)

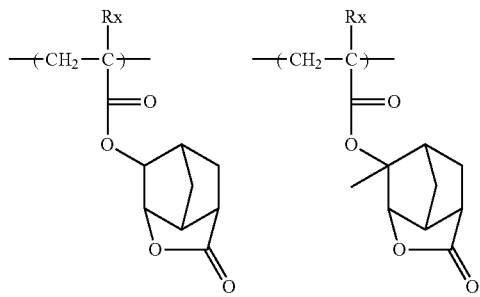

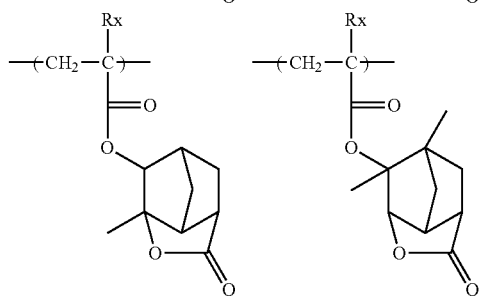

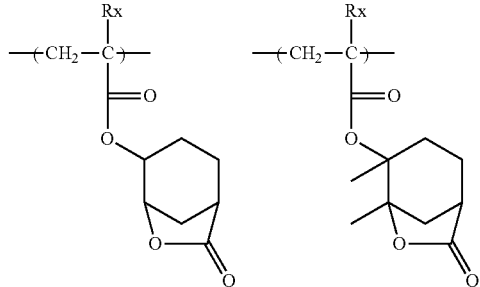

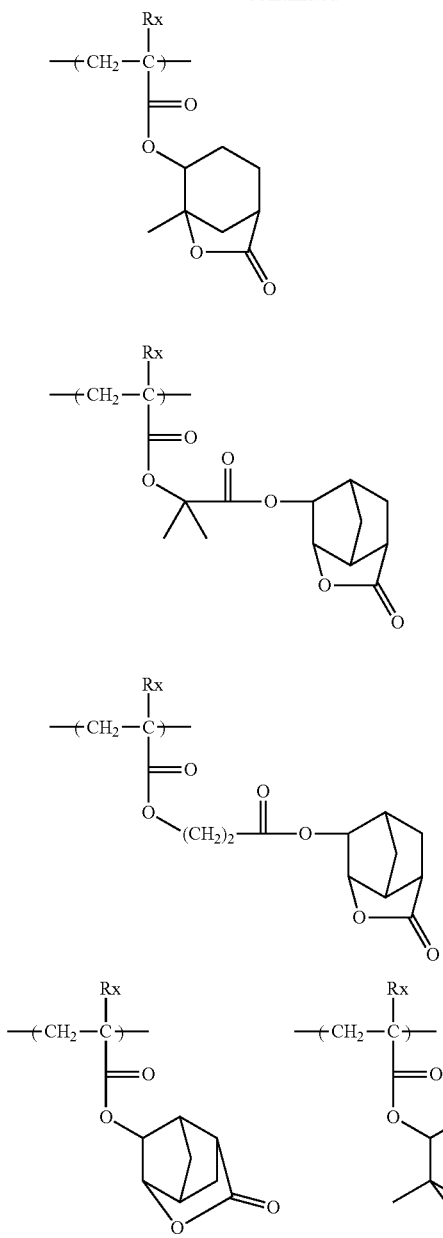
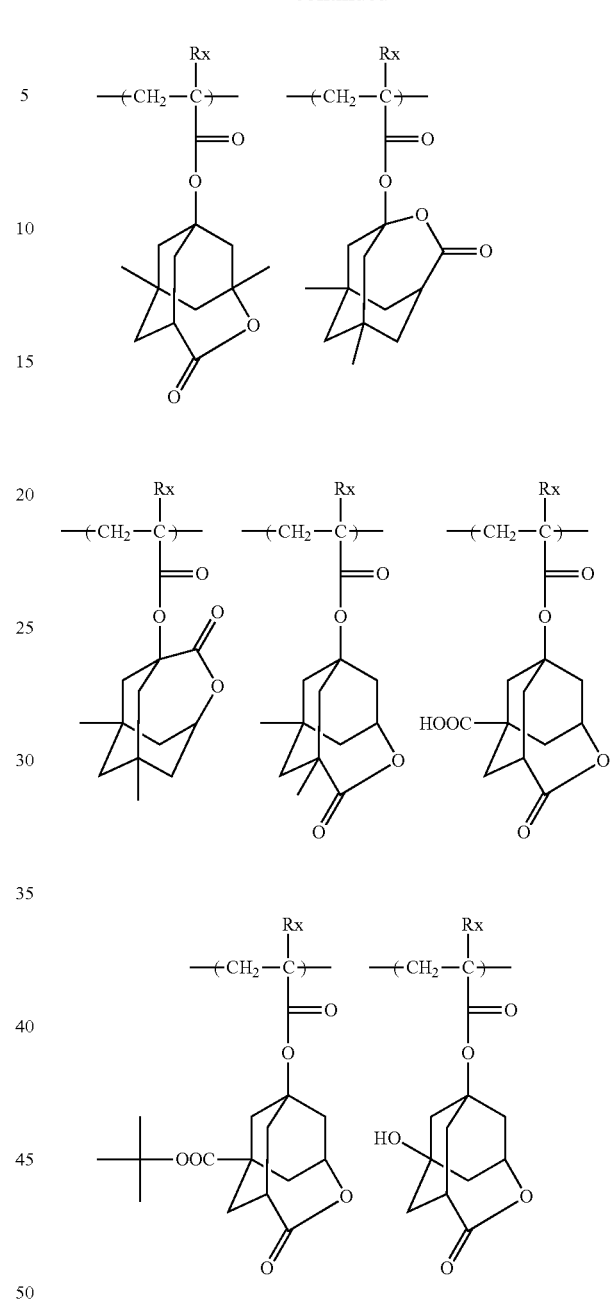
(In the formulae, Rx represents H, CH$_3$ or CF$_3$.)
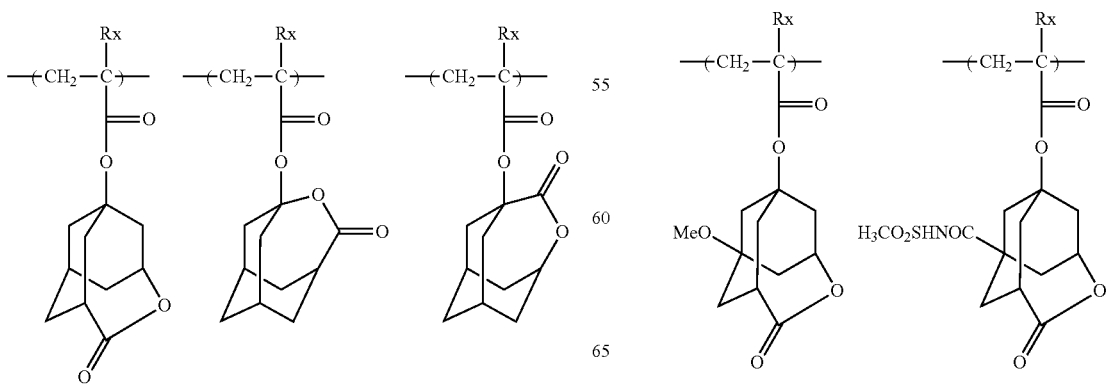

(In the formulae, Rx represents H, CH$_3$ or CF$_3$.)

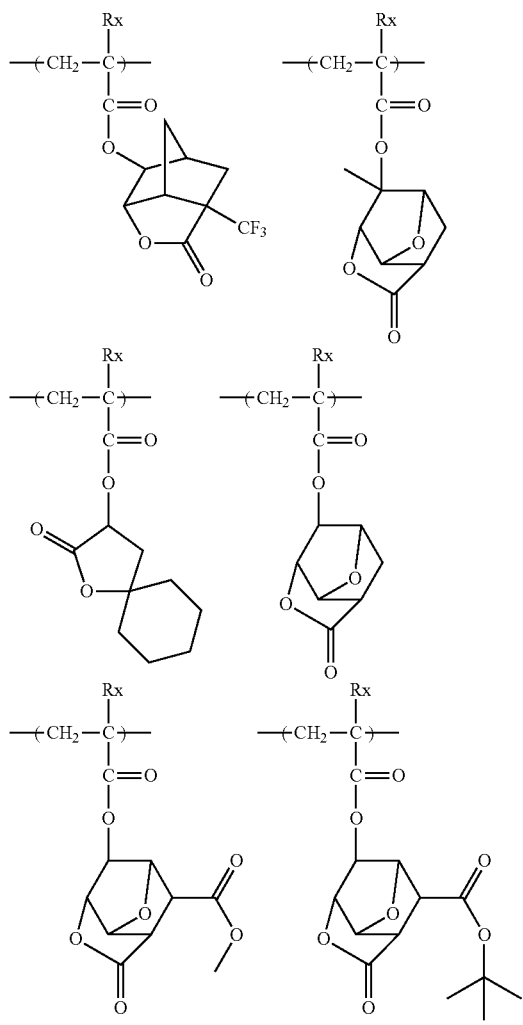

Acid-decomposable resin (A) may contain a repeating unit having a group represented by the following formula (IV).

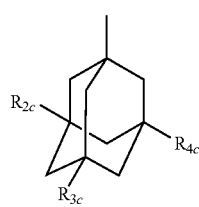

(IV)

In formula (IV), R$_{2c}$, R$_{3c}$ and R$_{4c}$ each represents a hydrogen atom or a hydroxyl group, provided that at least one of R$_{2c}$, R$_{3c}$ and R$_{4c}$ represents a hydroxyl group.

The group represented by formula (IV) is preferably a dihydroxy body or a monohydroxy body, and more preferably a dihydroxy body.

As the repeating units having a group represented by formula (IV), a repeating unit in which at least one of R$_{13}$' to R$_{16}$' in formula (II-A) or (II-B) has a group represented by formula (IV) (e.g., R$_5$ in —COOR$_5$ has a group represented by formula (IV)), or a repeating unit represented by the following formula (AII) can be exemplified.

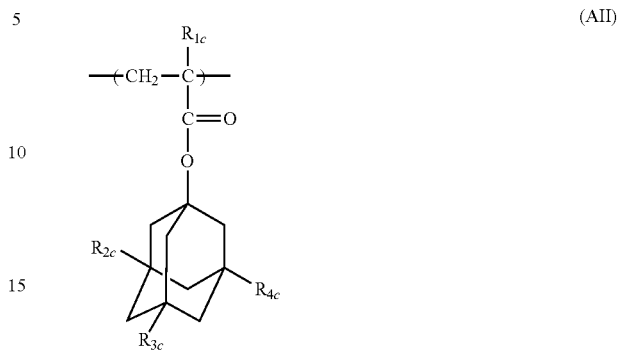

(AII)

In formula (AII), R$_{1c}$ represents a hydrogen atom or a methyl group.

R$_{2c}$, R$_{3c}$ and R$_{4c}$ each represents a hydrogen atom or a hydroxyl group, provided that at least one of R$_{2c}$, R$_{3c}$ and R$_{4c}$ represents a hydroxyl group. It is preferred that two of R$_{2c}$, R$_{3c}$ and R$_{4c}$ represent a hydroxyl group.

The specific examples of the repeating units having a structure represented by formula (AII) are shown below, but the invention is not restricted to these examples.

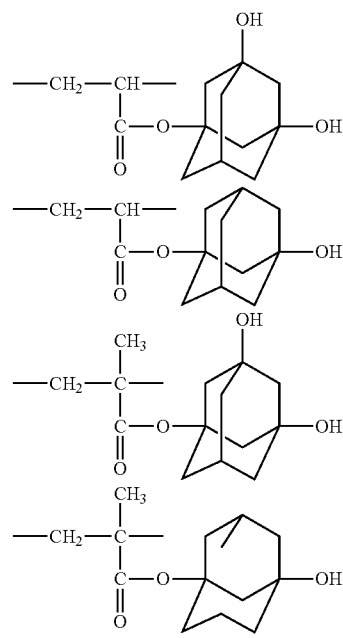

Acid-decomposable resin (A) may contain a repeating unit represented by the following formula (V).

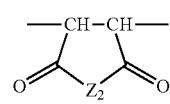

(V)

In formula (V), Z$_2$ represents —O— or —N(R$_{41}$)—; R$_{41}$ represents a hydrogen atom, a hydroxyl group, an alkyl group, or —OSO$_2$—R$_{42}$; and R$_{42}$ represents an alkyl group, a cycloalkyl group, or a camphor residue. The alkyl group, cycloalkyl group, and camphor residue represented by $R_{41}$ or $R_{42}$ may be substituted with a halogen atom (preferably a fluorine atom), etc.

As the specific examples of the repeating units represented by formula (V), the following compounds can be exemplified, but the invention is not restricted thereto.

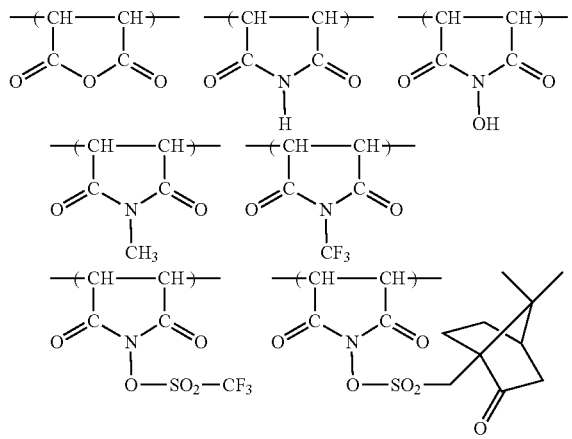

Since acid-decomposable resin (A) having a group represented by formula (I) is not influenced very much by an immersion liquid, the variation in film thickness of a resist film before and after immersion exposure can be made little. The variation in film thickness is preferably 10% or less of the thickness of a resist film before immersion exposure, and more preferably 5% or less. The layer thickness of a resist film can be measured with a multi-incident angle spectral ellipsometry.

Acid-decomposable resin (A) can contain various kinds of repeating structural units besides the above repeating structural units for the purpose of adjusting dry etching resistance, aptitude for standard developers, adhesion to a substrate, resist profile, and in addition to these characteristics, general requisite characteristics of resists, e.g., resolution, heat resistance and sensitivity.

As these repeating structural units, the repeating structural units corresponding to monomers shown below can be exemplified, but the invention is not restricted thereto.

By containing such various repeating structural units, fine adjustment of performances required of the resin of component (A), in particular the following performances, becomes possible, that is,
(1) Solubility in a coating solvent,
(2) A film-forming property (a glass transition point),
(3) Alkali develop ability,
(4) Decrease of layer thickness (hydrophobic-hydrophilic property, selection of an alkali-soluble group),
(5) Adhesion of an unexposed area to a substrate, and
(6) Dry etching resistance.

The examples of such monomers include compounds having one addition polymerizable unsaturated bond selected from acrylic esters, methacrylic esters, acrylamides, methacryl-amides, allyl compounds, vinyl ethers, vinyl esters, etc.

In addition to the aforementioned compounds, addition polymerizable unsaturated compounds copolymerizable with the monomers corresponding to the above various repeating structural units may be used for copolymerization.

In acid-decomposable resin (A), the molar ratio of the content of each repeating structural unit is arbitrarily set to adjust dry etching resistance, aptitude for standard developers, adhesion to a substrate, and resist profile of a resist, in addition to these characteristics, general requisite characteristics of resists, e.g., resolution, heat resistance and sensitivity.

The content of the repeating structural units on the basis of the monomers of further copolymerizable components in the resin can also be set optionally depending upon the desired performances of resists, and the content is generally preferably 99 mol % or less based on the total of the repeating structural unit having a partial structure containing an alicyclic hydrocarbon represented by any of formulae (pI) to (pVI) and the repeating unit represented by formula (II-AB), more preferably 90 mol % or less, and still more preferably 80 mol % or less.

The contents of the repeating unit having a group having a lactone structure described above and the repeating unit having a group (a hydroxyadamantane structure) represented by formula (IV) are particularly as follows:

On the basis of the total of the repeating structural unit having a partial structure containing an alicyclic hydrocarbon represented by any of formulae (pI) to (pVI) and the repeating unit represented by formula (II-AB), The content of the repeating unit having a group having a lactone structure is preferably from 1 to 70 mol %, and more preferably from 10 to 70 mol %; and The content of the repeating unit having a group represented by formula (IV) is preferably from 1 to 70 mol %, and more preferably from 1 to 50 mol %.

When the composition according to the invention is a composition for ArF exposure, it is preferred that the resin should not contain an aromatic group from the point of the transparency to ArF ray.

Acid-decomposable resin (A) can be synthesized according to ordinary methods (e.g., radical polymerization). For example, as ordinary methods, a monomer seed is put in a reaction vessel at a time or in parts during the course of the reaction, and according to necessity the monomer is dissolved in a reaction solvent such as ethers, e.g., tetrahydrofuran, 1,4-dioxane or diisopropyl ether, ketones, e.g., methyl ethyl ketone or methyl isobutyl ketone, an ester solvent, e.g., ethyl acetate, or the later-described solvents capable of dissolving the composition of the invention, e.g., propylene glycol monomethyl ether acetate, to make the monomer homogeneous. The solution is then heated, if necessary, under the inert gas atmosphere such as nitrogen or argon, and polymerization is initiated with commercially available radical polymerization initiators (e.g., azo initiators, peroxide and the like). If necessary, the initiator is further added at a time or in parts, and after completion of the reaction, the reaction system is put in a solvent, and the desired polymer is recovered as powder or solid. The reaction concentration is generally 20 mass % or more, preferably 30 mass % or more, and more preferably 40 mass % or more. The reaction temperature is from 10 to 150° C., preferably from 30 to 120° C., and more preferably from 50 to 100° C.

These repeating structural units may be used alone, or a plurality of repeating units may be used as mixture. Further, resins may be used alone, or a plurality of resins may be used as mixture in the invention.

The weight average molecular weight of acid-decomposable resin (A) is preferably from 1,000 to 200,000 as the polystyrene equivalent by the GPC method, more preferably from 3,000 to 20,000. By making the weight average molecular weight 1,000 or more, heat resistance and dry etching resistance can be improved, and by making the weight average molecular weight 200,000 or less, developability can be improved, and the viscosity becomes low, so that film-forming property can be heightened.

Acid-decomposable resin (A) having molecular weight distribution (Mw/Mn, also referred to as degree of dispersion) of generally from 1 to 5, preferably from 1 to 4, and more preferably from 1 to 3, is used. The molecular weight distribution of 5 or less is preferred from the aspects of resolution, resist configuration, the sidewall of the resist pattern and roughness properties.

In a positive resist composition in the invention, the blending amount of the acid-decomposable resin is preferably from 40 to 99.99 mass % in all the solids content of the resist, and more preferably from 50 to 99.97 mass %.

(B) Compounds Capable of Generating an Acid Upon Irradiation with Actinic Ray or Radiation:

Compounds capable of generating an acid upon irradiation with an actinic ray or radiation (hereinafter referred to as "PAG" in some cases) used in a positive resist composition for immersion exposure in the invention are described below.

PAG used in a positive resist composition for immersion exposure in the invention is a compound capable of generating an acid (hereinafter sometimes referred to as "a generated acid") upon irradiation with actinic ray or radiation that satisfies the conditions of V≥230 and V/S≤0.93 of van der Waals (hereinafter sometimes abbreviated to "VDW") volume V ($Å^3$) and van der Waals surface area S ($Å^2$).

VDW volume V and VDW surface area S described in the specification of the invention are defined as the values computed on the basis of the definite procedure shown below. In the first place, the molecular structure of a generated acid of object is optimized by molecular dynamics (parameter for use is MM3). Subsequently, the generated acid of object is further optimized by a semiempirical orbital method (parameter for use is PM5), and VDW volume and VDW surface area are computed with the semiempirical orbital method (parameter for use is also PM5) at the same time.

As a result of eager studies, the present inventors found the following facts, thus the invention was achieved. That is, for restraining the elution of the acid generator and generated acid used in a resist for immersion exposure into an immersion liquid, it is necessary to make the generated acid hydrophobic, and to enlarge the VDW volume of the generated acid is effective in the hydrophobitization of the generated acid. Specifically, the elution can be restrained to a degree of not causing a damage to the lens of an exposing apparatus by bringing the VDW volume of the generated acid into the range of preferably V≥230, more preferably 800≥V≥230, still more preferably 700≥V≥300, and particularly preferably 650≥V≥400.

On the other hand, simple enlargement of the VDW volume for the purpose of elution restraint of the generated acid results in the excessive hydrophobitization of the generated acid, and development defect attributable to the acid generator is liable to increase. In the invention, the occurrence of development defect can be inhibited while restraining the elution of a generated acid by enlarging the VDW surface area, even with the same degree of the VDW volume. Specifically, it is effective to make the value V/S obtained by dividing VDW volume V by VDW surface area S as follows: V/S≤0.93, preferably 0.80≤V/S≤0.90, and more preferably 0.81≤V/S≤0.89.

The requisite of the invention of V/S≤0.93, that is, lessening the volume per a unit surface area of a generated acid means to make the molecular form of the generated acid long and narrow. As an example, three kinds of figures each having a volume of 1,000 in common as shown in FIG. 1 are considered. At this time, since a rectangular parallelepiped (1) that has a long and narrow form can take a relatively broad surface area, V/S thereof is a small value. On the other hand, the more rounded the shape, such as a cube (2) and a sphere (3), the smaller is the surface area and the greater is the V/S value even if the volume is the same.

It is thought that when a generated acid (or the anion site of an acid generator) is eluted into an alkali developer or pure water during the developing process and the rinsing process of a resist film, the longer and narrower the shape (the smaller is the V/S), the easier is the steric formation of micelle that is relatively stable in water, so that development defect hardly occurs. Contrary to this, the more rounded the shape (the larger is the V/S), the harder is the steric formation of micelle relatively stable in water, so that agglomerates (reverse micelle) unstable in water are liable to be formed. It is thought that these agglomerates are precipitated to thereby increase development defect.

PAG used in a positive resist composition for immersion exposure in the invention are not especially restricted so long as they are capable of generating an acid satisfying the above requisites upon irradiation with actinic ray or radiation, but it is preferred to use a sulfonium salt compound having an alkyl or cycloalkyl residue having 2 or more carbon atoms not substituted with fluorine at the anion site (hereinafter also referred to as "Yc group").

Here, the alkyl or cycloalkyl residue means a group having a straight chain or branched alkyl or cycloalkyl structure. For satisfying the condition of V/S≤0.93, the group is preferably a group having a straight chain or branched alkyl structure, and a group having a straight chain alkyl structure is especially preferred. Further, for satisfying V≥230, the number of carbon atoms of the alkyl or cycloalkyl residue is preferably 4 or more, more preferably 6 or more, and especially preferably 8 or more. As the examples of the alkyl or cycloalkyl residues, an alkyl group, a cycloalkyl group, an alkoxyl group, an alkoxycarbonyl group, an alkylthio group, a cycloalkylthio group, an acylamino group, an oxoalkyl group, an oxocycloalkyl group, an alkylsulfonyloxy group, a cycloalkylsulfonyloxy group, an alkylsulfonyl group, a cycloalkylsulfonyl group, an alkylsulfonylamino group, a cycloalkylsulfonylamino group, an alkylaminosulfonyl group, a cycloalkylaminosulfonyl group, an alkylaryloxysulfonyl group, a cycloalkylaryloxysulfonyl group, an alkyloxycarbonylaryloxysulfonyl group, a cycloalkyloxycarbonylaryloxysulfonyl group, an alkyloxyarylalkoxy group, a cycloalkyloxyarylalkoxy group, etc., are preferably exemplified. Further, divalent or trivalent linking groups obtained by removing the hydrogen atoms of these alkyl or cycloalkyl residues are also included in the alkyl or cycloalkyl residues.

The examples of Yc groups include alkyl groups or cycloalkyl groups, e.g., an ethyl group, an isopropyl group, an n-butyl group, an isobutyl group, a t-butyl group, an n-pentyl group, a cyclopentyl group, a neopentyl group, a t-amyl group, an n-hexyl group, a cyclohexyl group, an n-octyl group, an n-dodecyl group, an n-hexadecyl group, an n-octadecyl group, a 2-ethylhexyl group, an adamantyl group, a norbornyl group, a menthyl group, an adamantylmethyl group, an adamantylethyl group, a cyclohexylethyl group, etc.; alkoxyl groups, e.g., an ethoxy group, an isopropoxy group, an n-butoxy group, an isobutoxy group, a t-butoxy group, an n-pentyloxy group, a cyclopentyloxy group, a neopentyloxy group, a t-amyloxy group, an n-hexyloxy group, a cyclohexyloxy group, an n-octyloxy group, an n-dodecyloxy group, an n-hexadecyloxy group, an n-octadecyloxy group, a 2-ethylhexyloxy group, an adamantyloxy group, a norbornyloxy group, a methyloxy group, an adamantylmethoxy group, an adamantylethoxy group, a cyclohexylethoxy group, etc.;

alkoxycarbonyl groups obtained by linking the above alkoxyl groups to a carbonyl group; alkylthio groups or cycloalkylthio groups obtained by substituting the oxygen atoms of the above alkoxyl groups with a sulfur atom; oxoalkyl groups or oxocycloalkyl groups obtained by substituting an oxo group on arbitrary positions of the above alkyl groups or cycloalkyl groups; acylamino groups obtained by linking the above alkyl groups or cycloalkyl groups to a —C(=O)N(Rx$_1$)— group (where Rx$_1$ represents a hydrogen atom, an alkyl group, or a cycloalkyl group); alkylsulfonyloxy groups or cycloalkylsulfonyloxy groups obtained by linking the above alkyl groups or cycloalkyl groups to an —SO$_2$O— group; alkylsulfonyl groups or cycloalkylsulfonyl groups obtained by linking the above alkyl groups or cycloalkyl groups to an —SO$_2$— group; alkylsulfonylamino groups or cycloalkylsulfonylamino groups obtained by linking the above alkyl groups or cycloalkyl groups to an —SO$_2$N(Rx$_1$)— group; alkylaminosulfonyl groups or cycloalkylaminosulfonyl groups represented by (Rx$_1$)(Rx$_2$)NSO$_2$— (where Rx$_1$ and Rx$_2$ each represents an alkyl or cycloalkyl group having 2 or more carbon atoms not substituted with a fluorine atom, and Rx$_1$ and Rx$_2$ may be bonded to form a monocyclic or polycyclic ring); alkylaryloxysulfonyl groups or cycloalkyl-aryloxysulfonyl groups obtained by linking the above alkyl groups or cycloalkyl groups to an —OSO$_2$— group via an aryl group; alkyloxycarbonylaryloxysulfonyl groups or cycloalkyloxycarbonylaryloxysulfonyl groups obtained by linking the above alkyl groups or cycloalkyl groups to an —OSO$_2$— group via an oxy group, a carbonyl group, or an aryl group; and alkyloxy-arylalkoxy groups or cycloalkyloxyarylalkoxy groups obtained by linking the above alkyl groups or cycloalkyl groups to an alkoxyl group via an oxy group or an aryl group. Yc group may further have a substituent, e.g., an alkoxyl group, a halogenated alkyl group, etc.

As PAG for use in a positive resist composition for immersion exposure in the invention, a sulfonium salt compound comprising a sulfonium cation represented by the following formula (B-1), and an anion represented by the following formula (B-2) or (B-3) can be preferably exemplified.

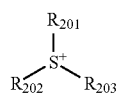
(B-1)

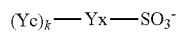
(B-2)

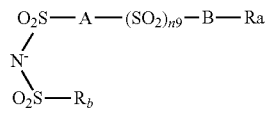
(B-3)

In formula (B-1), R$_{201}$, R$_{202}$ and R$_{203}$ each represents an organic group having from 1 to 30 carbon atoms, and preferably from 1 to 20 carbon atoms. Any two of R$_{201}$ to R$_{203}$ may be bonded to form a cyclic structure, and an oxygen atom, a sulfur atom, an ester bond, an amido bond, or a carbonyl group may be contained in the ring. As the group formed by bonding any two of R$_{201}$ to R$_{203}$, an alkylene group (e.g., a butylene group, a pentylene group) can be exemplified.

As the specific examples of the organic groups represented by R$_{201}$, R$_{202}$ and R$_{203}$, the corresponding groups in the later described cations (B1-1), (B1-2) and (B1-3) can be exemplified.

A cation represented by formula (B-1) may be a cation having a plurality of structures represented by formula (B-1). For instance, a sulfonium cation (B-1) may be a cation having a structure that at least one of R$_{201}$, R$_{202}$ and R$_{203}$ of a cation represented by formula (B-1) is bonded to at least one of R$_{201}$, R$_{202}$ and R$_{203}$ of another cation represented by formula (B-1).

As more preferred cations represented by formula (B-1), cations (B1-1), (B1-2) and (B1-3) described below can be exemplified.

Cation (B1-1) is an arylsulfonium cation wherein at least one of R$_{201}$, R$_{202}$ and R$_{203}$ in formula (B1) represents an aryl group.

All of R$_{201}$, R$_{202}$ and R$_{203}$ of the arylsulfonium cation may be aryl groups, or a part of R$_{201}$, R$_{202}$ and R$_{203}$ may be an aryl group and the remainder may be an alkyl group or a cycloalkyl group.

As the arylsulfonium cation, e.g., a triarylsulfonium cation, a diarylalkylsulfonium cation, an aryldialkyl-sulfonium cation, a diarylcycloalkylsulfonium cation, and an aryldicycloalkylsulfonium cation are exemplified.

As the aryl groups of the arylsulfonium cation, aryl groups consisting of hydrocarbon, and aryl groups comprising hetero atoms, e.g., a nitrogen atom, a sulfur atom, and an oxygen atom are exemplified. As the aryl groups consisting of hydrocarbon, a phenyl group and a naphthyl group are preferred, and a phenyl group is more preferred. As the heteroaryl groups, e.g., a pyrrole group, an indole group, a carbazole group, a furan group, a thiophene group, etc., are exemplified, and an indole group is preferred. When the arylsulfonium cation has two or more aryl groups, these two or more aryl groups may be the same or different.

The alkyl group that the arylsulfonium cation has according to necessity is preferably a straight chain or branched alkyl group having from 1 to 15 carbon atoms, e.g., a methyl group, an ethyl group, a propyl group, an n-butyl group, a sec-butyl group, and a t-butyl group can be exemplified.

The cycloalkyl group that the arylsulfonium cation has according to necessity is preferably a cycloalkyl group having from 3 to 15 carbon atoms, e.g., a cyclopropyl group, a cyclobutyl group and a cyclohexyl group can be exemplified.

The aryl group, alkyl group and cycloalkyl group represented by R$_{201}$, R$_{202}$ and R$_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain, branched, or cyclic alkoxyl group having from 1 to 12 carbon atoms, and the especially preferred substituents are an alkyl group having from 1 to 4 carbon atoms and an alkoxyl group having from 1 to 4 carbon atoms. The substituent may be substituted on any one of three of R$_{201}$, R$_{202}$ and R$_{203}$, or may be substituted on all of the three. When R$_{201}$, R$_{202}$ and R$_{203}$ each represents an aryl group, it is preferred that the substituent be substituted on the p-position of the aryl group.

Cation (B1-2) is described below.

Cation (B1-2) is a cation in the case where R$_{201}$, R$_{202}$ and R$_{203}$ in formula (B-1) each represents an organic group not having an aromatic ring. The aromatic ring here also includes an aromatic ring containing a hetero atom.

The organic group not having an aromatic ring represented by R$_{201}$, R$_{202}$ and R$_{203}$ generally has from 1 to 30 carbon atoms, and preferably from 1 to 20 carbon atoms.

$R_{201}$, $R_{202}$ and $R_{203}$ each preferably represents an alkyl group, a cycloalkyl group, an allyl group, or a vinyl group, more preferably represents a straight chain or branched 2-oxoalkyl group, a 2-oxocycloalkyl group, or an alkoxycarbonylmethyl group, and especially preferably a straight chain or branched 2-oxoalkyl group.

The alkyl group represented by $R_{201}$, $R_{202}$ and $R_{203}$ is preferably a straight chain or branched alkyl group having from 1 to 10 carbon atoms, e.g., a methyl group, an ethyl group, a propyl group, a butyl group, and a pentyl group can be exemplified. As the alkyl group represented by $R_{201}$, $R_{202}$ and $R_{203}$, more preferably a 2-oxoalkyl group and an alkoxycarbonyl-methyl group can be exemplified.

The cycloalkyl group represented by $R_{201}$, $R_{202}$ and $R_{203}$ is preferably a cycloalkyl group having from 3 to 10 carbon atoms, e.g., a cyclopentyl group, a cyclohexyl group and a norbonyl group can be exemplified. As the cycloalkyl group represented by $R_{201}$, $R_{202}$ and $R_{203}$, more preferably a 2-oxocycloalkyl group can be exemplified.

As the 2-oxoalkyl group and the 2-oxocycloalkyl group represented by $R_{201}$, $R_{202}$ and $R_{203}$, preferably a group having >C=O at the 2-position of the above alkyl group and the cycloalkyl group can be exemplified.

As the alkoxyl group in the alkoxycarbonylmethyl group represented by $R_{201}$, $R_{202}$ and $R_{203}$, preferably an alkoxyl group having from 1 to 5 carbon atoms (e.g., a methoxy group, an ethoxy group, a propoxy group, a butoxy group, and a pentoxy group) can be exemplified.

$R_{201}$, $R_{202}$ and $R_{203}$ may further be substituted with a halogen atom, an alkoxyl group (e.g., an alkoxyl group having from 1 to 5 carbon atoms), a hydroxyl group, a cyano group, or a nitro group.

Cation (B1-3) is a phenacylsulfonium cation represented by the following formula (B1-3).

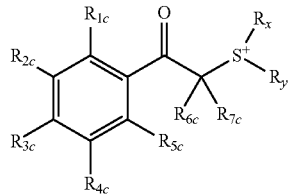

(B1-3)

In formula (B1-3), $R_{1c}$, $R_{2c}$, $R_{3c}$, $R_{4c}$ and $R_{5c}$ each represents a hydrogen atom, an alkyl group, a cycloalkyl group, an alkoxyl group, or a halogen atom.

$R_{6c}$ and $R_{7c}$ each represents a hydrogen atom, an alkyl group or a cycloalkyl group.

Rx and Ry each represents an alkyl group, a cycloalkyl group, an allyl group, or a vinyl group.

Any two or more of $R_{1c}$ to $R_{5c}$, $R_{6c}$ and $R_{7c}$, and Rx and Ry may be respectively bonded to each other to form a cyclic structure, and an oxygen atom, a sulfur atom, an ester bond or an amido bond may be contained in these rings. As the groups formed by bonding any two or more of $R_{1c}$ to $R_{5c}$, $R_{6c}$ and $R_{7c}$, and Rx and Ry, a butylene group and a pentylene group can be exemplified.

The alkyl group represented by $R_{1c}$ to $R_{7c}$ is preferably a straight chain or branched alkyl group having from 1 to 20 carbon atoms, e.g., a methyl group, an ethyl group, a straight chain or branched propyl group, a straight chain or branched butyl group, and a straight chain or branched pentyl group can be exemplified.

The cycloalkyl group represented by $R_{1c}$ to $R_{7c}$ is preferably a cycloalkyl group having from 3 to 8 carbon atoms, e.g., a cyclopentyl group and a cyclohexyl group can be exemplified.

The alkoxyl group represented by $R_{1c}$ to $R_{5c}$ may be any of straight chain, branched, or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, a straight chain or branched pentoxy group), a cyclic alkoxyl group having from 3 to 8 carbon atoms (e.g., a cyclopentyloxy group, a cyclohexyloxy group) can be exemplified.

Preferably any of $R_{1c}$ to $R_{5c}$ represents a straight chain or branched alkyl group, a cycloalkyl group, or a straight chain, branched, or cyclic alkoxyl group, and more preferably the sum total of the carbon atoms of $R_{1c}$ to $R_{5c}$ is from 2 to 15. By selecting such substituents, the solubility in a solvent is improved and the generation of particles during preservation can be restrained.

As the alkyl group represented by Rx and Ry, the same alkyl groups as represented by $R_{1c}$ to $R_{7c}$ can be exemplified, and a 2-oxoalkyl group, and an alkoxycarbonylmethyl group are more preferred.

As the 2-oxoalkyl group, groups having >C=O at the 2-position of the alkyl group represented by $R_{1c}$ to $R_{7c}$ can be exemplified.

As the alkoxyl group in the alkoxycarbonylmethyl group, the same alkoxyl groups as represented by $R_{1c}$ to $R_{5c}$ can be exemplified.

As the cycloalkyl group represented by Rx and Ry, the same cycloalkyl groups as represented by $R_{1c}$ to $R_{7c}$ can be exemplified, and a 2-oxocycloalkyl group is more preferred.

As the 2-oxocycloalkyl group, groups having >C=O at the 2-position of the cycloalkyl group represented by $R_{1c}$ to $R_{7c}$ can be exemplified.

Rx and Ry each preferably represents an alkyl group or a cycloalkyl group having 4 or more carbon atoms, more preferably 6 or more carbon atoms, and still more preferably an alkyl group or a cycloalkyl group having 8 or more carbon atoms.

In formula (B-2), Yx represents an alkyl group, a cycloalkyl group, an aryl group, or a group obtained by bonding these groups via a divalent linking group. Yx may have a substituent, e.g., a halogen atom, a hydroxyl group, an alkyl group, a cycloalkyl group, an alkoxyl group, a nitro group, or a cyano group can be exemplified as preferred substituents; Yc represents a Yc group; and k represents an integer of from 0 to 2.

As the anions represented by formula (B-2), an alkanesulfonate anion in which Yx is an alkyl group substituted with a fluorine atom (preferably a perfluoroalkyl group), and a benzenesulfonate anion in which Yx is a phenyl group substituted with a fluorine atom or a fluoroalkyl group can be preferably exemplified.

As the anions represented by formula (B-2), more preferably sulfonate anions represented by the following formula (B2-a) or (B2-b) can be exemplified.

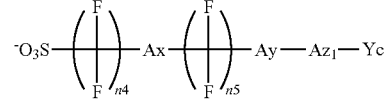

B-2a

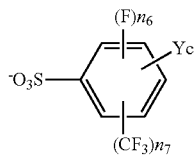

In formulae (B2-a) and (B2-b), Ax represents a single bond or an oxygen atom; Ay represents a single bond, —SO$_2$—, —SO$_3$—, —SO$_2$N(R$_1$)—, —CO$_2$—, an oxygen atom, —C(=O)—, —C(=O)N(R$_1$)—, or an alkylene group; R$_1$ represents a hydrogen atom or an alkyl group (preferably having from 1 to 12 carbon atoms); Az$_1$ represents a single bond, a monocyclic or polycyclic hydrocarbon group, or an aryl group; Yc represents a Yc group, and Yc and R$_1$ may be bonded to form a ring; n4 represents an integer of from 1 to 6; n5 represents an integer of from 1 to 4; n6 represents an integer of from 0 to 4; and n7 represents an integer of from 0 to 4, provided that n6+n7 is an integer of from 1 to 4.

The sulfonate anion represented by formula (B2-a) is especially preferably a sulfonate anion represented by the following formula (X).

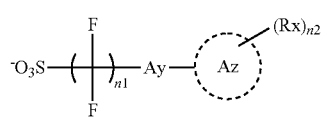

In formula (X), Rx represents an alkyl group, —OR'$_1$, —C(=O)R'$_1$, —C(=O)OR'$_1$, —SO$_2$R'$_1$, or —SO$_3$R'$_1$; Ay represents a single bond, —SO$_2$—, —SO$_3$—, —SO$_2$N(R'$_1$)—, —CO$_2$—, an oxygen atom, —C(=O)—, —C(=O)N(R'$_1$)—, or an alkylene group; R'$_1$ represents a hydrogen atom or an alkyl group; Az represents a monocyclic or polycyclic hydrocarbon group, or an aryl group; n$_1$ represents an integer of from 1 to 4; and n$_2$ represents an integer of from 1 to 4.

The alkyl group represented by Rx and R'$_1$ in formula (X) is preferably a straight chain or branched alkyl group having 6 or more carbon atoms, more preferably 12 or more carbon atoms, and still more preferably a straight chain alkyl group having 12 or more carbon atoms, specifically a hexyl group, a heptyl group, an octyl group, a nonyl group, a 2,6-dimethyl-heptan-4-yl group, a decyl group, an undecyl group, a dodecanyl group, a tridecyl group, a tetradecyl group, a pentadecyl group, a hexadecyl group, a heptadecyl group, and an octadecyl group can be exemplified.

The monocyclic or polycyclic hydrocarbon group represented by Az in formula (X) preferably has 5 or more carbon atoms, specifically a cyclopentane residue, a cyclohexane residue, a norbornane residue, an isobornyl residue, and an adamantane residue can be exemplified.

The aryl group represented by Az in formula (X) preferably has 6 or more carbon atoms, specifically preferably a benzyl residue, or a naphthyl residue.

In formula (B-3), A represents a divalent linking group; B represents a single bond, an oxygen atom, or —N(Rxa)-; Rxa represents a hydrogen atom, an aryl group, an alkyl group, or a cycloalkyl group; Ra represents a monovalent organic group, and when B represents —N(Rxa)-, Ra and Rxa may be bonded to form a ring; Rb represents a monovalent organic group; and n9 represents 0 or 1.

It is preferred that at least any one of A, Rxa, Ra and Rb has a Yc group.

The anion represented by formula (B-3) is preferably an anion represented by the following formula (B3-a).

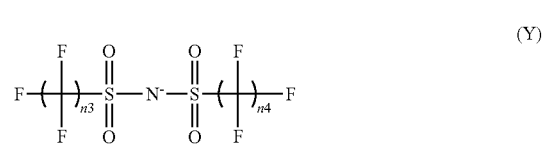

Ax, Ay, Az$_1$, Yc, n4 and n5 in formula (B3-a) respectively have the same meaning as Ax, Ay, Az$_1$, Yc, n4 and n5 in formula (B2-a); Rc represents a hydrogen atom, a fluorine atom, or a Yc group; and n8 represents an integer of from 1 to 4.

The sulfonate anion represented by formula (B3-a) is especially preferably a sulfonate anion represented by the following formula (Y).

$$F{-}{\left(\!\!\begin{array}{c}F\\ |\\ |\\ F\end{array}\!\!\right)}_{\!n3}\!\!\!\!{-}\overset{\overset{\displaystyle O}{\|}}{S}{-}N^-{-}\overset{\overset{\displaystyle O}{\|}}{\underset{\underset{\displaystyle O}{\|}}{S}}{-}{\left(\!\!\begin{array}{c}F\\ |\\ |\\ F\end{array}\!\!\right)}_{\!n4}\!\!\!\!{-}F \qquad (Y)$$

In formula (Y), n3 represents an integer of from 3 to 6, and n4 represents an integer of from 3 to 6.

As the sulfonium cation represented by formula (B-1), the following cations are preferably exemplified.

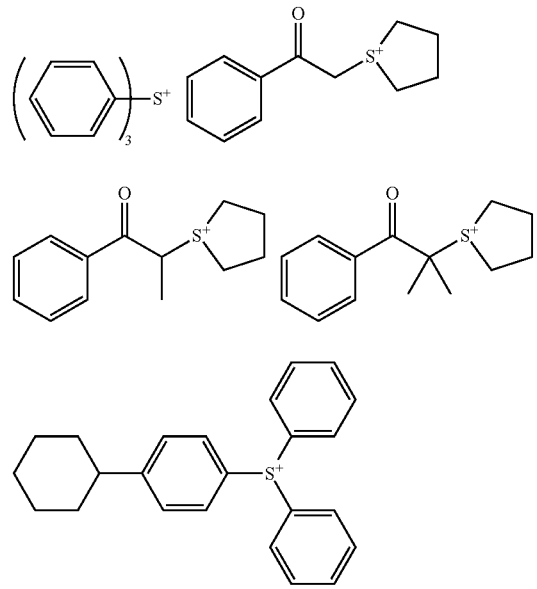

37
-continued
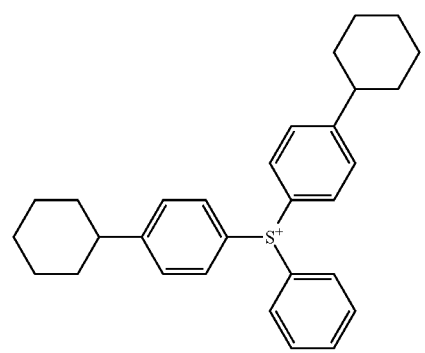
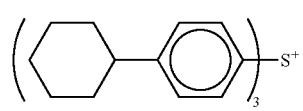
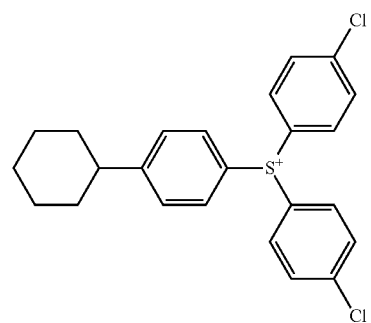
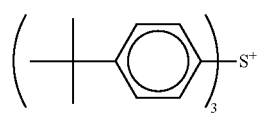
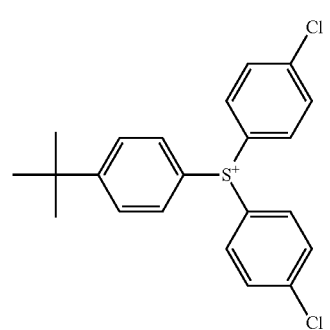
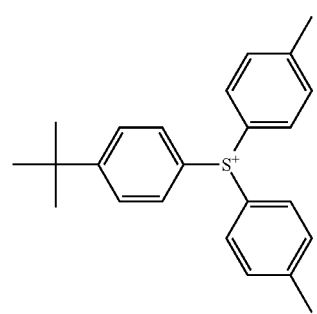
38
-continued
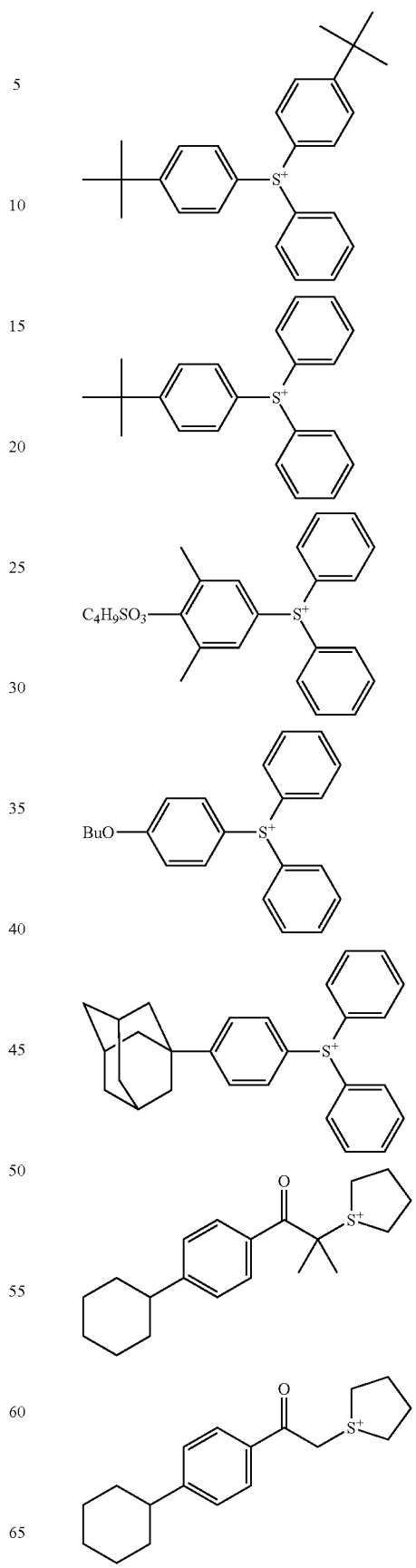

-continued
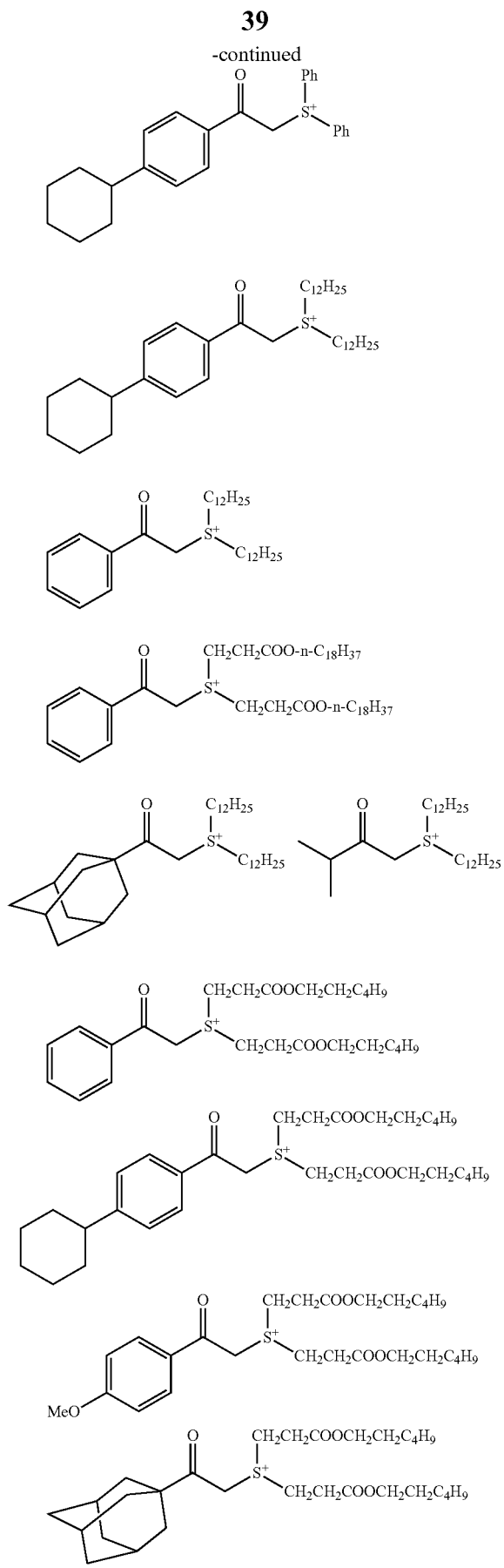
-continued
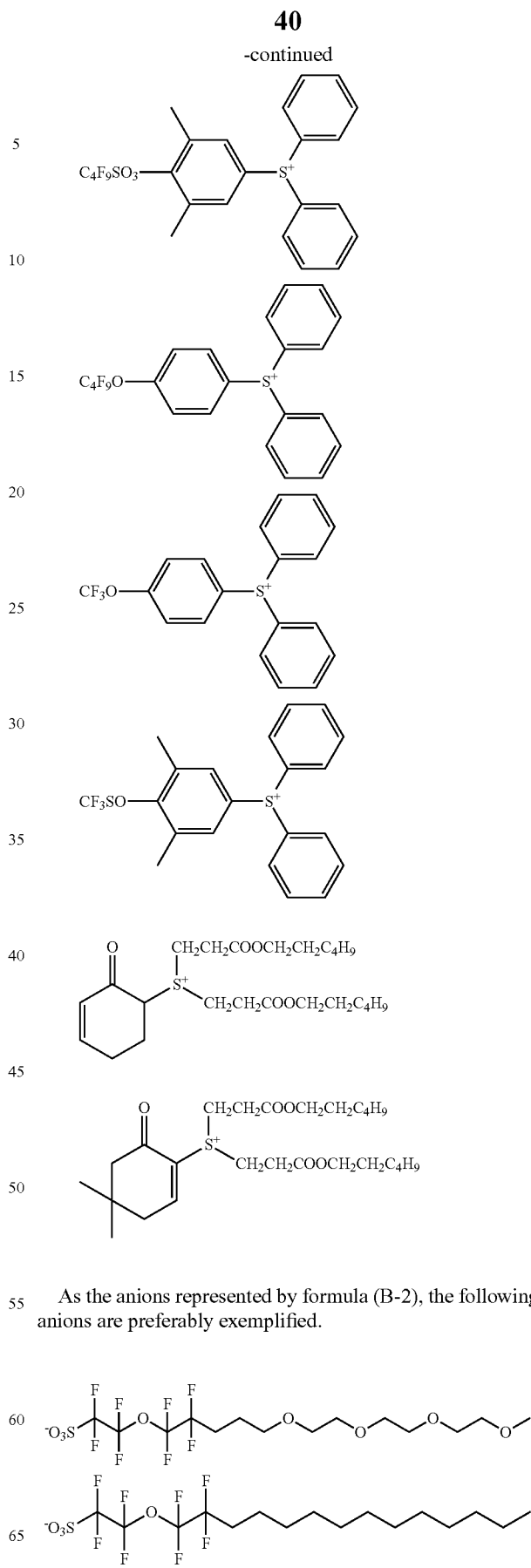
As the anions represented by formula (B-2), the following anions are preferably exemplified.

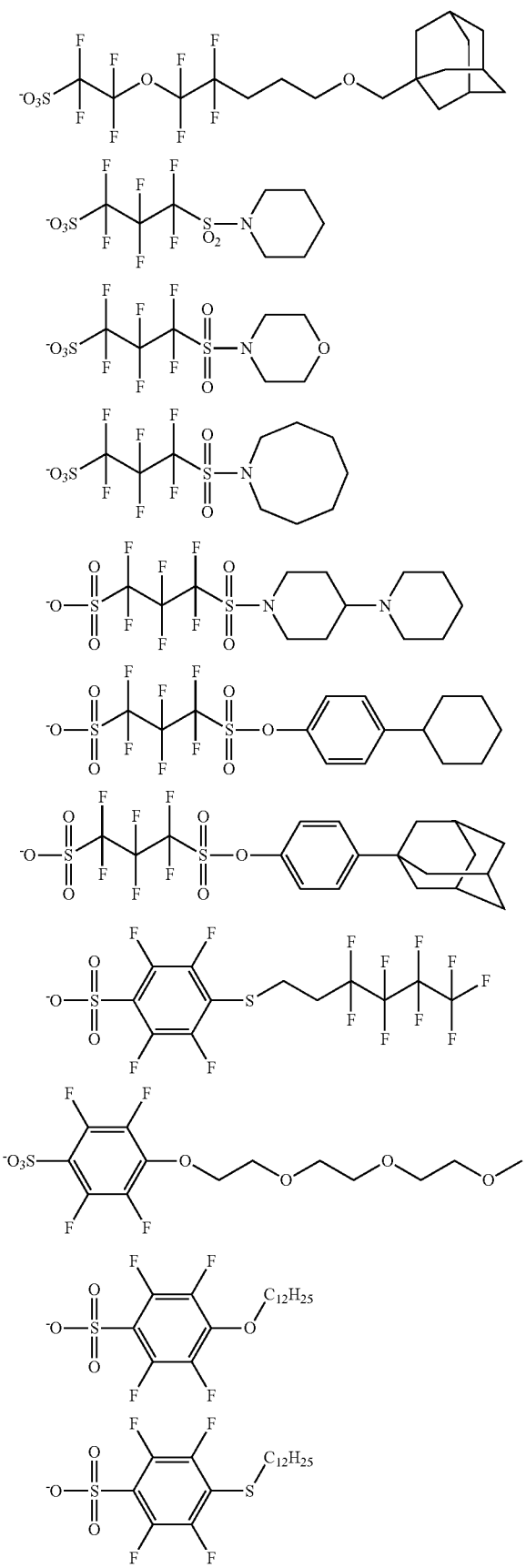
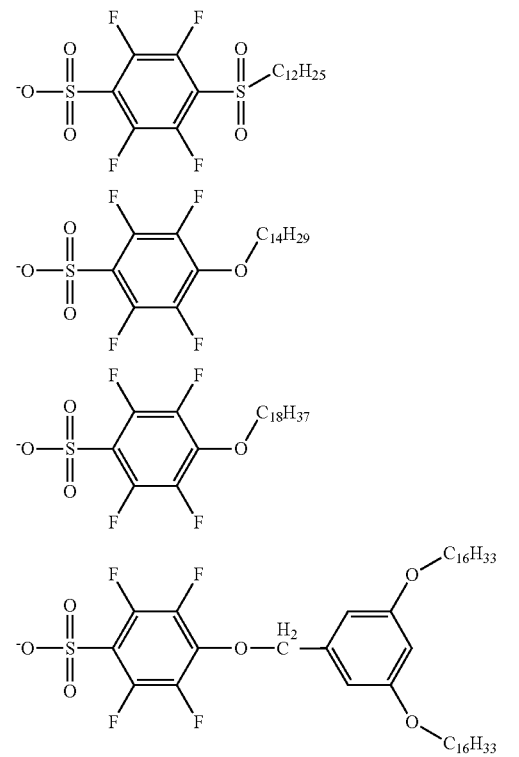
Of the anions represented by formula (B-2), as especially preferred anions represented by formula (X), the following anions are exemplified.
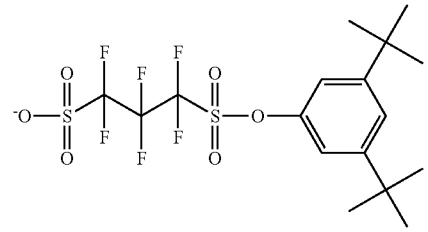
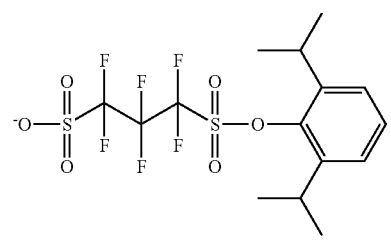
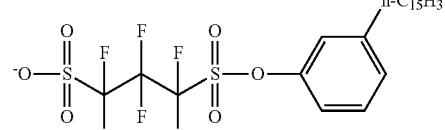
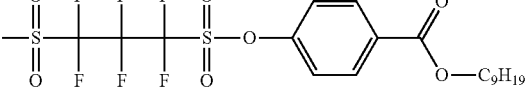

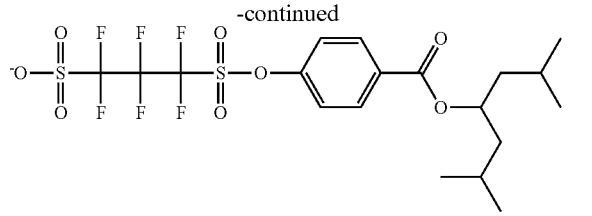
As the anions represented by formula (B-3), the following anions are preferably exemplified.
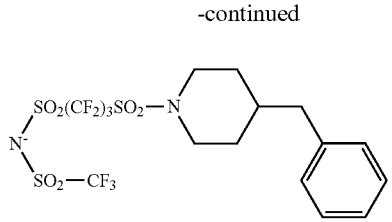
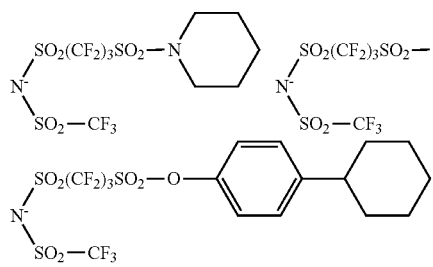
Of the anions represented by formula (B-3), as especially preferred anions represented by formula (Y), the following anions are exemplified.
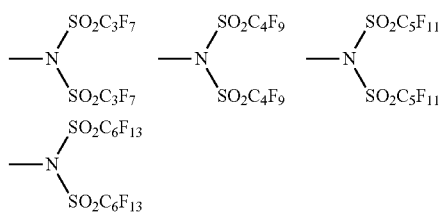
The specific examples of PAG are shown below, but it should not be construed that the invention is restricted to these compounds.
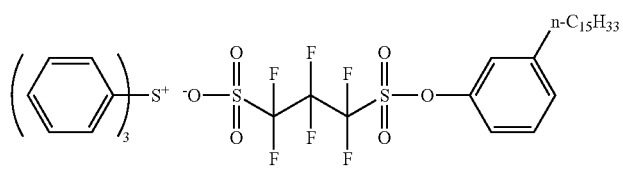
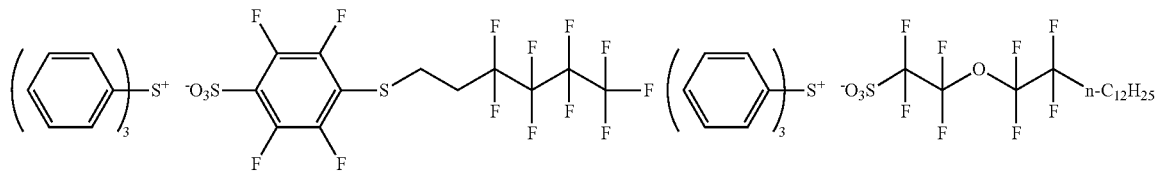
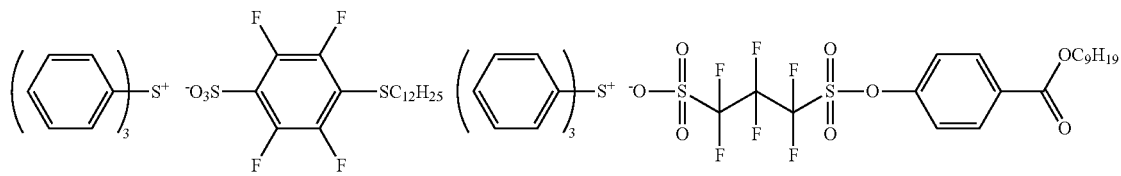

-continued
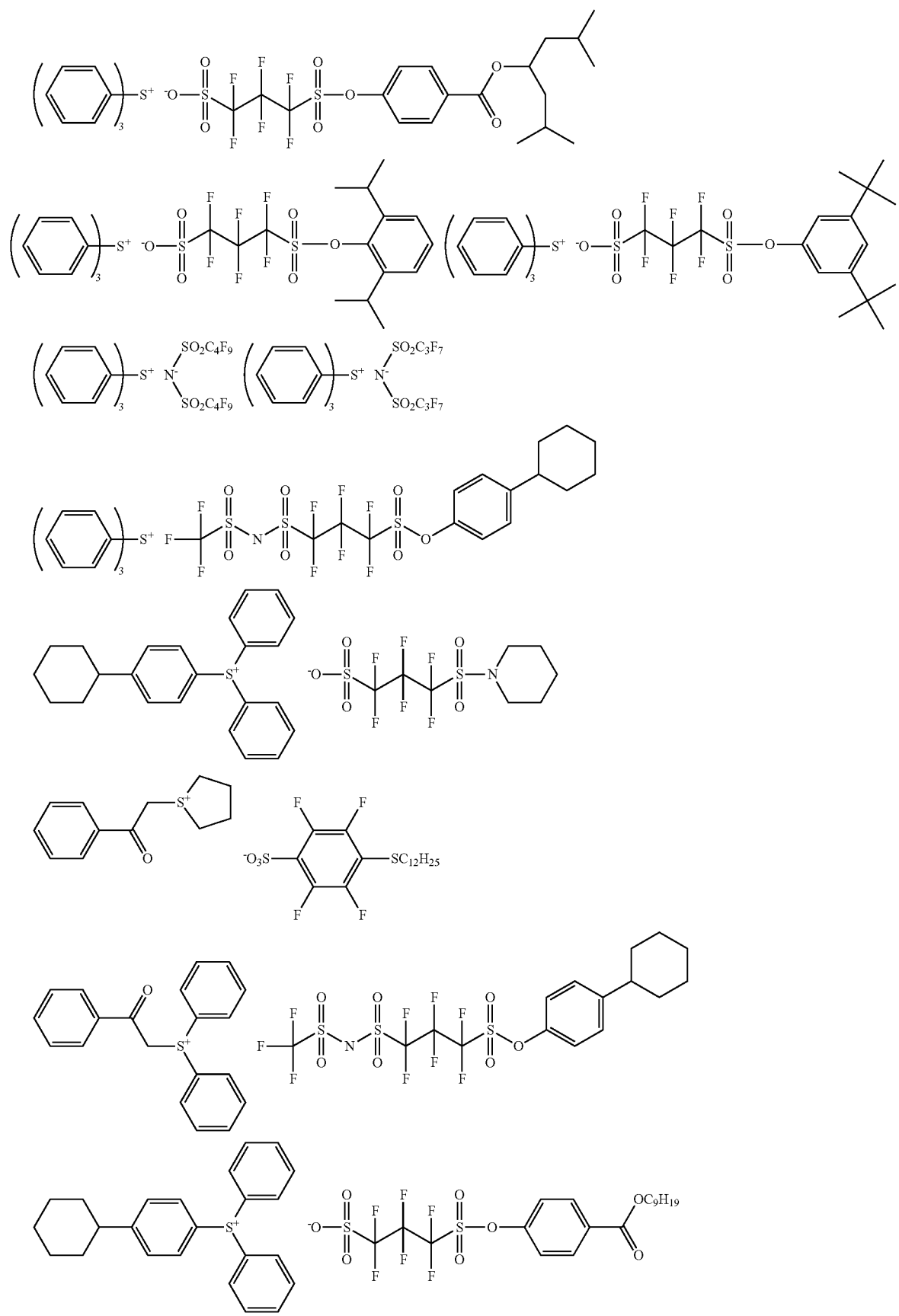

-continued

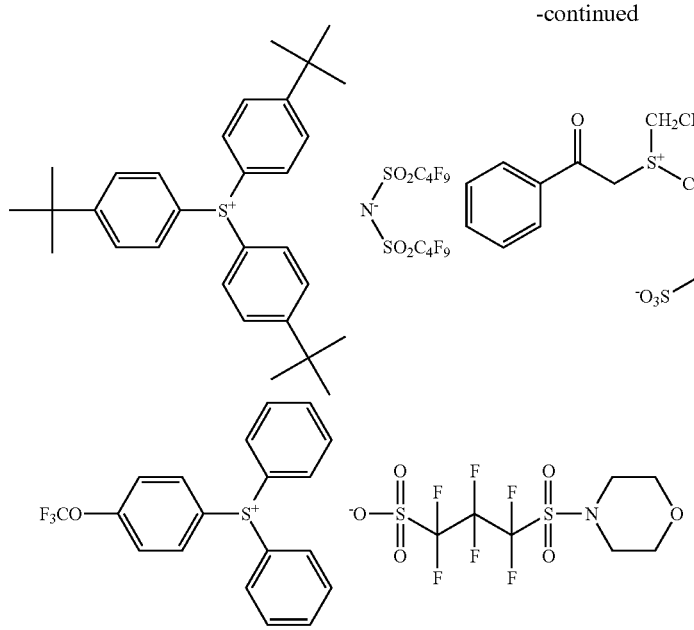

The content of PAG in a positive resist composition for immersion exposure in the invention is preferably from 0.1 to 20 mass % based on the solids content in the composition, more preferably from 0.5 to 10 mass %, and still more preferably from 1 to 7 mass %.

In the invention, in addition to PAG, other compounds capable of generating an acid upon irradiation with actinic ray or radiation can be used. The use amount of these other acid generators usable in combination is generally from 100/0 to 10/90 in a molar ratio of PAG/other acid generators, preferably from 100/0 to 30/70, and more preferably from 100/0 to 50/50.

Such acid generators can be selected from the compounds generally used as acid generators.

That is, photopolymerization initiators of photo-cationic polymerization, photopolymerization initiators of photo-radical polymerization, photo-decoloring agents of dyestuffs, photo-discoloring agents, well-known compounds capable of generating an acid upon irradiation with an actinic ray or a radiation that are used in micro-resist and the like, and the mixtures of these compounds can be optionally used as these acid generators.

For example, diazonium salt, phosphonium salt, sulfonium salt, iodonium salt, imidosulfonate, oximesulfonate, diazodisulfone, disulfone, and o-nitrobenzyl sulfonate are exemplified.

Further, compounds obtained by introducing a group or a compound capable of generating an acid upon irradiation with an actinic ray or a radiation to the main chain or side chain of the polymers, e.g., the compounds disclosed in U.S. Pat. No. 3,849,137, German Patent 3,914,407, JP-A-63-26653 (the term "JP-A" as used herein refers to an "unexamined published Japanese patent application"), JP-A-55-164824, JP-A-62-69263, JP-A-63-146038, JP-A-63-163452, JP-A-62-153853 and JP-A-63-146029 can be used.

The compounds generating an acid by the action of lights disclosed in U.S. Pat. No. 3,779,778, EP-126712 can also be used.

As the compounds capable of decomposing and generating an acid upon irradiation with an actinic ray or a radiation usable in combination, for example, the compounds represented by the following formula (ZI), (ZII) or (ZIII) can be exemplified.

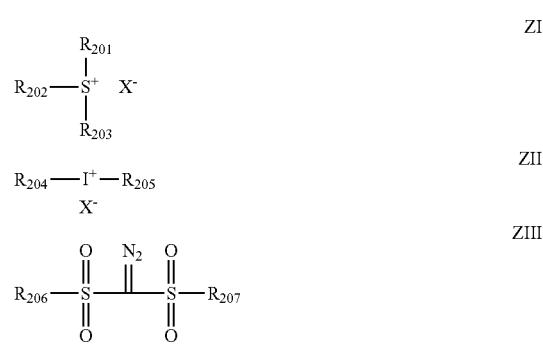

In formula (ZI), $R_{201}$, $R_{202}$ and $R_{203}$ each represents an organic group; and $X^-$ represents a non-nucleophilic anion.

A non-nucleophilic anion is an anion that is extremely low in the property of bringing about a nucleophilic reaction, and capable of restraining the aging decomposition by an intramolecular nucleophilic reaction. The aging stability of a resist can be improved by a non-nucleophilic anion.

As the non-nucleophilic anions represented by $X^-$, e.g., a sulfonate anion, a carboxylate anion, a sulfonylimide anion, a bis(alkylsulfonyl)imide anion, and a tris(alkylsulfonyl)-methyl anion can be exemplified.

As the sulfonate anions, e.g., an aliphatic sulfonate anion and an aromatic sulfonate anion can be exemplified, and a perfluoroalkanesulfonate anion having from 1 to 8 carbon atoms which may contain an oxygen atom in the alkyl chain, and a benzenesulfonate anion substituted with a fluorine atom or a fluoroalkyl group are preferred.

As the carboxylate anions, e.g., an aliphatic carboxylate anion, an aromatic carboxylate anion, and an aralkylcarboxylate anion can be exemplified.

The alkyl group, the cycloalkyl group and the aryl group in the above aliphatic sulfonate anion, aromatic sulfonate anion, aliphatic carboxylate anion, and aromatic carboxylate anion may have a substituent.

As the sulfonylimide anion, e.g., a saccharin anion can be exemplified.

The alkyl group in the bis(alkylsulfonyl)imide anion and tris(alkylsulfonyl)methyl anion is preferably an alkyl group having from 1 to 5 carbon atoms, e.g., a methyl group, an ethyl group, a propyl group, an isopropyl group, an n-butyl group, an isobutyl group, a sec-butyl group, a pentyl group and a neopentyl group can be exemplified. These alkyl groups may have a substituent, e.g., a halogen atom, an alkyl group substituted with a halogen atom, an alkoxyl group, and an alkylthio group can be exemplified as the substituents, and an alkyl group substituted with a fluorine atom is preferred.

As other non-nucleophilic anions, e.g., fluorinated phosphorus, fluorinated boron and fluorinated antimony can be exemplified.

As the non-nucleophilic anions represented by $X^-$, an aliphatic sulfonate anion in which the α-position of the sulfonic acid is substituted with a fluorine atom, an aromatic sulfonate anion substituted with a fluorine atom or a group having a fluorine atom, bis(alkylsulfonyl)imide anion in which the alkyl group is substituted with a fluorine atom, and a tris(alkylsulfonyl)methide anion in which the alkyl group is substituted with a fluorine atom are preferred. Particularly preferred non-nucleophilic anions are a perfluoroalkanesulfonate anion having from 4 to 8 carbon atoms and a benzene-sulfonate anion having a fluorine atom, and the most preferred non-nucleophilic anions are a nonafluorobutanesulfonate anion, a perfluorooctanesulfonate anion, a pentafluorobenzene-sulfonate anion and a 3,5-bis(trifluoromethyl)benzene-sulfonate anion.

The number of carbon atoms of the organic groups represented by $R_{201}$, $R_{202}$ and $R_{203}$ is generally from 1 to 30, and preferably from 1 to 20.

Any two of $R_{201}$, $R_{202}$ and $R_{203}$ may be bonded to each other to form a cyclic structure, and an oxygen atom, a sulfur atom, an ester bond, an amido bond or a carbonyl group may be contained in the ring.

As the group formed by bonding any two of $R_{201}$, $R_{202}$ and $R_{203}$, an alkylene group (e.g., a butylene group and a pentylene group) can be exemplified.

As the specific examples of the organic groups represented by $R_{201}$, $R_{202}$ and $R_{203}$, the corresponding groups in compounds (ZI-1), (ZI-2) and (ZI-3) described later can be exemplified.

A compound represented by formula (ZI) may be a compound having a plurality of structures represented by formula (ZI). For instance, a compound represented by formula (ZI) may be a compound having a structure that at least one of $R_{201}$, $R_{202}$ and $R_{203}$ of a compound represented by formula (ZI) is bonded to at least one of $R_{201}$, $R_{202}$ and $R_{203}$ of another compound represented by formula (ZI).

The following compounds (ZI-1), (ZI-2) and (ZI-3) can be exemplified as more preferred compound represented by formula (ZI).

Compound (ZI-1) is an arylsulfonium compound in which at least one of $R_{201}$, $R_{202}$ and $R_{203}$ in formula (ZI) represents an aryl group, that is, a compound having arylsulfonium as the cation.

All of $R_{201}$, $R_{202}$ and $R_{203}$ of the arylsulfonium compound may be aryl groups, or a part of $R_{201}$, $R_{202}$ and $R_{203}$ may be an aryl group and the remainder may be an alkyl group or a cycloalkyl group.

As the arylsulfonium compound, e.g., a triarylsulfonium compound, a diarylalkylsulfonium compound, an aryldialkyl-sulfonium compound, a diarylcycloalkylsulfonium compound, and an aryldicycloalkylsulfonium compound can be exemplified.

As the aryl group of the arylsulfonium compound, an aryl group consisting of hydrocarbon, and a heteroaryl group having a hetero atom, such as a nitrogen atom, a sulfur atom, or an oxygen atom are exemplified. As the aryl groups consisting of hydrocarbon, a phenyl group and a naphthyl group are preferred, and more preferably a phenyl group. As the heteroaryl groups, e.g., a pyrrole group, an indole group, a carbazole group, a furan group, a thiophene group, etc., are exemplified, and an indole group is preferred. When the arylsulfonium compound has two or more aryl groups, these two or more aryl groups may be the same or different.

The alkyl group that the arylsulfonium compound has according to necessity is preferably a straight chain or branched alkyl group having from 1 to 15 carbon atoms, e.g., a methyl group, an ethyl group, a propyl group, an n-butyl group, a sec-butyl group, and a t-butyl group can be exemplified.

The cycloalkyl group that the arylsulfonium compound has according to necessity is preferably a cycloalkyl group having from 3 to 15 carbon atoms, e.g., a cyclopropyl group, a cyclobutyl group and a cyclohexyl group can be exemplified.

The aryl group, alkyl group and cycloalkyl group represented by $R_{201}$, $R_{202}$ and $R_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain, branched, or cyclic alkoxyl group having from 1 to 12 carbon atoms, and the especially preferred substituents are an alkyl group having from 1 to 4 carbon atoms and an alkoxyl group having from 1 to 4 carbon atoms. The substituent may be substituted on any one of three of $R_{201}$, $R_{202}$ and $R_{203}$, or may be substituted on all of the three. When $R_{201}$, $R_{202}$ and $R_{203}$ each represents an aryl group, it is preferred that the substituent be substituted on the p-position of the aryl group.

Compound (ZI-2) is described below.

Compound (ZI-2) is a compound in the case where $R_{201}$, $R_{202}$ and $R_{203}$ in formula (ZI) each represents an organic group not having an aromatic ring. The aromatic ring here also includes an aromatic ring containing a hetero atom.

The organic group not having an aromatic ring represented by $R_{201}$, $R_{202}$ and $R_{203}$ generally has from 1 to 30 carbon atoms, and preferably from 1 to 20 carbon atoms.

$R_{201}$, $R_{202}$ and $R_{203}$ each preferably represents an alkyl group, a cycloalkyl group, an allyl group, or a vinyl group, more preferably represents a straight chain or branched 2-oxoalkyl group, a 2-oxocycloalkyl group, or an alkoxycarbonylmethyl group, and especially preferably a straight chain or branched 2-oxoalkyl group.

The alkyl group represented by $R_{201}$, $R_{202}$ and $R_{203}$ is preferably a straight chain or branched alkyl group having from 1 to 10 carbon atoms, e.g., a methyl group, an ethyl group, a propyl group, a butyl group, and a pentyl group can be exemplified. As the alkyl group represented by $R_{201}$, $R_{202}$ and $R_{203}$, more preferably a straight chain or branched 2-oxoalkyl group, and an alkoxycarbonylmethyl group can be exemplified.

The cycloalkyl group represented by $R_{201}$, $R_{202}$ and $R_{203}$ is preferably a cycloalkyl group having from 3 to 10 carbon atoms, e.g., a cyclopentyl group, a cyclohexyl group and a norbonyl group can be exemplified. As the cycloalkyl group represented by $R_{201}$, $R_{202}$ and $R_{203}$, more preferably a 2-oxocycloalkyl group can be exemplified.

As the 2-oxoalkyl group and the 2-oxocycloalkyl group represented by $R_{201}$, $R_{202}$ and $R_{203}$, preferably a group having $>C=O$ at the 2-position of the above alkyl group and the cycloalkyl group can be exemplified.

As the alkoxyl group in the alkoxycarbonylmethyl group represented by $R_{201}$, $R_{202}$ and $R_{203}$, preferably an alkoxyl group having from 1 to 5 carbon atoms (e.g., a methoxy group, an ethoxy group, a propoxy group, a butoxy group, and a pentoxy group) can be exemplified.

$R_{201}$, $R_{202}$ and $R_{203}$ may further be substituted with a halogen atom, an alkoxyl group (e.g., an alkoxyl group having from 1 to 5 carbon atoms), a hydroxyl group, a cyano group, or a nitro group.

Compound (ZI-3) is a compound represented by the following formula (ZI-3) and has a phenacylsulfonium salt structure.

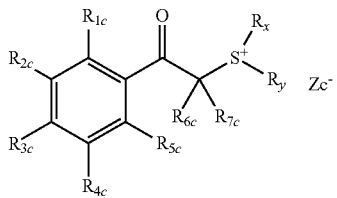

(ZI-3)

In formula (ZI-3), $R_{1c}$, $R_{2c}$, $R_{3c}$, $R_{4c}$ and $R_{5c}$ each represents a hydrogen atom, an alkyl group, a cycloalkyl group, an alkoxy group, or a halogen atom.

$R_{6c}$ and $R_{7c}$ each represents a hydrogen atom, an alkyl group or a cycloalkyl group.

Rx and Ry each represents an alkyl group, a cycloalkyl group, an aryl group, or a vinyl group.

Any two or more of $R_{1c}$ to $R_{5c}$, $R_{6c}$ and $R_{7c}$, and Rx and Ry may be bonded to each other to form cyclic structures, respectively, and the cyclic structures may contain an oxygen atom, a sulfur atom, an ester bond, or an amido bond. As the groups formed by any two or more of $R_{1c}$ to $R_{5c}$, $R_{6c}$ and $R_{7c}$, and Rx and Ry, a butylene group, a pentylene group, etc., can be exemplified.

$Z_c^-$ represents a non-nucleophilic anion, and the same non-nucleophilic anions as represented by $X^-$ in formula (ZI) can be exemplified.

The alkyl group represented by $R_{1c}$ to $R_{7c}$ is preferably a straight chain or branched alkyl group having from 1 to 20 carbon atoms, e.g., a methyl group, an ethyl group, a straight chain or branched propyl group, a straight chain or branched butyl group, and a straight chain or branched pentyl group can be exemplified.

The cycloalkyl group represented by $R_{1c}$ to $R_{7c}$ is preferably a cycloalkyl group having from 3 to 8 carbon atoms, e.g., a cyclopentyl group and a cyclohexyl group can be exemplified.

The alkoxyl group represented by $R_{1c}$ to $R_{5c}$ may be any of straight chain, branched, or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, a straight chain or branched pentoxy group), a cyclic alkoxyl group having from 3 to 8 carbon atoms (e.g., a cyclopentyloxy group, a cyclohexyloxy group) can be exemplified.

Preferably any of $R_{1c}$ to $R_{5c}$ represents a straight chain or branched alkyl group, a cycloalkyl group, or a straight chain, branched, or cyclic alkoxyl group, and more preferably the sum total of the carbon atoms of $R_{1c}$ to $R_{5c}$ is from 2 to 15. By selecting such substituents, the solubility in a solvent is improved and the generation of particles during preservation can be restrained.

As the alkyl group represented by Rx and Ry, the same alkyl groups as represented by $R_{1c}$ to $R_{7c}$ can be exemplified, and a 2-oxoalkyl group, and an alkoxycarbonylmethyl group are more preferred.

As the 2-oxoalkyl group, groups having $>C=O$ at the 2-position of the alkyl group represented by $R_{1c}$ to $R_{7c}$ can be exemplified.

As the alkoxyl group in the alkoxycarbonylmethyl group, the same alkoxyl groups as represented by $R_{1c}$ to $R_{5c}$ can be exemplified.

As the cycloalkyl group represented by Rx and Ry, the same cycloalkyl groups as represented by $R_{1c}$ to $R_{7c}$ can be exemplified, and a 2-oxocycloalkyl group is more preferred.

As the 2-oxocycloalkyl group, groups having $>C=O$ at the 2-position of the cycloalkyl group represented by $R_{1c}$ to $R_{7c}$ can be exemplified.

Rx and Ry each preferably represents an alkyl group or a cycloalkyl group having 4 or more carbon atoms, more preferably 6 or more carbon atoms, and still more preferably an alkyl group or a cycloalkyl group having 8 or more carbon atoms.

In formulae (ZII) and (ZIII), $R_{204}$, $R_{205}$, $R_{206}$ and $R_{207}$ each represents an aryl group, an alkyl group, or a cycloalkyl group.

As the aryl group represented by $R_{204}$ to $R_{207}$, an aryl group consisting of hydrocarbon, and a heteroaryl group having a hetero atom, such as a nitrogen atom, a sulfur atom, or an oxygen atom are exemplified. As the aryl groups consisting of hydrocarbon, a phenyl group and a naphthyl group are preferred, and more preferably a phenyl group. As the heteroaryl groups, e.g., a pyrrole group, an indole group, a carbazole group, a furan group, a thiophene group, etc., are exemplified, and an indole group is preferred.

As the alkyl group represented by $R_{204}$ to $R_{207}$, a straight chain or branched alkyl group having from 1 to 10 carbon atoms is preferred, e.g., a methyl group, an ethyl group, a propyl group, a butyl group, and a pentyl group can be exemplified.

As the cycloalkyl group represented by $R_{204}$ to $R_{207}$, a cycloalkyl group having from 3 to 10 carbon atoms is preferred, e.g., a cyclopentyl group, a cyclohexyl group, a norbonyl group, etc., can be exemplified.

$R_{204}$ to $R_{207}$ may have a substituent. As the substituents that $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group, and a phenylthio group can be exemplified.

$X^-$ represents a non-nucleophilic anion, and the same non-nucleophilic anions as represented by $X^-$ in formula (ZI) can be exemplified.

As compounds capable of generating an acid upon irradiation with actinic ray or radiation that can be used in combination, the compound represented by the following formula (ZIV), (ZV) or (ZVI) can further be exemplified.

ZIV 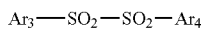

ZV 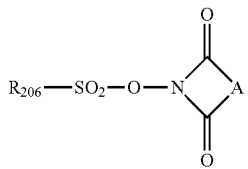

ZVI 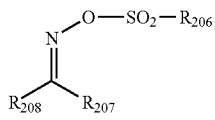

In formulae (ZIV) to (ZVI), $Ar_3$ and $Ar_4$ each represents an aryl group; $R_{206}$, $R_{207}$ and $R_{208}$ each represents an alkyl group, a cycloalkyl group, or an aryl group; and A represents an alkylene group, an alkenylene group, or an arylene group.

$Ar_3$, $Ar_4$, $R_{206}$, $R_{207}$, $R_{208}$ and A may have a substituent.

Of the compounds capable of generating an acid upon irradiation with actinic ray or radiation that can be used in combination, more preferred compounds are the compounds represented by formula (ZI), (ZII) or (ZIII).

Of the compounds capable of generating an acid upon irradiation with actinic ray or radiation that can be used in combination, the examples of especially preferred compounds are shown below.

(z1) 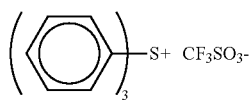

(z2) 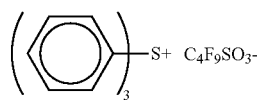

(z3) 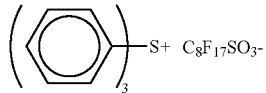

(z4) 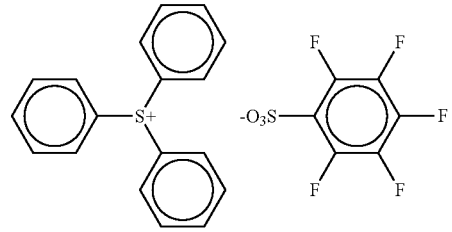

(z5) 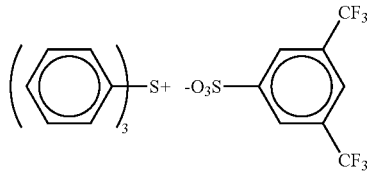

(z6) 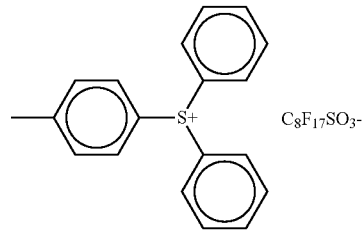

(z7) 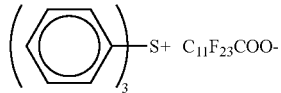

(z8) 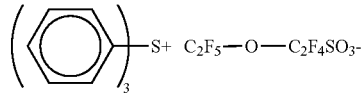

(z9) 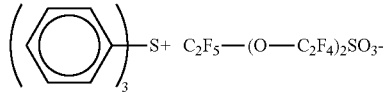

(z10) 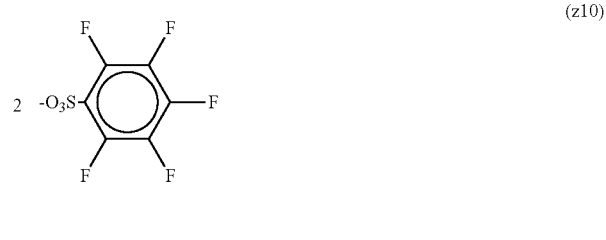

-continued
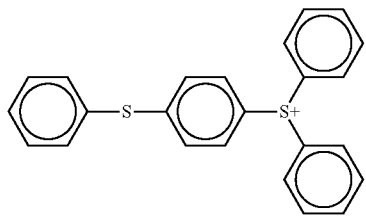 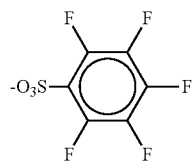
(z11)
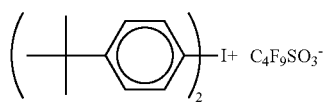
(z12)
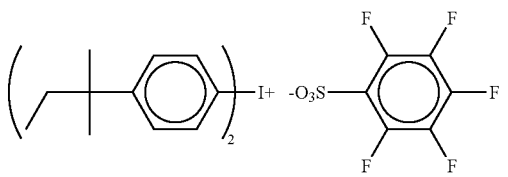
(z13)
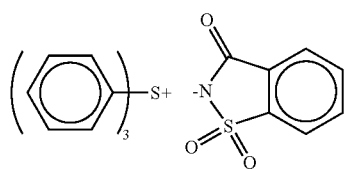
(z14)
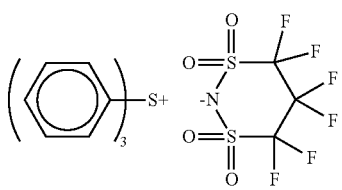
(z15)
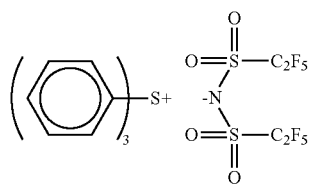
(z16)
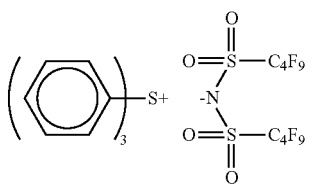
(z17)
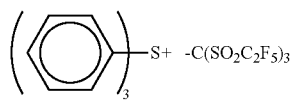
(z18)
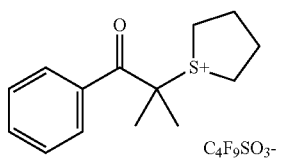
(z19)
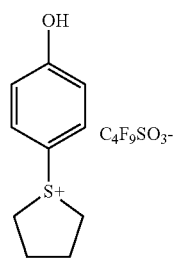
(z20)
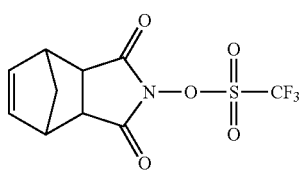
(z21)
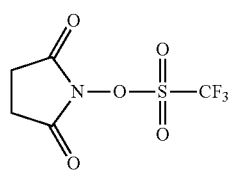
(z22)
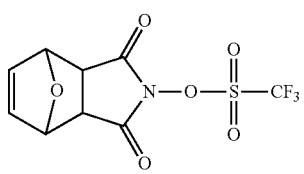
(z23)
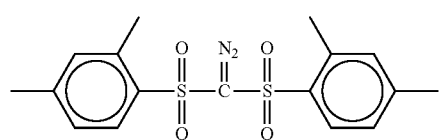
(z24)
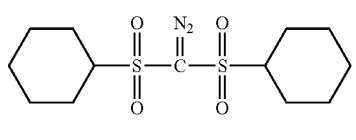
(z25)

-continued

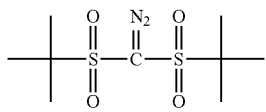 (z26)

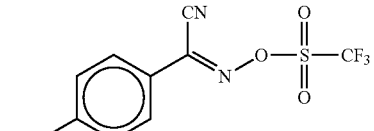 (z27)

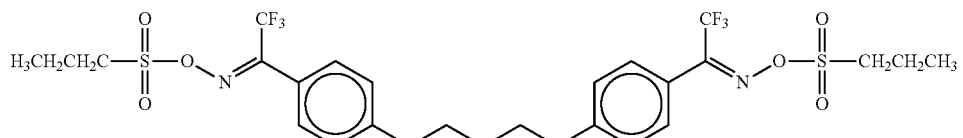 (z28)

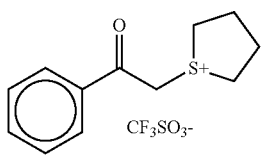 (z29)

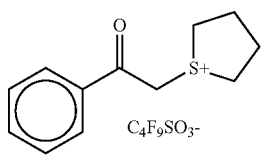 (z30)

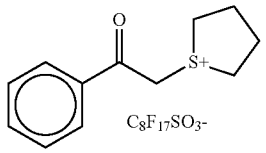 (z31)

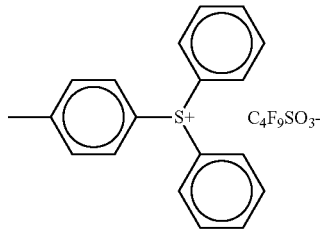 (z32)

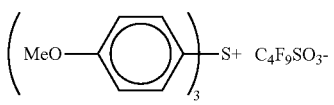 (z33)

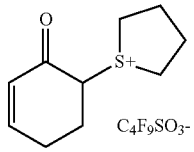 (z34)

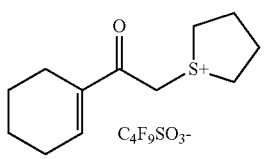 (z35)

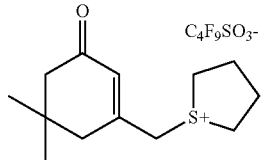 (z36)

(C) Basic Compounds:

It is preferred for a positive resist composition for immersion exposure in the invention to further contain a basic compound. As the basic compounds, e.g., nitrogen-containing basic compounds, basic ammonium salts, basic sulfonium salts, and basic iodonium salts are used. Any basic compounds will do so long as they do not reduce sublimation and resist performances.

The basic compound is a component having functions of controlling a diffusion phenomenon of an acid generated from an acid generator in a resist film by exposure and suppressing undesired chemical reaction in a non-exposed area. By blending such a basic compound, the diffusion of an acid generated from an acid generator in a resist film by exposure can be controlled, the preservation stability of a positive resist composition for immersion exposure to be obtained can be improved, resolution as the resist is further improved, the line width change due to the fluctuation of post exposure time delay (PED) from exposure to development process can be prevented, so that a composition extremely excellent in process stability can be obtained.

As the nitrogen-containing basic compounds, e.g., primary, secondary and tertiary aliphatic amines, aromatic amines, heterocyclic amines, nitrogen-containing compounds having a carboxyl group, nitrogen-containing compounds having a sulfonyl group, nitrogen-containing compounds having a hydroxyl group, nitrogen-containing compounds having a hydroxyphenyl group, alcoholic nitrogen-containing compounds, amide derivatives, imide derivatives, and nitrogen-containing compounds having a cyano group can be exemplified.

As the aliphatic amines, e.g., methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, dimethylamine, diethylamine, di-n-propylamine, diisopropyl-amine, di-n-butylamine, diisobutylamine, di-sec-butylamine, dipentylamine, dicyclopentylamine, dihexylamine, dicyclo-hexylamine, diheptylamine, dioctylamine, dinonylamine, didecylamine, didodecylamine, dicetylamine, N,N-dimethyl-methylenediamine, N,N-dimethylethylenediamine, N,N-dimethyltetraethylenepentamine, trimethylamine, triethyl-amine, tri-n-propylamine, triisopropylamine, tri-n-butyl-amine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethyl-methylenediamine, N,N,N',N'-tetramethylethylenediamine, N,N,N',N'-tetramethyltetraethylenepentamine, dimethyl-ethyl-amine, methylethylpropylamine, benzylamine, phenethylamine, benzyldimethylamine, etc., can be exemplified.

As the aromatic amines and the heterocyclic amines, e.g., aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitro-aniline, 4-nitroaniline, 2,4-dinitroaniline, 2,6-dinitro-aniline, 3,5-dinitroaniline, N,N-dimethyltoluidine, etc.), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, N-methylpyrrole, etc.), oxazole derivatives (e.g., oxazole, isooxazole, etc.), thiazole derivatives (e.g., thiazole, isothiazole, etc.), imidazole derivatives (e.g., imidazole, 4-methylimidazole, 4-methyl-2-phenylimidazole, etc.), pyrazole derivatives, furazane derivatives, pyrroline derivatives (e.g., pyrroline, 2-methyl-1-pyrroline, etc.), pyrrolidine derivatives (e.g., pyrrolidine, N-methylpyrrolidine, pyrrolidinone, N-methyl-pyrrolidone, etc.), imidazoline derivatives, imidazolidine derivatives, pyridine derivatives (e.g., pyridine, methyl-pyridine, ethylpyridine, propylpyridine, butylpyridine, 4-(1-butylpentyl)pyridine, dimethylpyridine, trimethyl-pyridine, triethylpyridine, phenylpyridine, 3-methyl-2-phenylpyridine, 4-tert-butylpyridine, diphenylpyridine, benzylpyridine, methoxypyridine, butoxypyridine, dimethoxy-pyridine, 1-methyl-2-pyridone, 4-pyrrolidinopyridine, 1-methyl-4-phenylpyridine, 2-(1-ethylpropyl)pyridine, aminopyridine, dimethylaminopyridine, etc.), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline, 3-quinolinecarbonitrile, etc.), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, uridine derivatives, etc., can be exemplified.

As the nitrogen-containing compounds having a carboxyl group, e.g., aminobenzoic acid, indolecarboxylic acid, amino acid derivatives (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, methoxyalanine, etc.) can be exemplified.

As the nitrogen-containing compounds having a sulfonyl group, e.g., 3-pyridinesulfonic acid, pyridinium p-toluenesulfonate, etc., can be exemplified.

As the nitrogen-containing compounds having a hydroxyl group, e.g., 2-hydroxypyridine, aminocresol, 2,4-quinolinediol, 3-indolemethanol hydrate, monoethanolamine, diethanol-amine, triethanolamine, N-ethyldiethanolamine, N,N-diethyl-ethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]-piperazine, piperidine ethanol, 1-(2-hydroxyethyl)-pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidyl ethanol, 1-acridine ethanol, N-(2-hydroxy-ethyl)phthalimide, N-(2-hydroxyethyl)isonicotinamide, etc., can be exemplified.

As the amide derivatives, e.g., formamide, N-methyl-formamide, N,N-dimethylformamide, acetamide, N-methyl-acetamide, N,N-dimethylacetamide, propionamide, benzamide, etc., can be exemplified.

As the imide derivatives, e.g., phthalimide, succinimide, maleimide, etc., can be exemplified.

As the nitrogen-containing compounds having a cyano group, e.g., 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-amino-propiononitrile, methyl N-(2-cyanoethyl)-N-(2-methoxy-ethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyano-ethyl)-N-(2-methoxyethyl)-3-aminopropiononitrile, N-(2-cyanoethyl)-N-[2-(methoxymethoxy)ethyl]-3-aminopropiono-nitrile, N-(2-cyanoethyl)-N-(3-hydroxy-1-propyl)-3-amino-propiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyano-ethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)-aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidyl-propiononitrile, 1-piperidinopropiononitrile, 4-morpholino-propiononitrile, 1-pyrrolidylacetonitrile, 1-piperidino-acetonitrile, 4-morpholinoacetonitrile, cyanomethyl 3-diethylaminopropionate, cyanomethyl N,N-bis(2-hydroxy-ethyl)-3-aminopropionate, cyanomethyl N,N-bis(2-acetoxy-ethyl)-3-aminopropionate, cyanomethyl N,N-bis(2-formyloxy-ethyl)-3-aminopropionate, cyanomethyl N,N-bis(2-methoxy-ethyl)-3-aminopropionate, cyanomethyl N,N-bis[2-(methoxy-methoxy)ethyl]-3-aminopropionate, (2-cyanoethyl)-3-diethyl-aminopropionate, (2-cyanoethyl)-

N,N-bis(2-hydroxyethyl)-3-aminopropionate, (2-cyanoethyl)-N,N-bis)-2-acetoxyethyl)-3-aminopropionate, (2-cyanoethyl)-N,N-bis(2-formyloxyethyl)-3-aminopropionate, (2-cyanoethyl)-N,N-bis(2-methoxyethyl)-3-aminopropionate, (2-cyanoethyl)-N,N-bis[2-(methoxy-methoxy)ethyl]-3-aminopropionate, cyanomethyl 1-pyrrolidyl-propionate, cyanomethyl 1-piperidinopropionate, cyanomethyl 4-morpholinopropionate, (2-cyanoethyl)-1-pyrrolidyl-propionate, (2-cyanoethyl)-1-piperidinopropionate, (2-cyanoethyl)-4-morpholinopropionate, etc., can be specifically exemplified.

As preferred nitrogen-containing basic compounds, e.g., 1,5-diazabicyclo[4.3.0]-5-nonene, 1,8-diazabicyclo[5.4.0]-7-undecene, 1,4-diazabicyclo[2.2.2]octane, 4-dimethylamino-pyridine, 1-naphthylamine, piperidines, hexamethylene-tetramine, imidazoles, hydroxypyridines, pyridines, anilines, hydroxyalkylanilines, 4,4'-diaminodiphenyl ether, pyridinium p-toluenesulfonato, 2,4,6-trimethylpyridinium p-toluene-sulfonato, tetramethylammonium p-toluenesulfonato, tetrabutylammonium lactate, tri(cyclo)alkylamines, e.g., triethylamine, tributylamine, tripentylamine, tri-n-octyl-amine, tri-i-octylamine, tris(ethylhexyl)amine, tridecyl-amine, tridodecylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, ethylenediamine, N,N,N',N'-tetramethylethylenediamine, tetramethylenediamine, hexaethylenediamine, 4,4'-diamino-diphenylmethane, 4,4'-diaminodiphenyl ether, 4,4'-diamino-benzophenone, 4,4'-diaminodiphenylamine, 2,2-bis(4-amino-phenyl)propane, 2-(3-aminophenyl)-2-(4-aminophenyl)propane, 2-(4-aminophenyl)-2-(3-hydroxyphenyl)propane, 2-(4-amino-phenyl)-2-(4-hydroxyphenyl)propane, 1,4-bis[1-(4-amino-phenyl)-1-methylethyl]benzene, 1,3-bis[1-(4-aminophenyl)-1-methylethyl]benzene, bis(2-dimethylaminoethyl)ether, bis(2-diethylaminoethyl)ether, N,N,N',N'-tetrakis(2-hydroxypropyl)ethylenediamine, tricyclohexylamine, etc., aromatic amines, e.g., aniline, N-methylaniline, N,N-dimethylaniline, 2-methylaniline, 3-methylaniline, 4-methylaniline, 4-nitroaniline, diphenylamine, triphenyl-amine, naphthylamine, 2,6-diisopropylaniline, etc., polyethyleneimine, polyallylamine, polymers of 2-dimethyl-aminoethylacrylamide, N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenyl-methane, N,N'-di-t-butoxycarbonylhexamethylenediamine, N,N,N',N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diamino-decane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, formamide, N-methylformamide, N,N-dimethylformamide, acetamide, N-methylacetamide, N,N-dimethylacetamide, propionamide, benzamide, pyrrolidone, N-methyl-pyrrolidone, urea, methylurea, 1,1-dimethylurea, 1,3-dimethylurea, 1,1,3,3-tetramethylurea, 1,3-diphenylurea, tri-n-butylthiourea, imidazoles, e.g., imidazole, 4-methyl-imidazole, 4-methyl-2-phenylimidazole, benzimidazole, 2-phenylbenzimidazole, etc., pyridines, e.g., pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amine, quinoline, 4-hydroxyquinoline, 8-oxyquinoline, acridine, etc., piperazines, e.g., piperazine, 1-(2-hydroxyethyl)piperazine, etc., pyrazine, pyrazole, pyridazine, quinazoline, purine, pyrrolidine, piperidine, 3-piperidino-1,2-propanediol, morpholine, 4-methyl-morpholine, 1,4-dimethylpiperazine, etc., can be exemplified.

Of these compounds, nitrogen-containing basic compounds such as 1,5-diazabicyclo[4.3.0]-5-nonene, 1,8-diazabicyclo-[5.4.0]-7-undecene, 1,4-diazabicyclo-[2.2.2]octane, 4-dimethylaminopyridine, 1-naphthylamine, piperidine, 4-hydroxypiperidine, 2,2,6,6-tetramethyl-4-hydroxy-piperidine, hexamethylenetetramine, imidazoles, hydroxypyridines, pyridines, 4,4'-diaminodiphenyl ether, triethylamine, tributylamine, tripentylamine, tri-n-octylamine, tris(ethylhexyl)amine, tridodecylamine, N,N-dihydroxyethylaniline, N-hydroxyethyl-N-ethylaniline, etc., are especially preferred.

A positive resist composition for immersion exposure in the invention can further contain a basic ammonium salt as the basic compound. As the specific examples of basic ammonium salts, the compounds shown below can be exemplified, but the invention is not limited thereto.

Specifically, ammonium hydroxide, ammonium triflate, ammonium pentaflate, ammonium heptaflate, ammonium nonaflate, ammonium undecaflate, ammonium tridecaflate, ammonium pentadecaflate, ammonium methylcarboxylate, ammonium ethylcarboxylate, ammonium propylcarboxylate, ammonium butylcarboxylate, ammonium heptylcarboxylate, ammonium hexylcarboxylate, ammonium octylcarboxylate, ammonium nonylcarboxylate, ammonium decylcarboxylate, ammonium undecylcarboxylate, ammonium dodecadecylcarboxyl, ammonium tridecylcarboxylate, ammonium tetradecylcarboxylate, ammonium pentadecylcarboxylate, ammonium hexadecyl-carboxylate, ammonium heptadecylcarboxylate, ammonium octadecylcarboxylate, etc., can be exemplified.

As the ammonium hydroxide, specifically tetramethyl-ammonium hydroxide, tetraethylammonium hydroxide, tetrapropylammonium hydroxide, tetrabutylammonium hydroxide, tetrapentylammonium hydroxide, tetrahexylammonium hydroxide, tetraheptylammonium hydroxide, methyltrioctylammonium hydroxide, tetraoctylammonium hydroxide, didecyldimethyl-ammonium hydroxide, tetrakisdecylammonium hydroxide, dodecyltrimethylammonium hydroxide, dodecylethyldimethyl-ammonium hydroxide, didodecyldimethylammonium hydroxide, tridodecylmethylammonium hydroxide, myristylmethylammonium hydroxide, dimethylditetradecylammonium hydroxide, hexadecyltrimethylammonium hydroxide, octadecyltrimethyl-ammonium hydroxide, dimethyldioctadecylammonium hydroxide, tetraoctadecylammonium hydroxide, diallyldimethylammonium hydroxide, (2-chloroethyl)trimethylammonium hydroxide, (2-bromoethyl)trimethylammonium hydroxide, (3-bromopropyl)-trimethylammonium hydroxide, (3-bromopropyl)triethyl-ammonium hydroxide, glycidyltrimethylammonium hydroxide, choline hydroxide, (R)-(+)-(3-chloro-2-hydroxypropyl)-trimethylammonium hydroxide, (S)-(−)-(3-chloro-2-hydroxy-propyl)trimethylammonium hydroxide, (3-chloro-2-hydroxy-propyl)trimethylammonium hydroxide, (2-aminoethyl)-trimethylammonium hydroxide, hexamethonium hydroxide, decamethonium hydroxide, 1-azoniaproperan hydroxide, petronium hydroxide, 2-chloro-1,3-dimethyl-2-imidazolinium hydroxide, 3-ethyl-2-methyl-2-thiazolinium hydroxide, etc., can be exemplified.

It is preferred that a positive resist composition for immersion exposure in the invention contains, as basic compound (C), a nitrogen-containing compound not having an oxygen atom (Ca).

As nitrogen-containing compound not having an oxygen atom (Ca), e.g., aliphatic amines, aromatic amines, heterocyclic amines, nitrogen-containing compounds having a cyano group can be exemplified.

As the aliphatic amines, tri(cyclo)alkylamines, e.g., diisobutylamine, di-sec-butylamine, dipentylamine, dicyclopentylamine, dihexylamine, dicyclohexylamine, diheptylamine, N,N-dimethylmethylenediamine, N,N-dimethylethylenediamine, N,N-dimethyltetraethylenepentamine, tri-n-propylamine, triisopropylamine, tri-n-butylamine, triisobutylamine, tri-sec-butylamine, trip entylamine, tricyclopentylamine, trihexylamine, tricyclohexylamine, triheptylamine, trioctyl-amine, trinonylamine, tridecylamine, tri-dodecylamine, tricetylamine, N,N,N',N'-tetramethylmethylenediamine, N,N,N',N'-tetramethylethylenediamine, N,N,N',N'-tetramethyltetraethylenepentamine, dimethylethylamine, methylethylpropylamine, benzylamine, phenethylamine, benzyldimethylamine, 1,5-diazabicyclo[4.3.0]-5-nonene, 1,8-diazabicyclo[5.4.0]-7-undecene, 1,4-diazabicyclo-[2.2.2]octane, hexamethylenetetramine, 4,4'-diamino-diphenylmethane, 4,4'-diaminodiphenylamine, 2,2-bis(4-aminophenyl)propane, 2-(3-aminophenyl)-2-(4-aminophenyl)-propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, tricyclohexylamine, etc., can be exemplified.

As the aromatic amines and heterocyclic amines, e.g., aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, N,N-dimethyltoluidine, etc.), diphenyl(p-tolyl)amine, methyldiphenylamine, triphenylamine, phenylenediamine, naphthylamine, diamino-naphthalene, pyrrole derivatives (e.g., pyrrole, 2H-pyrrole, 1-methylpyrrole, 2,4-dimethylpyrrole, 2,5-dimethylpyrrole, N-methylpyrrole, etc.), thiazole derivatives (e.g., thiazole, isothiazole, etc.), imidazole derivatives (e.g., imidazole, 4-methylimidazole, 4-methyl-2-phenylimidazole, etc.), pyrazole derivatives, furazane derivatives, pyrroline derivatives (e.g., pyrroline, 2-methyl-1-pyrroline, etc.), pyrrolidine derivatives (e.g., pyrrolidine, N-methyl-pyrrolidine, pyrrolidinone, N-methylpyrrolidone, etc.), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butyl-pyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, dimethylaminopyridine, etc.), pyridazine derivatives, pyrimidine derivatives, pyrazine derivatives, pyrazoline derivatives, pyrazolidine derivatives, piperidine derivatives, piperazine derivatives, indole derivatives, isoindole derivatives, 1H-indazole derivatives, indoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, diphenylamine, triphenylamine, naphthylamine, 2,6-diisopropylaniline, etc., piperazines, e.g., piperazine, pyrazine, pyrazole, pyridazine, quinazoline, purine, pyrrolidine, piperidine, 1,4-dimethylpiperazine, N,N,N',N'-tetrabutylbenzidine, tris[4-(dimethylamino)phenyl]methane-4,4'-methylenebis(2,6-diisopropylaniline), etc., can be exemplified.

As the nitrogen-containing compounds having a cyano group, specifically 3-(diethylamino)propiononitrile, N-(2-cyanoethyl)-N-ethyl-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(cyanomethyl)aminoacetonitrile, 1-pyrrolidylpropiononitrile, 1-piperidinopropiononitrile, 1-pyrrolidylacetonitrile, 1-piperidinoacetonitrile, etc., can be exemplified.

Of these basic compounds, 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, hexamethylenetetramine, imidazoles, pyridines, anilines, tripentylamine, tri-n-octylamine, tris(ethylhexyl)amine, tridodecylamine, etc., are especially preferred.

These basic compounds can be used alone, or two or more in combination, and it is more preferred to use two or more in combination.

The use amount of the basic compounds is generally from 0.001 to 10 mass % as total amount based on the solids content of a positive resist composition for immersion exposure, and preferably from 0.01 to 5 mass %.

(D) Surfactants:

It is preferred for a positive resist composition for immersion exposure in the invention to further contain surfactants, and it is more preferred to contain either one or two or more of fluorine-based and/or silicon surfactants (a fluorine surfactant, a silicon surfactant, a surfactant containing both a fluorine atom and a silicon atom).

By containing surfactants, it becomes possible for a positive resist composition for immersion exposure in the invention to provide a resist pattern excellent in sensitivity and resolution, and low in defects in adhesion and development in using an exposure light source of 250 nm or lower, in particular, 220 nm or lower.

Fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. The following commercially available surfactants can also be used as they are.

As commercially available fluorine or silicon surfactants usable in the invention, Eftop EF301 and EF303 (manufactured by Shin-Akita Kasei Co., Ltd.), Fluorad FC 430 and 431 (manufactured by Sumitomo 3M Limited), Megafac F171, F173, F176, F189 and R08 (manufactured by Dainippon Ink and Chemicals Inc.), Sarfron S-382, SC101, 102, 103, 104, 105 and 106 (manufactured by ASAHI GLASS CO., LTD.), and Troy Sol S-366 (Troy Chemical Co., Ltd.) are exemplified. In addition, polysiloxane polymer KP-341 (manufactured by Shin-Etsu Chemical Co., Ltd.) can also be used as a silicon surfactant.

As surfactants, in addition to the above-shown well-known surfactants, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized by the method disclosed in JP-A-2002-90991.

As polymers having fluoro-aliphatic groups, copolymers of monomers having fluoro-aliphatic groups and (poly(oxyalkylene)) acrylate and/or (poly(oxyalkylene)) methacrylate are preferred, and these copolymers may be irregularly distributed or may be block copolymerized. As the poly-(oxyalkylene) groups, a poly(oxyethylene) group, a poly-(oxypropylene) group and poly(oxybutylene) group are exemplified. Further, the polymers may be units having alkylene different in a chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly-(oxyalkylene) acrylate (or methacrylate) may be not only bipolymers but also terpolymers or higher polymers obtained by copolymerization of monomers having different two or more kinds of fluoro-aliphatic groups or different two or more kinds of poly(oxyalkylene)acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate), and (poly-(oxypropylene)) acrylate (or methacrylate), copolymers of acrylate (or methacrylate) having a $C_8F_{17}$ group and (poly-(oxyethylene)) acrylate (or methacrylate), copolymers of acrylate (or methacrylate) having a $C_8F_{17}$ group, (poly(oxy-ethylene)) acrylate (or methacrylate), and (poly(oxy-propylene)) acrylate (or methacrylate), etc., can be exemplified.

It is preferred for a positive resist composition for immersion exposure in the invention to contain, as surfactant (D), fluorine-based nonionic surfactants (Da).

As commercially available fluorine-based nonionic surfactants (Da), e.g., PF636, PF656, PF6320 and PF6520 (manufactured by OMNOVA Solution Inc.), FTX-204D, 208G, 218G, 230G, 204D, 208D, 212D, 218, 222D, 720C and 740C (manufactured by NEOS), Eftop EF-121, 122A, 122B, 122C, 125M, 135M, 802 and 601 (manufactured by JEMCO Inc.), Sarfron S-393 (manufactured by Seimi Chemical Co., Ltd.), Megafac F-177, R-08, F142D (manufactured by Dainippon Ink and Chemicals Inc.) can be exemplified, and PF636, PF656, PF6320 and PF6520 (manufactured by OMNOVA Solution Inc.) are more preferred.

Fluorine-based nonionic surfactants (Da) can also be synthesized by radical polymerization and ring-opening polymerization. As fluorine-based nonionic surfactants (Da) that can be synthesized by polymerization reaction, e.g., ring-opening polymers of (meth)acrylate derivatives, polyvinyl alcohol derivatives, hexafluoropropene derivatives, ethyleneoxy-containing oligomers, epoxide, and oxetanes, and silane coupling agents, sugar derivatives, etc., can be exemplified.

The weight average molecular weight of fluorine-based nonionic surfactants (Da) is preferably 1,000 or more, and more preferably from 1,000 to 10,000.

In the invention, surfactants other than fluorine-based and/or silicon surfactants and fluorine-based nonionic surfactants (Da) can also be used. Specifically, nonionic surfactants, such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkylaryl ethers, e.g., polyoxyethylene octylphenol ether, polyoxyethylene nonylphenol ether, etc., polyoxyethylene polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., and polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc., can be exemplified.

These surfactants may be used alone, or a plurality of surfactants may be used in combination.

The use amount of surfactants is preferably from 0.0001 to 2 mass % based on the total amount of the positive resist composition for immersion exposure (excluding solvents), and more preferably from 0.001 to 1 mass %.

(E) Organic Solvents:

For using a positive resist composition for immersion exposure in the invention, the above components are dissolved in a prescribed organic solvent.

As the organic solvents usable in the invention, ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, methoxybutanol, tetrahydrofuran, etc., are exemplified.

In the invention, as organic solvent, a mixed solvent of a solvent having a hydroxyl group in the structure and a solvent not having a hydroxyl group may be used.

As the examples of solvents having a hydroxyl group, e.g., ethylene glycol, ethylene glycol monomethyl ether, ethylene glycol monoethyl ether, propylene glycol, propylene glycol monomethyl ether, propylene glycol monoethyl ether, ethyl lactate, etc., are exemplified. Of these solvents, propylene glycol monomethyl ether and ethyl lactate are preferred.

As solvents not having a hydroxyl group, e.g., propylene glycol monomethyl ether acetate, ethylethoxy propionate, 2-heptanone, γ-butyrolactone, cyclohexanone, butyl acetate, N-methylpyrrolidone, N,N-dimethylacetamide, dimethyl sulfoxide, etc., are exemplified. Of these solvents, propylene glycol monomethyl ether acetate, ethylethoxy propionate, 2-heptanone, γ-butyrolactone, cyclohexanone, and butyl acetate are preferred, and propylene glycol monomethyl ether acetate, ethylethoxy propionate and 2-heptanone are more preferred.

The mixing ratio (by mass) of a solvent having a hydroxyl group and a solvent not having a hydroxyl group is preferably from 1/99 to 99/1, more preferably from 10/90 to 90/10, and still more preferably from 20/80 to 60/40. A mixed solvent containing 50 mass % or more of a solvent not having a hydroxyl group is particularly preferred in the point of coating uniformity.

(F) Dissolution Inhibiting Compounds Having a Molecular Weight of 3,000 or Less Capable of Decomposing by the Action of an Acid to Increase the Solubility in an Alkali Developer:

It is preferred for a positive resist composition for immersion exposure in the invention to contain a dissolution inhibiting compound having a molecular weight of 3,000 or less that is capable of decomposing by the action of an acid to increase the solubility in an alkali developer (hereinafter also referred to as "a dissolution inhibiting compound").

As the dissolution inhibiting compound, so as not to reduce transmission to 220 nm or less, alicyclic or aliphatic compounds containing an acid-decomposable group, such as cholic acid derivatives containing an acid-decomposable group as described in *Proceeding of SPIE*, 2724, 355 (1996) are preferred. As the acid-decomposable groups and alicyclic structures, the same as those described in the resins in component (A) can be exemplified.

The molecular weight of the dissolution inhibiting compounds in the invention is 3,000 or less, preferably from 300 to 3,000, and more preferably from 500 to 2,500.

The addition amount of the dissolution inhibiting compound is preferably from 1 to 30 mass % based on the total solids content of the positive resist composition for immersion exposure, and more preferably from 2 to 20 mass %.

The specific examples of dissolution inhibiting compounds are shown below, but the invention is not restricted thereto.

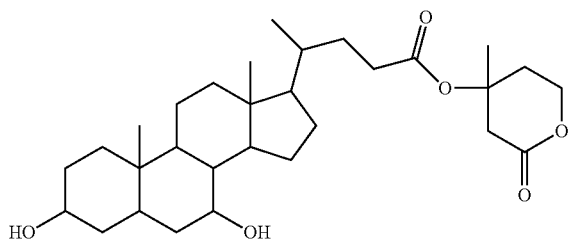

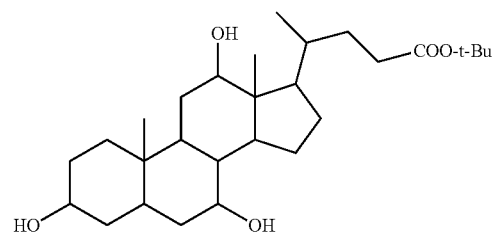

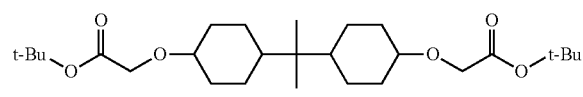

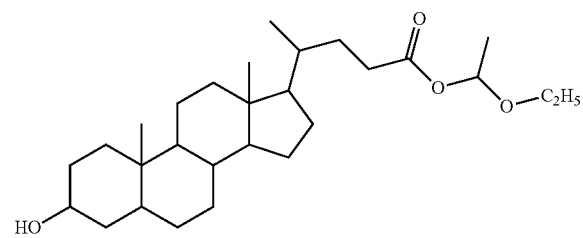

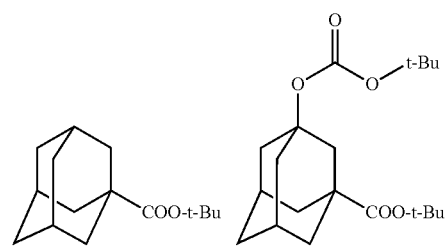

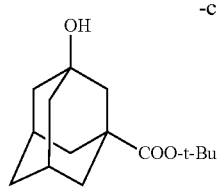

(G) Alkali-Soluble Resins:

A positive resist composition for immersion exposure in the invention can further contain a resin soluble in an alkali developer, by which sensitivity is improved.

Novolak resins having a molecular weight of from 1,000 to 20,000 or so, and polyhydroxystyrene derivatives having a molecular weight of from 3,000 to 50,000 or so can be used as such resins. Since these resins are great in absorption of rays of 250 nm or less, it is preferred to use these resins by partially hydrogenating or in an amount of 30 mass % or less of the total resin amount.

Resins having, as an alkali-soluble group, a carboxyl group can also be used. For the purpose of improving dry etching resistance, it is preferred for the resins having a carboxyl group to have a monocyclic or polycyclic alicyclic hydrocarbon group. Specifically, copolymers of methacrylic ester having an alicyclic hydrocarbon structure not showing an acid-decomposing property and (meth)acrylic acid, or resins of (meth)acrylic ester of alicyclic hydrocarbon group having carboxyl groups at terminals are exemplified.

The addition amount of these alkali-soluble resins is generally 30 mass % or less of the total amount of resins including acid-decomposable resins.

(H) Carboxylic Acid Onium Salts:

A positive resist composition for immersion exposure in the invention may contain a carboxylic acid onium salt.

As carboxylic acid onium salts for use in the invention, carobxylic acid sulfonium salt, carobxylic acid iodonium salt, and carobxylic acid ammonium salt can be exemplified. As carboxylic acid onium salt, iodonium salt and sulfonium salt are especially preferred. Further, it is preferred that the carboxylate residue of carboxylic acid onium salt does not contain an aromatic group and a carbon-carbon double bond. An especially preferred anion moiety is a straight chain or branched, monocyclic or polycyclic alkylcarboxylic acid anion having from 1 to 30 carbon atoms, and carboxylic acid anion in which a part or all of the alkyl groups are substituted with fluorine atoms is more preferred. An oxygen atom may be contained in the alkyl chain, by which the transparency to the rays of 220 nm or less is ensured, sensitivity and resolution are increased, and density dependency and exposure margin are improved.

As fluorine-substituted carboxylic acid anions, anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid are exemplified.

These carboxylic acid onium salts can be synthesized by reacting sulfonium hydroxide, iodonium hydroxide, or ammonium hydroxide and carboxylic acid with a silver oxide in an appropriate solvent.

The content of carboxylic acid onium salt in a resist composition is appropriately from 0.1 to 20 mass % to all the solids content of the composition, preferably from 0.5 to 10 mass %, and more preferably from 1 to 7 mass %.

Other Additives:

A positive resist composition for immersion exposure in the invention may contain, if necessary, dyes, plasticizers, photosensitizers, and compounds for accelerating dissolution in a developer (e.g., phenolic compounds having a molecular weight of 1,000 or less, alicyclic or aliphatic compounds having a carboxyl group).

Such phenolic compounds having a molecular weight of 1,000 or less can be easily synthesized with referring to the methods disclosed, e.g., in JP-A-4-122938, JP-A-2-28531, U.S. Pat. No. 4,916,210, and EP 219294.

As the specific examples of the alicyclic or aliphatic compounds having carboxyl groups, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, cyclohexanedicarboxylic acid, etc., are exemplified, but the invention is not restricted to these compounds.

Use Method:

The positive resist composition for immersion exposure in the invention is used by dissolving each of the above components in a prescribed organic solvent, preferably in the mixed solvent as described above, and coating the solution on a prescribed support as follows.

That is, a positive resist composition for immersion exposure is coated on a substrate such as the one used in the production of precision integrated circuit elements (e.g., silicon/silicon dioxide coating) by an appropriate coating method with a spinner or a coater in an arbitrary thickness (generally from 50 to 500 nm).

After drying, the coated resist is dried by spin or bake to form a resist film, and the resist film is subjected to exposure (immersion exposure) for pattern formation through a mask via an immersion liquid. For example, in immersion exposure, the resist film is exposed with filling an immersion liquid between the resist film and the optical lens. The exposure dose can be optionally set, but is generally from 1 to 100 mJ/cm$^2$. After exposure, the resist film is preferably subjected to spin or/and bake, development and drying, whereby a good pattern can be obtained. The temperature of bake is generally from 30 to 300° C. The time from exposure to bake process is preferably shorter.

As the exposure rays, far ultraviolet rays having wavelengths of preferably 250 nm or less, and more preferably 220 nm or less are exemplified. Specifically, a KrF excimer laser (248 nm), an ArF excimer laser (193 nm), an F$_2$ excimer laser (157 nm), and X-rays are exemplified, and an ArF excimer (193 nm) laser is more preferably used.

Incidentally, the variation of performances of a resist at the time when subjected to immersion exposure is thought to be resulting from the contact of the resist surface with an immersion liquid.

An immersion liquid for use in immersion exposure is described below.

An immersion liquid for use in immersion exposure preferably has a temperature coefficient of refractive index as small as possible so as to be transparent to the exposure wavelength and to hold the distortion of an optical image reflected on the resist to the minimum. In particular, when the exposure light source is an ArF excimer laser (wavelength: 193 nm), it is preferred to use water as the immersion liquid for easiness of availability and easy handling property, in addition to the above points.

When water is used as the immersion liquid, to reduce the surface tension of water and to increase the surface activity, a trace amount of additive (a liquid) that does not dissolve the resist layer on a wafer and has a negligible influence on the optical coating of the lower surface of a lens element may be added. As such additives, aliphatic alcohols having a refractive index almost equal to the refractive index of water are preferred, specifically methyl alcohol, ethyl alcohol and isopropyl alcohol are exemplified. By adding an alcohol having a refractive index almost equal to that of water, even if the alcohol component in water is evaporated and the concentration of the content is changed, the refractive index variation of the liquid as a whole can be made extremely small. On the other hand, when impurities opaque to the light of 193 nm or a substance largely different from water in a refractive index are mixed, these substances bring about the distortion of an optical image reflected on the resist. Accordingly water is preferably distilled water. Further, pure water filtered through an ion exchange filter may be used.

The electric resistance of water is preferably 18.3 MΩ·cm or higher, and TOC (concentration of an organic material) is preferably 20 ppb or lower. Further, it is preferred that water has been subjected to deaeration treatment.

It is possible to heighten lithographic performance by increasing the refractive index of an immersion liquid.

From such a point of view, additives capable of increasing the refractive index may be added to water, or heavy water (D$_2$O) may be used in place of water.

A film hardly soluble in an immersion liquid (hereinafter also referred to as "topcoat") may be provided between a resist film by a positive resist composition for immersion exposure of the invention and an immersion liquid so as not to bring the resist film into direct contact with the immersion liquid. The necessary functions required of the topcoat are the aptitude for coating on the upper layer of a resist, the transparency to radiation, in particular the transparency to the ray of 193 nm, and the insolubility in an immersion liquid. It is preferred that the topcoat is not mixed with a resist and can be coated uniformly on a resist upper layer.

From the viewpoint of the transparency to 193 nm, polymers not containing aromatic groups are preferred as the topcoat. Specifically, hydrocarbon polymers, acrylic ester polymers, polymethacrylic acid, polyacrylic acid, polyvinyl ether, silicon-containing polymers, and fluorine-containing polymers are exemplified.

When the topcoat is peeled, a developer may be used, or a remover may be used separately. As the remover, solvents low in penetration into a resist are preferred. In view of capable of performing a peeling process at the same time with the development process of a resist, it is preferred that the topcoat can be peeled off by an alkali developer. From the viewpoint of performing peeling by an alkali developer, the topcoat is preferably acidic, but from the viewpoint of non-intermixture with the resist, it may be neutral or alkaline.

Resolution increases when there is no difference in the refractive indexes between the topcoat and the immersion liquid. In the case where the exposure light source is an ArF excimer laser (wavelength: 193 nm), water is preferred as the immersion liquid, so that the refractive index of the topcoat for ArF immersion exposure is preferably near the refractive index of water (1.44). Further, from the viewpoint of the transparency and refractive index, the thickness of the topcoat is preferably thinner.

In a development process, a developer is used as follows. As the developer of a positive resist composition for immersion exposure, alkaline aqueous solutions of inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butylamine, etc., tertiary amines, e.g., triethylamine, methyldiethylamine, etc., alcohol amines, e.g., dimethylethanolamine, triethanolamine, etc., quaternary ammonium salts, e.g., tetramethylammonium hydroxide, tetraethylammonium hydroxide, etc., and cyclic amines, e.g., pyrrole, piperidine, etc., can be used.

An appropriate amount of alcohols and surfactants may be added to these alkaline aqueous solutions.

Pure water can be used as a rinsing liquid and an appropriate amount of surfactants may be added thereto.

The alkali concentration of an alkali developer is generally from 0.1 to 20 mass %.

The pH of an alkali developer is generally from 10.0 to 15.0.

After development process or rinsing process, a process to remove the developer or rinsing liquid attached on the resist pattern can be performed with a supercritical fluid.

EXAMPLE

The invention will be described with reference to examples, but the invention is not limited thereto.

Synthesis Example 1

Synthesis of PAG (B4)

Under nitrogen current, 4.0 g (12.65 mmol) of 1,1,2,2,3,3-hexafluoropropane-1,3-disulfonyl difluoride, 2.56 g (25.3 mmol) of triethylamine, and 30 ml of diisopropyl ether were cooled with ice, and a mixed solution containing 3.33 g (12.6 mmol) of nonyl-4-hydroxybenzoate and 15 ml of diisopropyl ether was dripped to the above mixture over 30 minutes. The mixed solution was stirred while cooling with ice for 1 hour, and further stirred at room temperature for 1 hour. The organic layer was washed with water, an aqueous solution of saturated ammonium chloride, and water in this order, and the organic layer was dried over sodium sulfate. After removing the solvents, 20 ml of ethanol and 200 mg of sodium hydroxide were added thereto and stirred at room temperature for 2 hours. The reaction solution was neutralized by the addition of dilute hydrochloric acid, whereby an ethanol solution of a sulfonic acid represented by the following chemical formula was obtained.

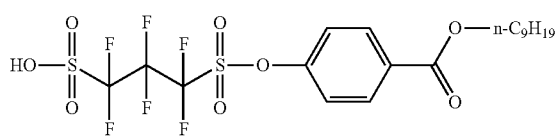

A triphenylsulfonium acetate solution was added to the above sulfonic acid solution, and the mixed solution was stirred at room temperature for 2 hours. Thereto was added 300 ml of chloroform, and the organic layer was washed with water, an aqueous solution of saturated ammonium chloride, and water in this order. The reaction product was refined by column chromatography (SiO$_2$, chloroform/methanol:5/1) to thereby obtain 3.84 g (4.68 mmol, the structure is shown in Table 2 below) of PAG (B4) as a white solid state. Other acid generators used in the examples of the invention were also synthesized by the methods in accordance with Synthesis Example 1.

The structures, weight average molecular weights, and molecular weight distributions of Resins (1) to (25) used in the examples of the invention and comparative examples are shown below.

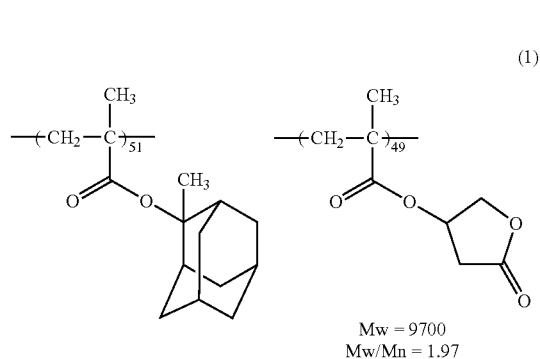

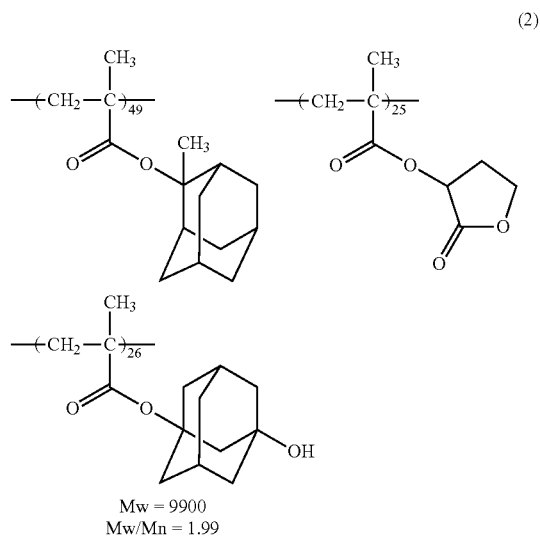

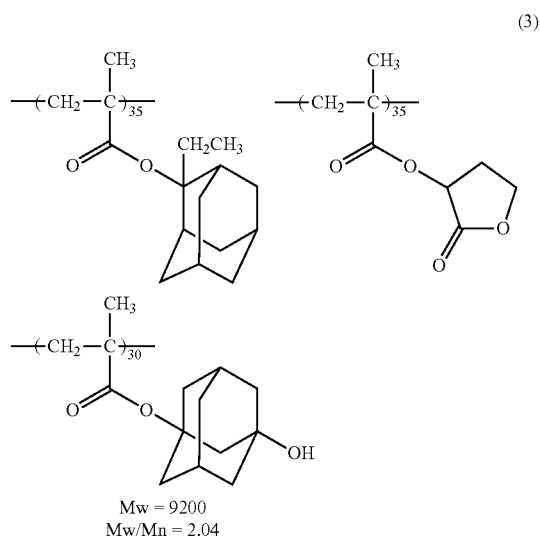

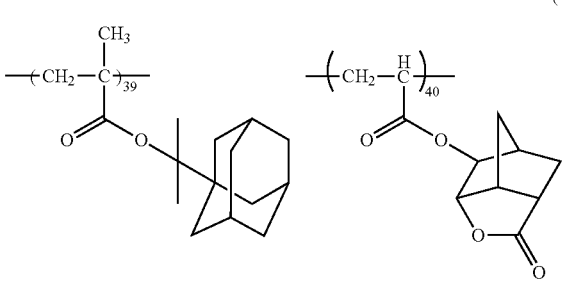

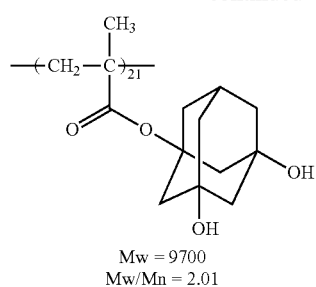
Mw = 9700
Mw/Mn = 2.01
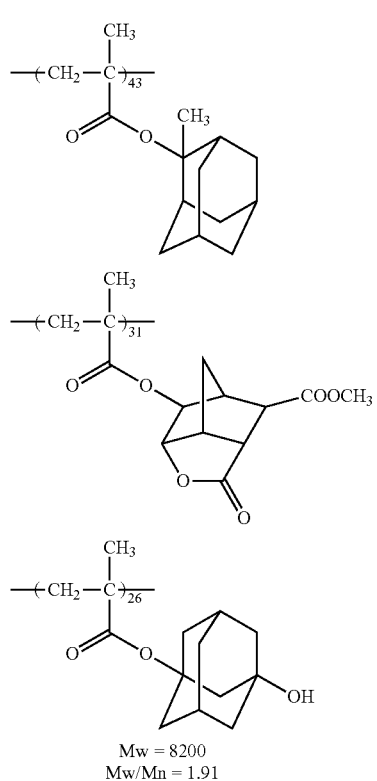
Mw = 8200
Mw/Mn = 1.91
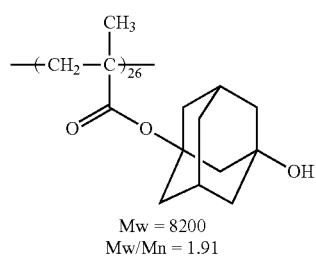
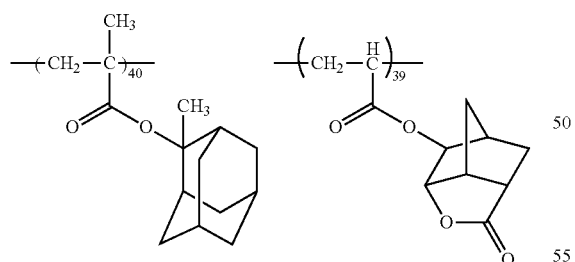
Mw = 9500
Mw/Mn = 2.07
(5)
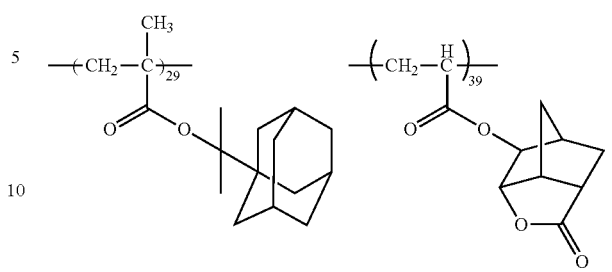
Mw = 8700
Mw/Mn = 1.98
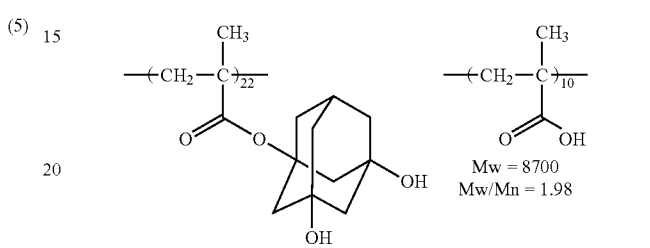
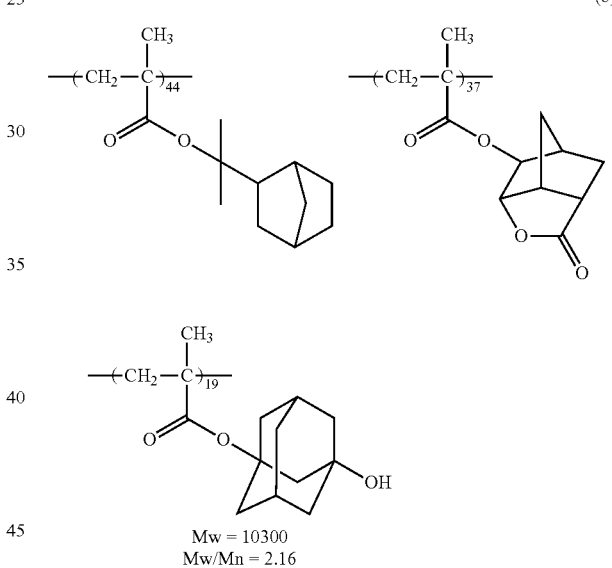
Mw = 10300
Mw/Mn = 2.16
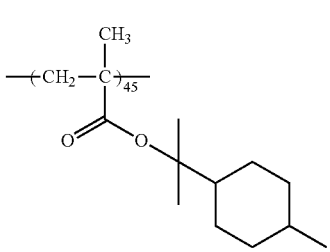
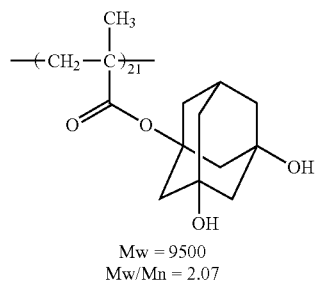
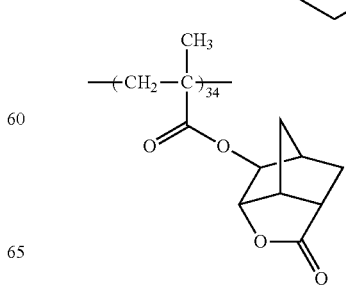
(7)
(8)
(9)

-continued
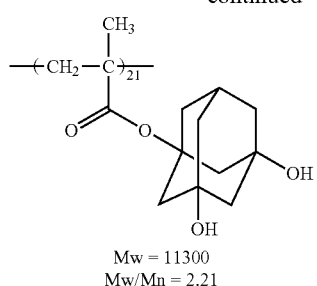
Mw = 11300
Mw/Mn = 2.21
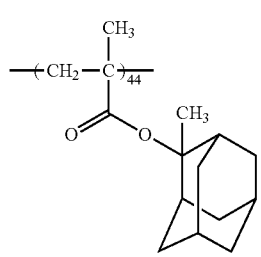
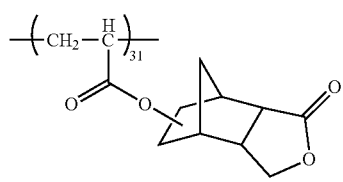
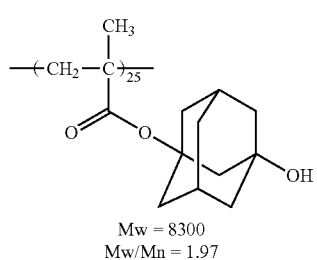
Mw = 8300
Mw/Mn = 1.97
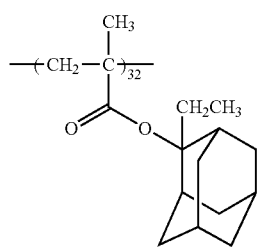 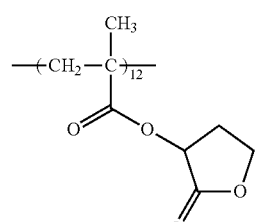
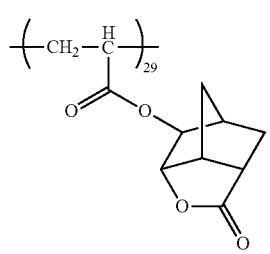
-continued
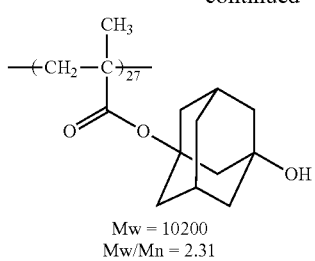
Mw = 10200
Mw/Mn = 2.31
(10)
(12)
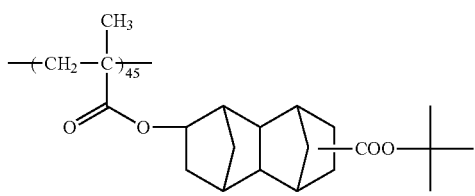
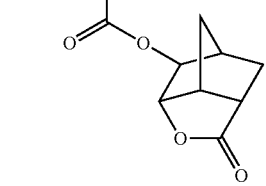
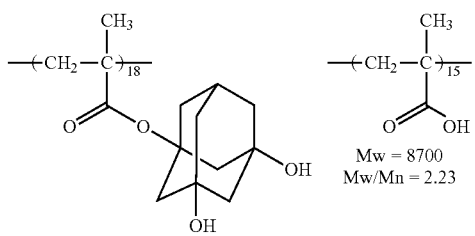
Mw = 8700
Mw/Mn = 2.23
(13)
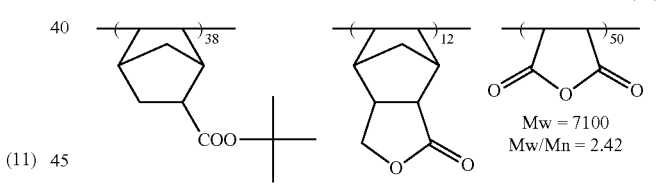
Mw = 7100
Mw/Mn = 2.42
(11)
(14)
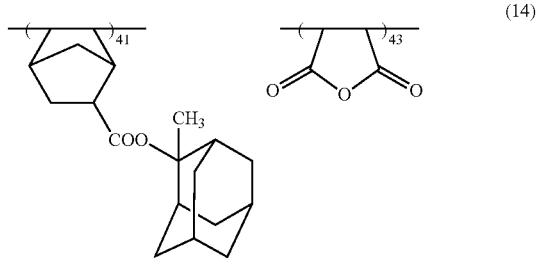
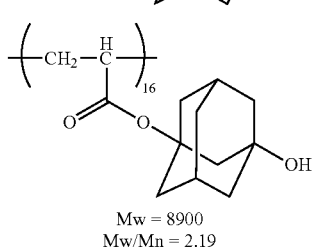
Mw = 8900
Mw/Mn = 2.19

(15)
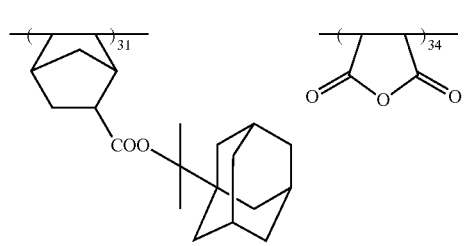
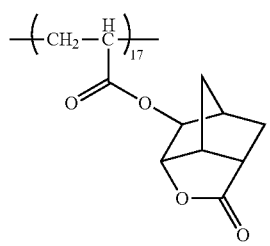
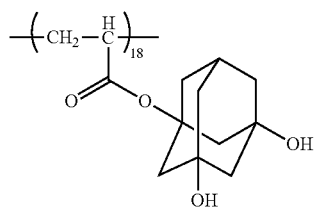
Mw = 11100
Mw/Mn = 2.37
(16)
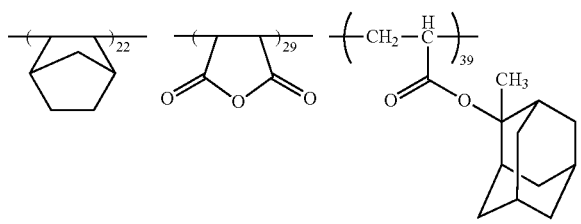
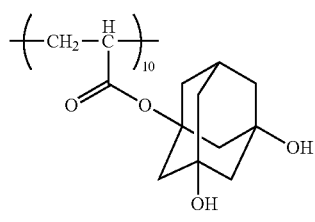
Mw = 10400
Mw/Mn = 2.51
(17)
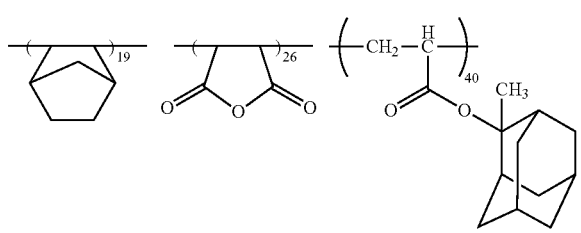
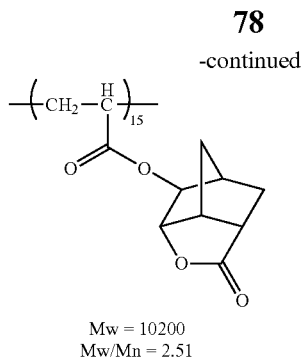
Mw = 10200
Mw/Mn = 2.51
(18)
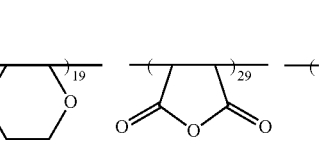
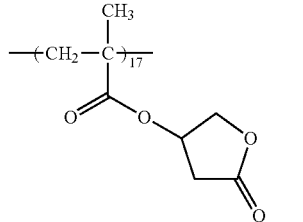
Mw = 7900
Mw/Mn = 2.33
(19)
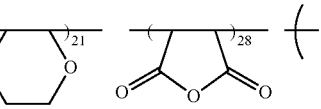
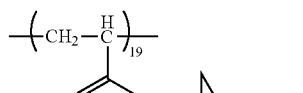
Mw = 9300
Mw/Mn = 2.26
(20)
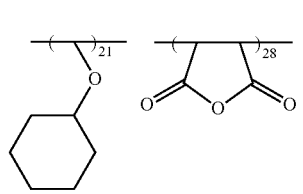

-continued

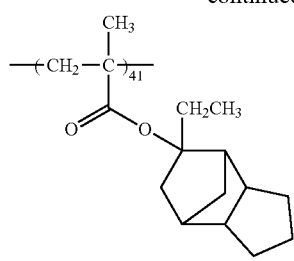

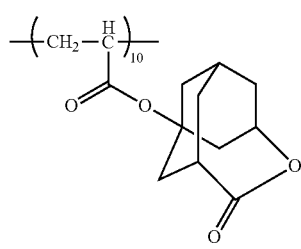

Mw = 9200
Mw/Mn = 2.49

(21)

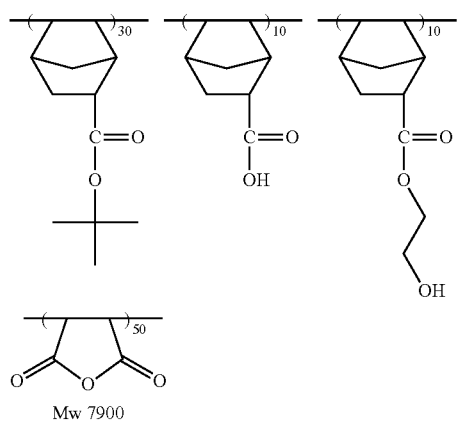

Mw 7900

(22)

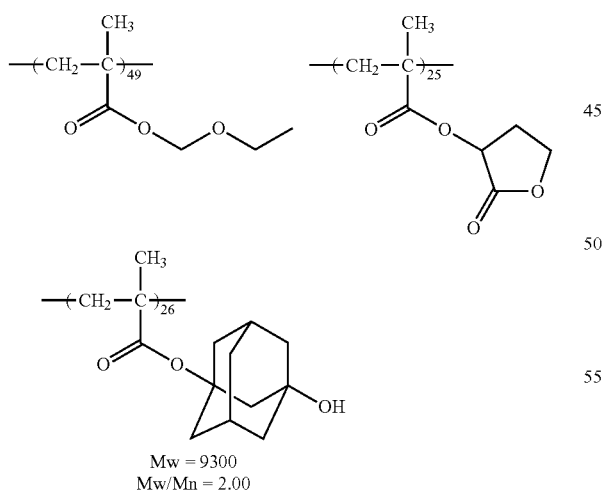

Mw = 9300
Mw/Mn = 2.00

(23)

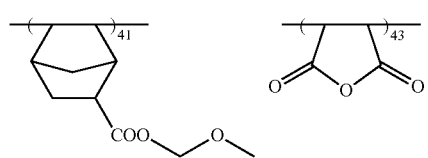

-continued

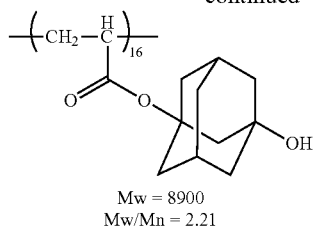

Mw = 8900
Mw/Mn = 2.21

(24)

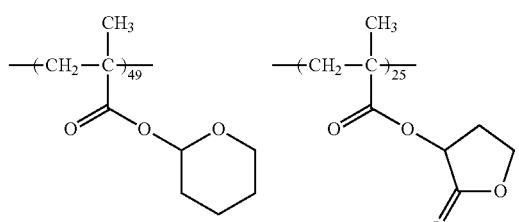

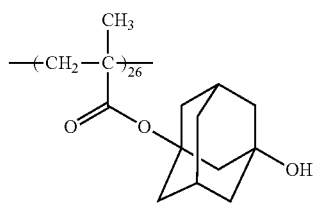

Mw = 10100
Mw/Mn = 2.04

(25)

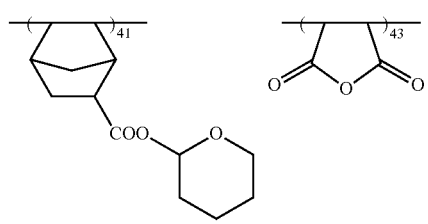

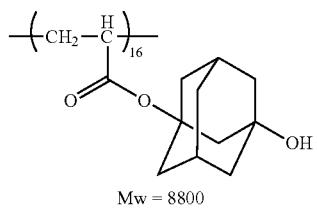

Mw = 8800
Mw/Mn = 1.98

Examples 1 to 28 and Comparative Examples 1 and 2

Preparation of Resist

The components shown in Table 1 below were dissolved in the solvents to prepare a solution having solids concentration of 6 mass %, and the solution was filtered through a polyethylene filter having a pore diameter of 0.1 μm, whereby a positive resist composition for immersion exposure was prepared. The prepared positive resist composition for immersion exposure was evaluated by the method described below. The results of evaluations are also shown in Table 1. With each component, the ratio in a case where components are used in a plurality is the ratio by mass.

TABLE 1

| Example No. | Resin (2 g) | Acid Generator (g) | Solvent | Basic Compound (10 mg) | Surfactant (5 mg) | Dissolution-Inhibiting Compound (0.1 g) | Elution amount of Acid Generator and Generated Acid ($\times 10^{-13}$ mol/cm$^2$) | Number of Development Defects |
|---|---|---|---|---|---|---|---|---|
| Ex. 1 | 1 | B1 (0.14) | SL-2/4 = 50/50 | N-1 | W-1 | — | 8.0 | 70 |
| Ex. 2 | 2 | B2 (0.17) | SL-2/4 = 50/50 | N-2 | W-2 | — | 2.0 | 250 |
| Ex. 3 | 3 | B3 (0.18) | SL-4/6/9 = 40/58/2 | N-3 | W-3 | — | 1.5 | 90 |
| Ex. 4 | 4 | B4 (0.18) | SL-2/4 = 40/60 | N-1 | W-4 | — | 1.5 | 50 |
| Ex. 5 | 5 | B5 (0.18) | SL-2/4 = 40/60 | N-2 | W-4 | — | 2.5 | 80 |
| Ex. 6 | 6 | B6 (0.18) | SL-2/4/9 = 40/59/1 | N-1/3 = 1/1 | W-4 | — | 0.4 | 120 |
| Ex. 7 | 7 | B1 (0.13) | SL-2/4 = 50/50 | N-3 | W-4 | — | 9.0 | 40 |
| Ex. 8 | 8 | B4 (0.10) Z2 (0.04) | SL-2/6 = 70/30 | N-3/6 = 1/1 | W-1 | — | 7.0 | 50 |
| Ex. 9 | 9 | B3 (0.10) Z2 (0.04) | SL-2/4/9 = 40/59/1 | N-2 | W-1 | — | 8.5 | 50 |
| Ex. 10 | 10 | B1 (0.05) B6 (0.12) | SL-2/4 = 40/60 | N-3 | W-2 | — | 1.8 | 60 |
| Ex. 11 | 11 | B2 (0.16) | SL-3/4 = 40/60 | N-1 | W-3 | — | 3.1 | 190 |
| Ex. 12 | 12 | B2 (0.10) Z2 (0.06) | SL-2/4 = 40/60 | N-1 | W-4 | — | 5.0 | 40 |
| Ex. 13 | 13 | B1 (0.14) | SL-1/7 = 40/60 | N-6 | W-4 | SI-1 | 6.0 | 120 |
| Ex. 14 | 14 | B2 (0.17) | SL-4/6 = 60/40 | N-1 | W-1 | — | 5.1 | 200 |
| Ex. 15 | 15 | B3 (0.18) | SL-3/7 = 60/40 | N-4/6 = 1/1 | W-3 | — | 4.6 | 250 |
| Ex. 16 | 16 | B4 (0.18) | SL-2/5 = 60/40 | N-3 | W-2 | — | 4.0 | 230 |
| Ex. 17 | 17 | B5 (0.18) | SL-2/7 = 60/40 | N-3 | W-2 | SI-2 | 4.5 | 250 |
| Ex. 18 | 18 | B6 (0.18) | SL-2/7 = 60/40 | N-4/6 = 1/1 | W-1 | — | 0.8 | 300 |
| Ex. 19 | 19 | B1 (0.14) | SL-2/7 = 60/40 | N-1 | W-1 | — | 7.2 | 130 |
| Ex. 20 | 20 | B2 (0.17) | SL-2/4 = 40/60 | N-3 | W-4 | — | 6.1 | 180 |
| Ex. 21 | 21 | B3 (0.18) | SL-4/6 = 6/4 | N-6 | W-4 | — | 5.3 | 280 |
| Ex. 22 | 22 | B4 (0.18) | SL-2 | N-3/6 = 1/1 | W-4 | — | 4.0 | 200 |
| Ex. 23 | 23 | B5 (0.18) | SL-4/6 = 6/4 | N-3/6 = 1/1 | W-4 | — | 4.8 | 200 |
| Ex. 24 | 24 | B6 (0.18) | SL-4/6 = 5/5 | N-3/6 = 1/1 | W-4 | — | 0.7 | 150 |
| Ex. 25 | 25 | B5 (0.16) Z3 (0.05) | SL-4/6 = 5/5 | N-3 | W-4 | — | 3.8 | 130 |
| Ex. 26 | 4 | B6 (0.10) Z1 (0.05) | SL-2/4 = 60/40 | N-3 | W-6 | — | 10 | 50 |
| Ex. 27 | 7 | B1 (0.05) B5 (0.08) | SL-2/4 = 70/30 | N-1/3 = 1/1 | W-6 | — | 3.0 | 60 |
| Ex. 28 | 9 | B2 (0.10) Z2 (0.04) | SL-2/4 = 60/40 | N-4 | W-5 | — | 11 | 200 |
| Comp. Ex. 1 | 4 | Z3 (0.18) | SL-2/4 = 40/60 | N-1 | W-4 | — | 600 | 300 |
| Comp. Ex. 2 | 4 | Z4 (0.18) | SL-2/4 = 40/60 | N-1 | W-4 | — | 15 | 78,000 |

The abbreviations in Table 1 are as follows.
N-1: N,N-Dibutylaniline
N-2: N,N-Dipropylaniline
N-3: N,N-Dihydroxyethylaniline
N-4: 2,4,5-Triphenylimidazole
N-5: 2,6-Diisopropylaniline
N-6: Hydroxyantipyrine
N-7: Tris-2-[2-methoxy(ethoxy)]ethylamine
W-1: Megafac F176 (fluorine surfactant, manufactured by Dainippon Ink and Chemicals Inc.)
W-2: Megafac R08 (fluorine and silicon surfactant, manufactured by Dainippon Ink and Chemicals Inc.)
W-3: Polysiloxane polymer KP-341 (silicon surfactant, manufactured by Shin-Etsu Chemical Co., Ltd.)
W-4: Troy Sol S-366 (manufactured by Troy Chemical Co., Ltd.)
W-5: PF636 (manufactured by OMNOVA Solution Inc.)
W-6: PF6520 (manufactured by OMNOVA Solution Inc.)
SL-1: Cyclopentanone
SL-2: Cyclohexanone
SL-3: 2-Methylcyclohexanone
SL-4: Propylene glycol monomethyl ether acetate
SL-5: Ethyl lactate
SL-6: Propylene glycol monomethyl ether
SL-7: 2-Heptanone
SL-8: γ-Butyrolactone
SL-9: Propylene carbonate
SI-1: t-Butyl lithocholate
SI-2: t-Butyl adamantanecarboxylate The structures of the acid generators shown in Table 1, the computed values of VDW volume V (Å$^3$), VDW surface area S (Å$^2$), and V/S of the acid generators are shown together in Table 2 below. In the computation of VDW volume V and VDW surface area S in Table 2, chemical computation software CAChe ver. 6.0 (manufactured by Fujitsu Limited) was used and computation was performed according to the definition described in the specification of the invention.

TABLE 2

| | Structure | VDW Volume V | VDW Surface Area S | V/S |
|---|---|---|---|---|
| (B1) | | 256.76 | 330.18 | 0.78 |
| (B2) | | 382.87 | 418.01 | 0.92 |
| (B3) | | 410.75 | 472.98 | 0.87 |
| (B4) | | 430.30 | 496.91 | 0.87 |
| (B5) | | 442.54 | 501.79 | 0.88 |
| (B6) | | 524.25 | 584.15 | 0.90 |
| (Z1) | | 134.73 | 178.67 | 0.75 |
| (Z2) | | 136.01 | 167.86 | 0.81 |

TABLE 2-continued

| | Structure | VDW Volume V | VDW Surface Area S | V/S |
|---|---|---|---|---|
| (Z3) | $\left(\langle\bigcirc\rangle\right)_3\!\!-\!\!S^+\ C_8F_{17}\!\!-\!\!SO_3^-$ | 219.96 | 283.33 | 0.78 |
| (Z4) | $\left(\langle\bigcirc\rangle\right)_3\!\!-\!\!S^+\ {}^-O\!-\!\!\underset{\underset{O}{\|}}{\overset{\overset{O}{\|}}{S}}\!-\!CF_2\!-\!CF_2\!-\!\underset{\underset{O}{\|}}{\overset{\overset{O}{\|}}{S}}\!-\!O\!-\!\langle\bigcirc\rangle\!-\!\text{Adamantyl}$ | 380.49 | 404.4 | 0.94 |

Evaluation of the Elution Amount of Acid Generator and Generated Acid:

The positive resist composition prepared above was coated on an 8-inch silicone wafer, and baked at 115° C. for 60 seconds to thereby form a resist film having a thickness of 150 nm. After the entire surface of the resist film was subjected to exposure with an exposing apparatus of wavelength of 193 nm at exposure dose of 50 mJ/cm², 5 ml of pure water obtained by deionizing treatment with super-pure water-making apparatus (Milli-Q Jr., a product of Millipore Corporation) was dropped on the resist film. After holding the water on the resist for 50 seconds, the water was collected and the concentration of the eluted acid generator and generated acid was determined with LC-MS apparatus.

LC apparatus: 2695, manufactured by Waters Corporation
MS apparatus: Esquire 3000 plus, manufactured by Bruker Daltonics The elution amount of the anion seed deriving from the acid generator and the generated acid contained in each resist was analyzed from MS detection strength with the above apparatus, from which the elution amount of the acid generator and the generated acid was computed.

Evaluation of Development Defect:

An organic antireflection film ARC29A (manufactured by Nissan Chemical Industries Ltd.) was coated on an 8-inch silicone wafer and baked at 205° C. for 60 seconds, and an antireflection film having a thickness of 78 nm was formed. Each positive resist composition shown in Table 1 was coated on the antireflection film by spin coating and baked at 110° C. for 60 seconds to thereby form a resist film having a thickness of 150 nm. The resist film was subjected to pattern exposure with an ArF excimer laser exposing apparatus (manufactured by ASML Co., NA=0.75), and then pure water was put on the entire surface of the resist film and allowed to stand for 60 seconds to expose the resist film to the pure water. It can be thought that pseudo immersion exposure was performed by this operation. After that, the silicone wafer was revolved at a high speed to remove the pure water on the resist film centrifugally to thereby dry the resist film. Subsequently, the resist film was subjected to post exposure bake (PEB) at 125° C. for 60 seconds, development with a tetramethylammonium hydroxide aqueous solution (2.38%) for 30 seconds, rinsing with pure water, spin drying, and post bake at 90° C. for 90 seconds. The area where a 110 nm 1/1 line and space pattern was formed on the thus obtained resist film was detected for development defects with a defect detector KLA 2360 (manufactured by KLA Tencor Corporation), and the obtained primary data value was taken as development defect.

It is apparent from the results shown in Table 1 that the positive resist compositions for immersion exposure of the invention are low in the elution amount of acid generators and generated acids to the immersion liquids, and the generation of development defects is also restrained. Specifically, as shown in Comparative Example 1, when an acid generator that generates an acid satisfying V/S≤0.93 but showing V<230 is used alone, the number of development defects is relatively restrained but the elution amount of the acid generator and the generated acid is extremely heavy. Further, as shown in Comparative Example 2, when an acid generator that generates an acid satisfying V≥230 but showing V/S>0.93 is used alone, the elution amount of the acid generator and the generated acid is relatively restrained but development defects are heavy. Contrary to these facts, as shown in Examples 1 to 28, by using one or more PAG generating acid that satisfies the conditions of V≥230 and V/S≤0.93, the elution amount of the acid generator and the generated acid and development defects can be restrained.

The invention can provide a positive resist composition suitable for immersion exposure that is restrained in elution of the components of a resist film into pure water of the immersion liquid, and reduced in the number of generation of development defects, and another object is to provide a pattern-forming method using the same.

The entire disclosure of each and every foreign patent application from which the benefit of foreign priority has been claimed in the present application is incorporated herein by reference, as if fully set forth.

What is claimed is:

1. A pattern-forming method comprising:
   applying a resist composition comprising (A) a resin capable of increasing its solubility in an alkali developer by an action of an acid and (B) a sulfonium salt compound capable of generating an acid upon irradiation with actinic ray or radiation onto a support to form a resist film, the sulfonium salt compound comprising a sulfonium cation represented by the following formula (B-1) and an anion represented by the following formula (B-2);
   exposing the resist film through an immersion liquid;
   and developing the exposed resist film,
   wherein the acid generated by the sulfonium salt compound (B) satisfies conditions of V≥230 and V/S≤0.93 taking van der Waals volume of the acid as V (Å3), and van der Waals surface area of the acid as S (Å2):

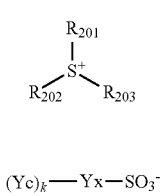

(B-1)

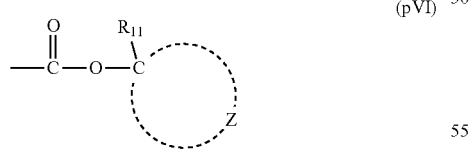

(B-2)

wherein, in the formula (B-1), $R_{201}$, $R_{202}$ and $R_{203}$ each independently represent an organic group having from 1 to 30 carbon atoms, and two of $R_{201}$, $R_{202}$ and $R_{203}$ may be bonded to form a cyclic structure which may comprises an oxygen atom, a sulfur atom, an ester bond, an amido bond or a carbonyl group, under the proviso that at least one of $R_{201}$, $R_{202}$ or $R_{203}$ is an aryl group, and in the formula (B-2), Yx represents an alkyl group substituted with a fluorine atom, Yc represents a cycloalkyl residue having 6 or more carbon atoms, which contains a polycyclic cycloalkyl structure, does not have a fluorine atom and has a straight chain alkyl structure, and k represents an integer of from 1 to 2, wherein the resin (A) has a monocyclic or polycyclic alicyclic hydrocarbon structure, the resin (A) has a lactone group, and the resin (A) contains only (meth)acrylate repeating units.

2. The pattern-forming method as claimed in claim 1, wherein the resist composition further comprises a compound capable of generating an acid upon irradiation with actinic rays or radiation which is different from the compound (B).

3. The pattern-forming method as claimed in claim 1, wherein the polycyclic cycloalkyl structure which Yc contains is an adamantyl group or a norbornyl group.

4. The pattern-forming method as claimed in claim 1, wherein the resin (A) has a monocyclic alicyclic hydrocarbon structure having 5 or more carbon atoms.

5. The pattern-forming method as claimed in claim 4, wherein the resin (A) contains a partial structure represented by the following formula (pVI):

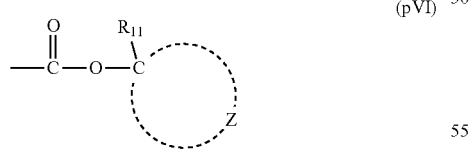

(pVI)

wherein $R_{11}$ represents a methyl group, an ethyl group, an n-propyl group, an isopropyl group, an n-butyl group, an isobutyl group, or a sec-butyl group; and Z represents an atomic group necessary to form an alicyclic hydrocarbon group together with a carbon atom.

6. The pattern-forming method as claimed in claim 1, wherein the resin (A) contains a repeating unit represented by the following formula (AI):

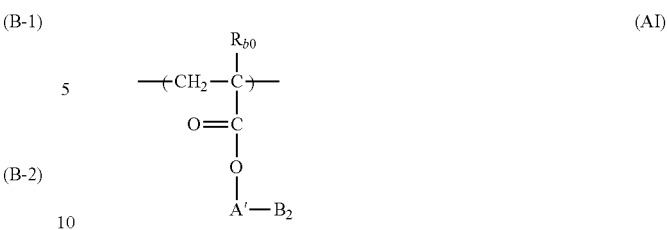

(AI)

wherein, in formula (AI), $R_{b0}$ represents a hydrogen atom, a halogen atom, or an alkyl group having from 1 to 4 carbon atoms; A' represents a single bond, an ether group, an ester group, a carbonyl group, an alkylene group, or a divalent linking group obtained by combining these groups; and B2 represents a group represented by the following formula (Lc) or any of the following formulae (III-1) to (III-5):

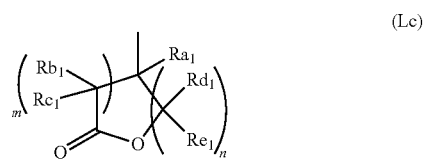

(Lc)

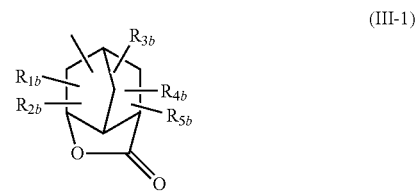

(III-1)

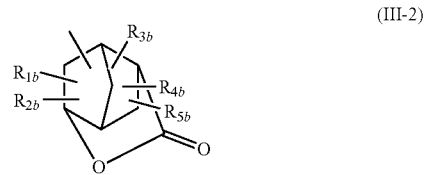

(III-2)

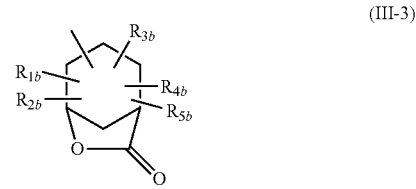

(III-3)

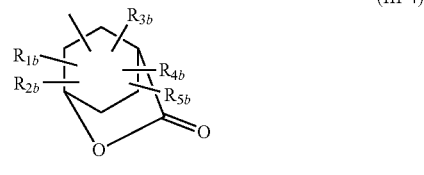

(III-4)

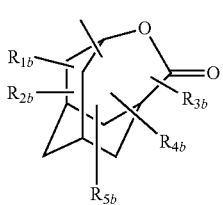

wherein, in formula (Lc), $R_{a1}$, $R_{b1}$, $R_{c1}$, $R_{d1}$ and $R_{e1}$ each represents a hydrogen atom or an alkyl group; m and n each represents an integer of from 0 to 3, and m+n is from 2 to 6; and in formulae (III-1) to (III-5), $R_{1b}$, $R_{2b}$, $R_{3b}$, $R_{4b}$ and $R_{5b}$ each represents a hydrogen atom, an alkyl group, a cycloalkyl group, an alkoxyl group, an alkoxycarbonyl group, an alkyl-sulfonylimino group, or an alkenyl group, under the proviso that two of $R_{1b}$ to $R_{5b}$ may be bonded to each other to form a ring.

7. The pattern-forming method as claimed in claim 1, wherein the resist composition further contains a carboxylic acid onium salt.

* * * * *